(12) United States Patent
Hirukawa et al.

(10) Patent No.: US 7,088,426 B2
(45) Date of Patent: Aug. 8, 2006

(54) PROJECTION OPTICAL SYSTEM ADJUSTMENT METHOD, PREDICTION METHOD, EVALUATION METHOD, ADJUSTMENT METHOD, EXPOSURE METHOD AND EXPOSURE APPARATUS, PROGRAM, AND DEVICE MANUFACTURING METHOD

(75) Inventors: Shigeru Hirukawa, Kita-ku (JP); Toshiharu Nakashima, Fukaya (JP); Kenji Higashi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 69 days.

(21) Appl. No.: 10/927,287

(22) Filed: Aug. 27, 2004

(65) Prior Publication Data

US 2005/0024612 A1 Feb. 3, 2005

Related U.S. Application Data

(63) Continuation of application No. PCT/JP03/02375, filed on Feb. 28, 2003.

(30) Foreign Application Priority Data

Mar. 1, 2002 (JP) ............................. 2002-056116
Feb. 21, 2003 (JP) ............................. 2003-043682

(51) Int. Cl.
*G03B 27/52* (2006.01)
*G03B 27/42* (2006.01)
*G03B 27/32* (2006.01)

(52) U.S. Cl. .............................. 355/55; 355/53; 355/77
(58) Field of Classification Search ............ 355/52–53, 355/55, 67–71; 356/399–401; 250/548
See application file for complete search history.

(56) References Cited

U.S. PATENT DOCUMENTS

4,786,166 A 11/1988 Kroko (Continued)

FOREIGN PATENT DOCUMENTS

DE 198 20 785 A1 10/1999

(Continued)

OTHER PUBLICATIONS

Donis G. Flagello, et al., "Towards a Comprehensive Control of Full-Field Image Quality in Optical Photolithography", SPIE Microlithography Seminar, Mar., 1997, pp. 1-14.

(Continued)

*Primary Examiner*—Henry Hung Nguyen
(74) *Attorney, Agent, or Firm*—Oblon, Spivak, McClelland, Maier & Neustadt, P.C.

(57) ABSTRACT

When a pattern is transferred via a projection optical system, a size of an image of the pattern varies depending on a defocus amount of a transferring position from the best focus position, and a flucuation curve showing the variation (the so-called CD-focus curve) varies depending on wavefront aberration of the projection optical system. There is a close relation between a linear combination value of a plurality of terms that each have a coefficient (an aberration component) of a plurality of Zernike terms (aberration component terms) into which the wavefront aberration of the projection optical system is decomposed using a Zernike polynomial in series expansion, and the variation of the flucuation curve. Accordingly, by using the above relation, the CD-focus curve related to the pattern via a projection optical system whose aberration state is predetermined exposed under predetermined exposure conditions can be predicted within a short period of time by a simple calculation of obtaining the linear combination value of a plurality of terms that each have an aberration component.

35 Claims, 30 Drawing Sheets

U.S. PATENT DOCUMENTS

| | | | |
|---|---|---|---|
| 4,920,505 | A | 4/1990 | Suzuki |
| 5,321,493 | A | 6/1994 | Kamon |
| 5,420,436 | A | 5/1995 | Seya et al. |
| 5,424,552 | A | 6/1995 | Tsuji et al. |
| 5,754,299 | A | 5/1998 | Sugaya et al. |
| 5,807,647 | A | 9/1998 | Hashimoto |
| 5,898,501 | A | 4/1999 | Suzuki et al. |
| 5,978,085 | A | 11/1999 | Smith et al. |
| 6,078,554 | A | 6/2000 | Ootaki et al. |
| 6,100,978 | A | 8/2000 | Naulleau et al. |
| 6,118,535 | A | 9/2000 | Goldberg et al. |
| 6,245,470 | B1 | 6/2001 | Kamon |
| 6,248,486 | B1 | 6/2001 | Dirksen et al. |
| 6,268,903 | B1 | 7/2001 | Chiba et al. |
| 6,329,112 | B1 | 12/2001 | Fukuda et al. |
| 6,459,480 | B1 | 10/2002 | Kye |
| 6,570,143 | B1 | 5/2003 | Neil et al. |
| 6,646,729 | B1 | 11/2003 | Van der Laan et al. |
| 6,741,327 | B1 | 5/2004 | Nomura et al. |
| 2002/0001071 | A1 | 1/2002 | Nomura et al. |
| 2002/0008869 | A1 | 1/2002 | Van Der Lann et al. |
| 2002/0036758 | A1 | 3/2002 | De Mol et al. |
| 2002/0159040 | A1 | 10/2002 | Hamatani et al. |
| 2002/0191165 | A1 | 12/2002 | Baselmans et al. |
| 2004/0032579 | A1* | 2/2004 | Emer et al. .................. 356/72 |
| 2004/0059444 | A1 | 3/2004 | Tsukakoshi |
| 2004/0090606 | A1* | 5/2004 | Ishikawa .................... 355/53 |

FOREIGN PATENT DOCUMENTS

| | | |
|---|---|---|
| EP | 0 267 721 A2 | 5/1988 |
| EP | 0 338 200 A2 | 10/1989 |
| EP | 1 079 223 | 2/2001 |
| EP | 1 128 217 | 8/2001 |
| EP | 1 128 217 A2 | 8/2001 |
| EP | 1 160 626 | 12/2001 |
| EP | 1 355 140 A1 | 10/2003 |
| EP | 1 359 608 A1 | 11/2003 |
| JP | 5-296879 | 11/1993 |
| JP | 6-235619 | 8/1994 |
| JP | 10-154657 | 6/1998 |
| JP | 11-118613 | 4/1999 |
| JP | 11-176744 | 7/1999 |
| JP | 11-233424 | 8/1999 |
| JP | WO 99/60361 | 11/1999 |
| JP | 2000-47103 | 2/2000 |
| JP | 2000-121491 | 4/2000 |
| JP | 2000-146757 | 5/2000 |
| JP | 2000-266640 | 9/2000 |
| JP | 2000-331923 | 11/2000 |
| JP | 2001-85305 | 3/2001 |
| JP | 2001-230193 | 8/2001 |
| JP | 2002-324752 | 11/2002 |
| WO | WO 00/31592 | 6/2000 |
| WO | WO 00/55890 | 9/2000 |
| WO | WO00/55890 | 9/2000 |
| WO | WO 02/50506 A1 | 6/2002 |

OTHER PUBLICATIONS

Donis G. Flagello, et al., "The Influence of Lens Aberrations in Lithography", Microlithography World, 1998, pp. 11-12, 14-15 and 19-20.

Toshiharu Nakashima, et al., "Impact of Zernike Cross-Term on Linewidth Control", Optical Microlithography XV, Proceedings of SPIE, vol. 4691, 2002, pp. 33-43.

Patent Abstracts of Japan, JP 2001-289735, Oct. 19, 2001.

Kenneth A. Goldberg, et al., "High-Accuracy Interferometry of Extreme Ultraviolet Lithographic Optical Systems", J. Vac. Sci. Technol., vol. 16, No. 6, XP-000931349, Nov./Dec. 1998, pp. 3435-3439.

* cited by examiner

*Fig. 6A*  *Fig. 6B*  *Fig. 6C*
$Z_9=-20m\lambda$   $Z_9=0m\lambda$   $Z_9=+20m\lambda$
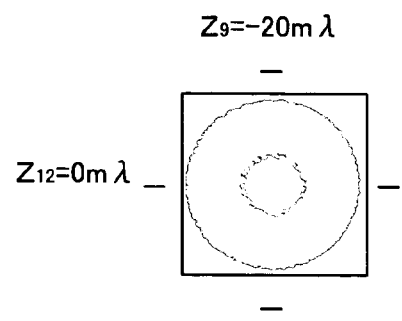 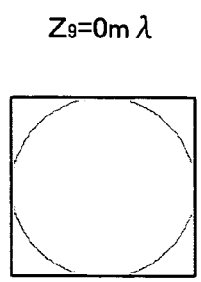 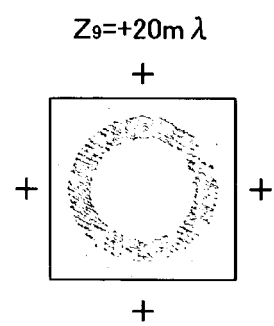
$Z_{12}=0m\lambda$
*Fig. 6D*  *Fig. 6E*  *Fig. 6F*
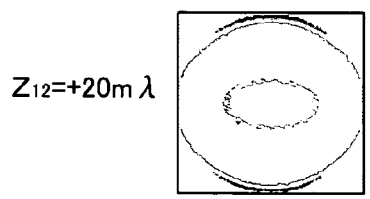 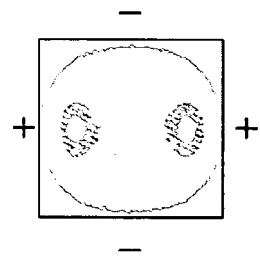 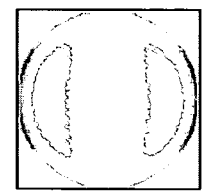
$Z_{12}=+20m\lambda$

*Fig. 7A*  
Z₄=−17mλ
*Fig. 7B*  
Z₄=0mλ
*Fig. 7C*  
Z₄=+17mλ
Z₅=0mλ
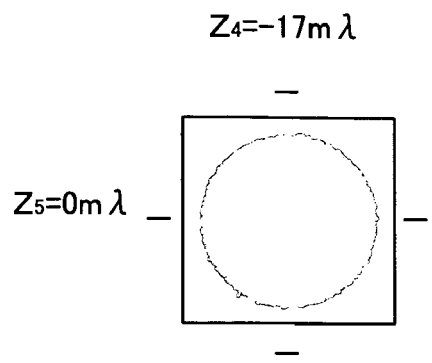
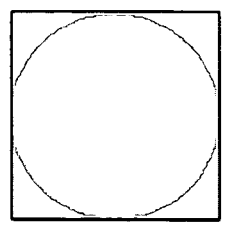
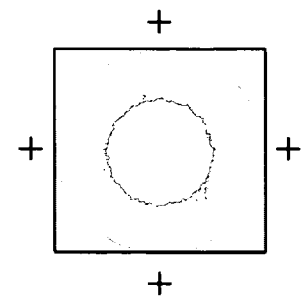
*Fig. 7D*
*Fig. 7E*
*Fig. 7F*
Z₅=+33mλ
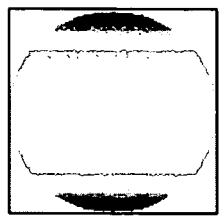
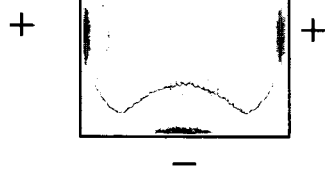
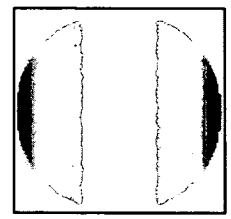
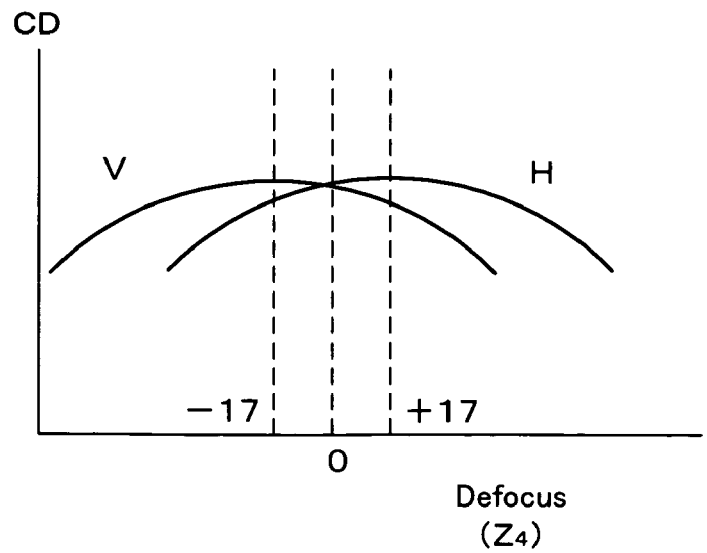
*Fig. 8*

Fig. 9
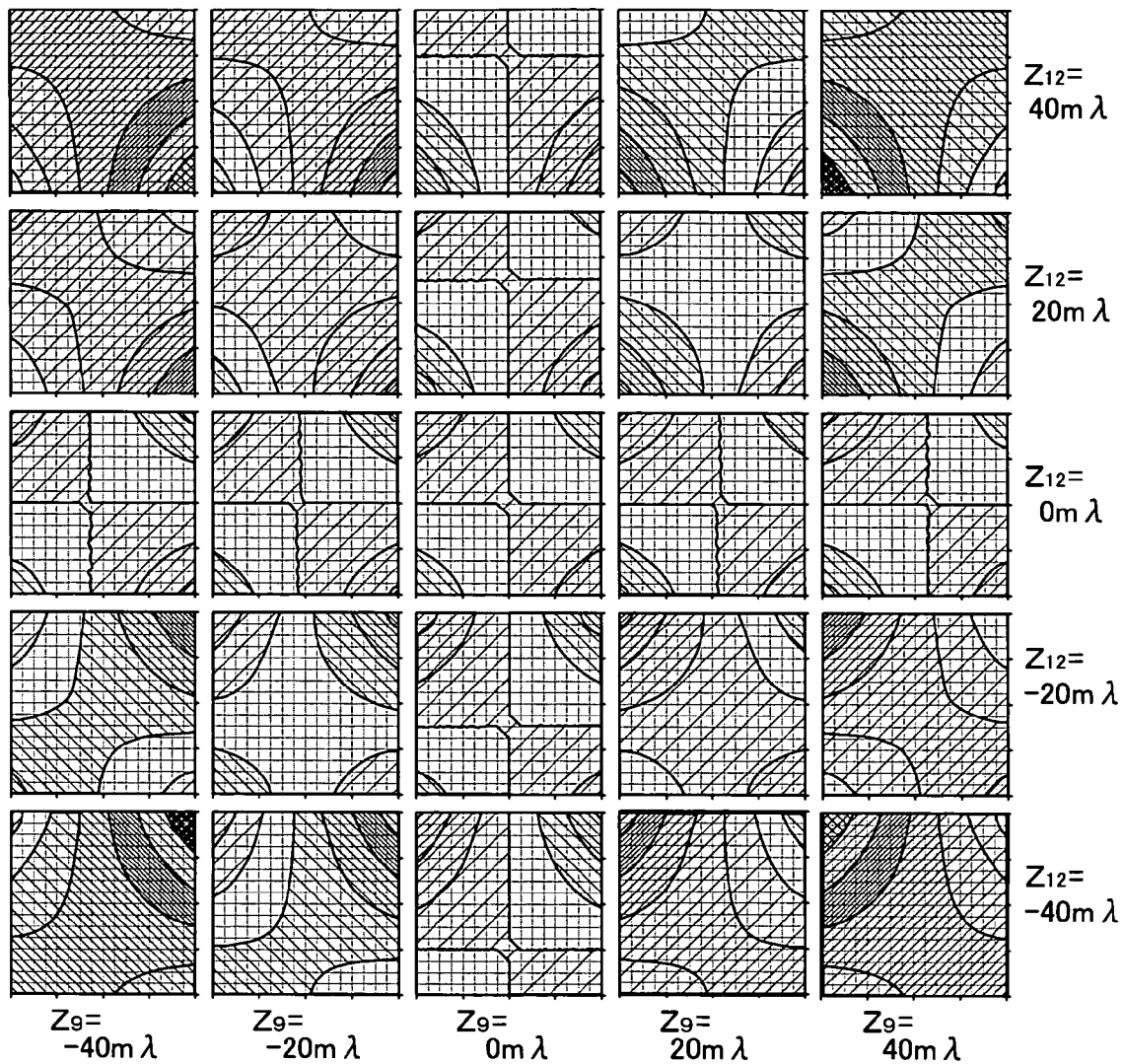
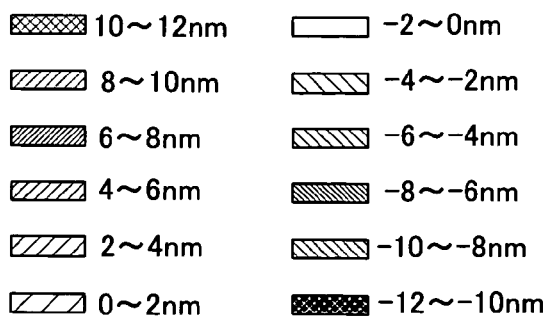

Fig. 13

| Hor | Z4 | Z5 | Z6 | Z7 | Z8 | Z9 | Z10 | Z11 | Z12 | Z13 | Z14 | Z15 | Z16 | Z17 | Z18 | Z19 | Z20 |
|---|---|---|---|---|---|---|---|---|---|---|---|---|---|---|---|---|---|
| Z4 | 0 | 5 | 0 | 0 | 0 | 138 | 0 | 0 | -39 | 0 | 0 | 0 | 0 | -27 | 0 | 0 | 0 |
| Z5 | -5 | 0 | 0 | 0 | 0 | -71 | 0 | 0 | 17 | 0 | 0 | 0 | 2 | 13 | 0 | 0 | 0 |
| Z6 | 0 | 0 | -918 | 0 | 0 | 0 | 0 | 0 | 0 | 837 | 0 | 0 | 0 | 0 | -379 | 0 | 0 |
| Z7 | 0 | 0 | -918 | -416 | 0 | 0 | 830 | 0 | 0 | 0 | 173 | 0 | 0 | 0 | 0 | -481 | 0 |
| Z8 | 0 | 0 | 0 | -590 | 0 | 0 | 0 | 123 | 0 | 0 | 0 | -245 | 0 | 0 | 0 | 0 | -155 |
| Z9 | 138 | -71 | 0 | 0 | -1358 | 0 | 0 | 0 | 759 | 0 | 0 | 0 | 197 | 598 | 0 | 0 | 0 |
| Z10 | 0 | 0 | 0 | 0 | -416 | 0 | -520 | -416 | 0 | 0 | -173 | -171 | 0 | 0 | 0 | 0 | 0 |
| Z11 | 0 | 0 | 0 | -123 | 0 | -1358 | -520 | 0 | -419 | 0 | 0 | 0 | 29 | 463 | 0 | 0 | 0 |
| Z12 | -39 | 17 | 0 | 0 | -830 | 0 | 0 | -416 | 0 | -847 | 0 | 0 | 0 | 0 | 508 | 0 | 0 |
| Z13 | 0 | 0 | 837 | 0 | 0 | -759 | 0 | 0 | -419 | 0 | -456 | -349 | 0 | 0 | 0 | 747 | 0 |
| Z14 | 0 | 0 | 0 | -245 | 0 | 0 | 171 | 0 | 0 | -847 | 0 | -456 | -349 | 0 | 0 | 0 | 264 |
| Z15 | 0 | 0 | 0 | 0 | 173 | 0 | 0 | 173 | -29 | 0 | -349 | 0 | -676 | -374 | 0 | 0 | 0 |
| Z16 | 0 | -2 | 0 | 0 | 0 | 197 | 0 | 0 | -463 | -508 | 0 | -456 | -676 | -124 | -391 | -626 | 0 |
| Z17 | -27 | -13 | 0 | 0 | 0 | 598 | 0 | 0 | 0 | 0 | -264 | 0 | -124 | -374 | -391 | -876 | -876 |
| Z18 | 0 | 0 | 379 | 0 | 0 | 0 | 789 | 0 | 0 | 0 | 0 | -747 | 0 | 0 | 0 | 0 | -626 |
| Z19 | 0 | 0 | 0 | 155 | 0 | 0 | 0 | 481 | 0 | 0 | 0 | 0 | 0 | 0 | 0 | -876 | 0 |
| Z20 | 0 | 0 | 0 | 0 | 481 | 0 | 0 | 0 | 0 | 0 | 0 | 0 | 0 | 0 | 0 | 0 | -626 |
| Ver | Z4 | Z5 | Z6 | Z7 | Z8 | Z9 | Z10 | Z11 | Z12 | Z13 | Z14 | Z15 | Z16 | Z17 | Z18 | Z19 | Z20 |

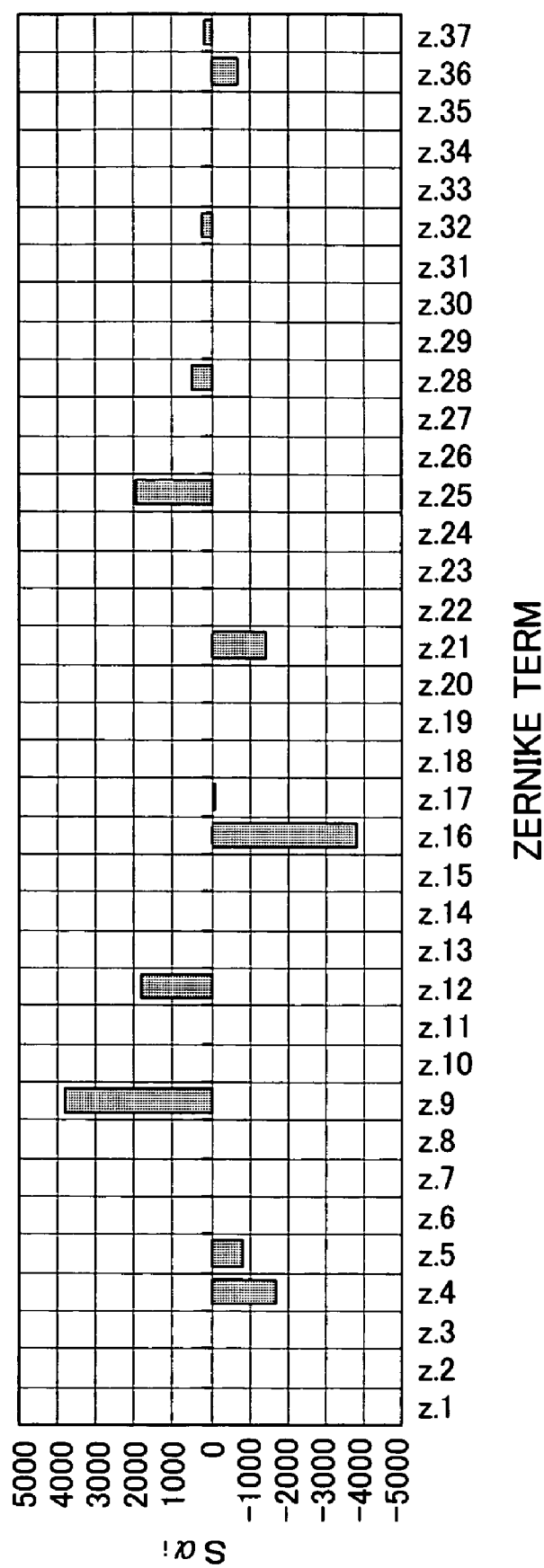

PROJECTION OPTICAL SYSTEM ADJUSTMENT METHOD, PREDICTION METHOD, EVALUATION METHOD, ADJUSTMENT METHOD, EXPOSURE METHOD AND EXPOSURE APPARATUS, PROGRAM, AND DEVICE MANUFACTURING METHOD

CROSS-REFERENCE TO RELATED APPLICATIONS

This is a continuation of International Application PCT/JP2003/002375, with an international filing date of Feb. 28, 2003, the entire content of which being hereby incorporated herein by reference, which was not published in English.

BACKGROUND OF THE INVENTION

1. Field of the Invention

The present invention relates to projection optical system adjustment methods, prediction methods, evaluation methods, adjustment methods, exposure methods and exposure apparatus, programs, and device manufacturing methods, and more particularly to an adjustment method of a projection optical system that projects an image of a pattern on a first surface onto a second surface, a prediction method of characteristics of the image of the pattern via the projection optical system, an evaluation method for evaluating the characteristics of the image of the pattern that has undergone the prediction method, an adjustment method for adjusting the image of the pattern that has undergone the evaluation method, an exposure method in which a pattern is formed on an object using such adjustment method or (and) the adjustment method of the projection optical system and an exposure apparatus to which the exposure method or (and) the adjustment method of the projection optical system can suitably be applied, a program that makes a computer execute the prediction method, and a device manufacturing method that uses the exposure method or (and) the exposure apparatus.

2. Description of the Related Art

In general, in a lithographic process for manufacturing microdevices such as a semiconductor device, a display device, a thin film magnetic head, and a micromachine, projection exposure apparatus such as the so-called stepper or the so-called scanner (also referred to as a scanning stepper) are used that transfer a pattern formed on a mask or a reticle (hereinafter generally referred to as a 'reticle') onto a photosensitive object such as a wafer or a glass plate (hereinafter generally referred to as a 'wafer') via a projection optical system.

Conventionally, with these kinds of exposure apparatus, when a line width difference is measured in a transferred image (such as a resist image) in between a vertical line pattern and a horizontal line pattern formed on a wafer by exposure, asymmetric aberration such as coma was considered the main cause for the contrast difference in the image of the vertical line pattern and the horizontal line pattern in the projection optical system. Therefore, when the measurement found that asymmetric aberration such as coma could not be measured, correction of the line width difference was difficult.

In recent years, when the projection optical system is being assembled, adjustment is performed where wavefront aberration at each point within the field of the projection optical system (or the exposure field) is measured using an interferometer, the wavefront aberration measured (aberration function) is expanded into series using the Zernike polynomial (for example, the Fringe Zernike polynomial), and each coefficient (Zernike coefficient) of each term (each Zernike term) in the series obtained is adjusted so that it does not exceed its target value. The reason for performing such an adjustment is because each term of the series (each Zernike term) represents a specific wavefront aberration component, and the coefficient of each term shows the magnitude of each aberration component.

Recently, the control accuracy of the aberration of the projection optical system (projection lens) has significantly improved, due to introducing the above wavefront measurement into the making process of the projection optical system, and the control by series expansion that uses the Zernike polynomial of the wavefront aberration.

In addition, the influence of simple aberration can also be judged by a simple method, by the so-called Zernike sensitivity method for obtaining image forming qualities such as aberration (or its index value) of the projection optical system, based on a linear combination of the magnitude (Zernike coefficient) of each term (each Zernike term), which is obtained expanding the wavefront aberration (aberration function) using the Zernike polynomial, and a Zernike Sensitivity table. In this case, the Zernike Sensitivity table refers to a calculation table made up of: different exposure conditions, that is, optical conditions (such as exposure wavelength, maximum N. A., N.A. in use, illumination N.A., and the aperture shape of the illumination system aperture stop); evaluation items (such as mask type, line width, evaluation amount, and information on the pattern); and a variation amount of the image forming qualities of the projection optical system obtained under a plurality of exposure conditions that are decided by a combination of such optical conditions and evaluation items, for example, the variation amount per $1\lambda$ of each Zernike term of various aberrations (or their index values).

When it comes to evaluating line width variation, however, the so-called Zernike sensitivity method is not necessarily suitable. Regarding the line width variation, as it is disclosed in Proc. SPIE Vol. 4346 on page 713, the focus position where the line width is the widest shifts according to a 0-times rotational symmetry component ($0\theta$ component) and a 2-times rotational symmetry component ($2\theta$ component) of an aberration, and the maximum value of the line width also changes. Furthermore, interaction occurs between the two aberrations (the $0\theta$ component and the $2\theta$ component). For such reasons, the so-called Zernike sensitivity method has not been applied when estimating the line width.

The rotational symmetry component ($0\theta$ component) terms described above expanding the wavefront aberration in series using the Fringe Zernike polynomial, include low order terms that represents defocus, that is, the fourth term (coefficient $Z_4$), and the ninth term (coefficient $Z_9$), which represents low order spherical aberration, and the shift of wavefront by such $0\theta$ component terms is isotropic, therefore, the influence on the image forming state of the V-line (vertical line) and H-line (horizontal line) patterns is identical. In addition, the 2-times rotational symmetry component ($2\theta$ component) terms include the fifth term (coefficient $Z_5$), which represents astigmatism in low order, and the twelfth term (coefficient $Z_{12}$), which represents astigmatism in high order, and such $2\theta$ component terms affect the image forming state of the vertical line pattern and the horizontal line pattern so that they are opposite in sign while being equal in magnitude. Therefore, conventionally, the difference that the influence of aberration has on the pattern images of the vertical and horizontal lines due to both the 0θ component terms and 2θ component terms being available (that is, the coefficients (components) of both terms are not zero) was not considered.

Due to such circumstances, in the present state of affairs, there is no simple and solid judgment method regarding the line width difference of the images of the vertical line pattern and the horizontal line pattern, therefore, its adjustment is also difficult.

SUMMARY OF THE INVENTION

The present invention was made under such circumstances, and has as its first object, especially, to provide an adjustment method of the projection optical system in which line width difference of the images of line patterns that are perpendicular to each other is freely controllable.

The second object of the present invention is to provide a prediction method in which the characteristics of the pattern images via the projection optical system can be predicted easily and with high precision.

The third object of the present invention is to provide an evaluation method in which the characteristics of the pattern images via the projection optical system can be evaluated easily and with high precision.

The fourth object of the present invention is to provide an adjustment method in which the formed state of the pattern images via the projection optical system can be adjusted easily and with high precision.

The fifth object of the present invention is to provide an exposure method and an exposure apparatus that can form a pattern on an object with good precision.

The sixth object of the present invention is to provide a program that can make a computer execute transfer characteristics prediction of a pattern via the projection optical system within a short period of time with high precision.

And, the seventh object of the present invention is to provide a device manufacturing method that can contribute to improving the productivity of a device.

It may appear that a rotational symmetry component (a 0θ component) term and a 2-times rotational symmetry component (a 2θ component) term, which are wavefront aberration expanded in series using the Zernike polynomial (such as in the Fringe Zernike polynomial), are not relevant to each other. The inventors of the present invention, however, repeatedly performed various experiments (including simulations), and as a consequence, discovered that there are actually cases when the wavefront distortion within the pupil plane differs in the vertical direction and in the horizontal direction due to an interaction of phase distribution in the pupil plane between the 0θ component and the 2θ component whose independent variable ρ of a radial polynomial have the same order. For example, when the component of the $12^{th}$ term (coefficient $Z_{12}$), which is a series expansion of the wavefront aberration using the Fringe Zernike polynomial, is not zero, by changing the magnitude of the $9^{th}$ term (coefficient $Z_9$), which is a spherical aberration component, by moving or exchanging the optical elements that make up the projection optical system, phase distribution in the vertical and horizontal directions within the pupil plane can be controlled, and the inventors discovered that it is possible to control the line width difference in vertical and horizontal lines.

The present invention was made based on such discoveries obtained by the inventors, and it employs the methods and arrangements described below.

According to a first aspect of the present invention, there is provided a first adjustment method of a projection optical system that projects an image of a pattern on a first surface onto a second surface, the method comprising; obtaining information on optical properties including a first optical property of the projection optical system; forming an image of a first line pattern arranged on the first surface extending in a predetermined direction and a second line pattern orthogonal to the first line pattern on the second surface using the projection optical system, and measuring line width difference between a first line width and a second line width, which are line widths of the image of the first line pattern and the second line pattern; and adjusting the projection optical system to control magnitude of a second optical property that affects the line width difference by interaction with the first optical property, depending on a value of the first optical property obtained in the obtaining and the line width difference.

In this case, in the forming and measuring, the line width difference of the first line width being the line width of the image of the first line pattern and the second line width being the line width of the image of the second line pattern can be measured, while the images of the first line pattern and the second line pattern is being formed using the projection optical system, or, the line width difference may be measured, after the images of the first line pattern and the second line pattern are formed.

According to this method, for example, it becomes possible to control the line width difference that occurs due to the first optical property that is difficult to adjust in the projection optical system, by adjusting the projection optical system controlling the magnitude of the second optical property that is easy to adjust. Accordingly, it becomes possible to control the line width difference of the images of the line patterns that are orthogonal to each other that was said to be difficult, freely, without fail.

In this case, when the information obtained in the obtaining is information on wavefront aberration of the projection optical system, in the adjusting, when magnitude of an optional 2-times rotational symmetry component term in the fourth order and over is a value other than zero among a plurality of Zernike terms resulting from series expansion of wavefront aberration obtained in the obtaining using the Zernike polynomial, the projection optical system can be adjusted so as to control magnitude of a rotational symmetry component term in the same order as the 2-times rotational symmetry component term, according to the magnitude of the 2-times rotational symmetry component term and the line width difference.

In this case, the 2-times rotational symmetry component term can be the $12^{th}$ term, which is a fourth order cos2θ component term, and the rotational symmetry component term can be the $9^{th}$ term, which is a fourth order 0θ component term, or, the 2-times rotational symmetry component term can be the $13^{th}$ term, which is a fourth order sin2θ component term, and the rotational symmetry component term can be the $9^{th}$ term, which is a fourth order 0θ component term.

In the first adjustment method of a projection optical system in the present invention, when the information obtained in the obtaining is information on wavefront aberration of the projection optical system, in the obtaining, the information on wavefront aberration can be obtained by directly measuring wavefront of the projection optical system, or, in the obtaining, when an image of a plurality of sets of the first line pattern and the second line pattern disposed on the first surface that have a different size is formed, a difference in best focus position for the first line pattern and the second line pattern can be measured for each set, and based on results of the measurement, information on the 2-times rotational symmetry component term can be estimated as the information on wavefront aberration.

In the first adjustment method of a projection optical system in the present invention, when the information obtained in the obtaining is information on wavefront aberration of the projection optical system, in the adjusting, when magnitude of the optional 2-times rotational symmetry component term is a value other than zero and the line width difference measured in the adjusting is also a value other than zero, the projection optical system can be adjusted to optimize magnitude of a rotational symmetry component term in the same order as the 2-times rotational symmetry component term according to the magnitude of the 2-times rotational symmetry component term and the line width difference, so that the line width difference nears a designed value.

In the first adjustment method of a projection optical system in the present invention, in the forming and measuring, the line width of the images of the first line pattern and the second line pattern can be obtained by forming an aerial image (projected image) of the first line pattern and the second line pattern via the projection optical system on the second surface and measuring the aerial image of the patterns using an aerial image measuring unit. The present invention, however, is not limited to this, and the forming and measuring can comprise: forming an image of the first line pattern and the second line pattern on an object disposed on the second surface; and measuring the first line width and the second line width, which are line widths of the image of the first line pattern and the second line pattern formed on the object. That is, a latent image, a resist image, or an etched image of the first line pattern and the second line pattern formed on the object can be measured using the alignment system or the SEM of the exposure apparatus, and their line widths can be obtained.

In the first adjustment method of a projection optical system in the present invention, in the adjusting, magnitude of the second optical property can be controlled, by controlling at least one of a position of at least one optical element that makes up the projection optical system in directions of at least one degree of freedom, and gas pressure in a part of an optical path.

In the first adjustment method of a projection optical system in the present invention, the first line pattern can be a vertical line pattern and the second line pattern can be a horizontal line pattern, and the first optical property and the second optical property can be determined by going through: obtaining the Zernike sensitivity of Zernike term combination cross-terms with respect to line width variation of the vertical line pattern and the horizontal line pattern, respectively, and obtaining a combination of Zernike terms in the cross-terms whose sign of the Zernike sensitivity differs in vertical and horizontal lines.

In the first adjustment method of a projection optical system in the present invention, information obtained in the obtaining can be information on wavefront aberration of the projection optical system, and of a plurality of Zernike terms, which are a series expansion of wavefront aberration obtained in the obtaining using the Zernike polynomial, the first and second optical properties can be terms that have the same order and a different component type.

According to a second aspect of the present invention, there is provided a first exposure method of transferring a circuit pattern on a first surface onto an object disposed on a second surface via a projection optical system, the method comprising: adjusting the projection optical system, using the first adjustment method of a projection optical system in the present invention; and transferring the circuit pattern is transferred onto the object, using a projection optical system that has been adjusted by the adjustment method.

According to this method, because the projection optical system is adjusted using the first adjustment method of a projection optical system in the present invention, the projection optical system is adjusted so that the line width difference in the images of the vertical line pattern and the horizontal line pattern becomes a value that is close to designed value. For example, the projection optical system is adjusted so that the line width difference of the images of a vertical line pattern and a horizontal line pattern that have the same line width is adjusted to be the smallest (for example, zero). And, because the circuit pattern is transferred onto the object using such an adjusted projection optical system, pattern transfer with high precision in which the line width difference of the vertical line pattern and the horizontal line pattern is reduced can be achieved.

According to a third aspect of the present invention, there is provided a first exposure apparatus that transfers a pattern formed on a mask onto an object via an exposure optical system, the apparatus comprising: a projection optical system that has been adjusted using an adjustment method of a projection optical system in claim 1 as the exposure optical system.

According to this apparatus, because it comprises the projection optical system that has been adjusted using the first adjustment method of a projection optical system in the present invention as the exposure optical system, by transferring the pattern formed on the mask onto the object using the projection optical system, pattern transfer with high precision in which the line width difference between the vertical line pattern and the horizontal line pattern is reduced can be achieved.

According to a fourth aspect of the present invention, there is provided a second adjustment method of a projection optical system that projects an image of a pattern on a first surface onto a second surface, the method comprising; obtaining information on optical properties including a first optical property of the projection optical system; and adjusting the projection optical system so as to control magnitude of a second optical property that affects a line width difference by interaction with the first optical property according to a value of the first optical property obtained in the obtaining and a difference in line width of a first line pattern arranged on the first surface extending in a predetermined direction and line width of a second line pattern orthogonal to the first line pattern, the line width difference being the difference between a line width of an image of the first line pattern and a line width of an image of the second line pattern formed on the second surface by the projection optical system.

According to this method, the projection optical system is adjusted so that the magnitude of the second optical property that affects the line width difference of the images of the first line pattern and the second line pattern formed on the second surface by the projection optical system due to interaction with the first optical property is controlled, according to the difference in line width of the first line pattern and the second line pattern. Therefore, when line width difference, which is the difference in line width between the images of the first line pattern formed on the second surface by the projection optical system and the second line pattern, occurs due to the difference in line width of the first line pattern and the second line pattern formed on the first surface, such as when the line width difference is due to a drawing error of the pattern on the mask, it becomes possible to freely control the line width difference of the line patterns that are orthogonal to each other.

In this case, the first line pattern can be a vertical line pattern and the second line pattern can be a horizontal line pattern, and the first optical property and the second optical property can be determined by going through: obtaining the Zernike sensitivity of Zernike term combination cross-terms with respect to line width difference of the vertical line pattern and the horizontal line pattern, respectively, and obtaining a combination of Zernike terms in the cross-terms whose sign of the Zernike sensitivity differs in vertical and horizontal lines.

According to a fifth aspect of the present invention, there is provided a second exposure method of transferring a circuit pattern on a first surface onto an object disposed on a second surface via a projection optical system, the method comprising: adjusting the projection optical system using a second adjustment method of a projection optical system of the present invention; and transferring the circuit pattern onto the object using the projection optical system that has undergone the adjustment.

According to this method, because the projection optical system is adjusted using the second adjustment method of a projection optical system of the present invention, in the case when line difference, which is the difference in line width between the images of the first line pattern formed on the second surface by the projection optical system and the second line pattern, occurs due to, for example, a drawing error of the pattern on the mask, the projection optical system is adjusted so that the line width difference between the line patterns that are orthogonal to each other is controlled freely, and because the circuit pattern is transferred onto the object using the projection optical system that has undergone such adjustment, pattern transfer with high precision in which the line width difference between the vertical line pattern and the horizontal line pattern is reduced can be achieved.

According to a sixth aspect of the present invention, there is provided a second exposure apparatus that transfers a pattern formed on a mask onto an object via an exposure optical system, the apparatus comprising: a projection optical system that has been adjusted using a second adjustment method of a projection optical system in the present invention as the exposure optical system.

According to this apparatus, because it comprises the projection optical system that has been adjusted using the second adjustment method of a projection optical system in the present invention as the exposure optical system, by transferring the pattern formed on the mask onto the object using the projection optical system, pattern transfer with high precision in which the line width difference between the vertical line pattern and the horizontal line pattern is reduced can be achieved.

According to a seventh aspect of the present invention, there is provided a third adjustment method of a projection optical system that projects an image of a pattern on a first surface onto a second surface, the method comprising; obtaining information on wavefront aberration of the projection optical system; obtaining information on a projected image of the pattern; and adjusting the projection optical system, among a plurality of Zernike terms that are a series expansion of the wavefront aberration using the Zernike polynomial, taking into consideration the Zernike sensitivity with respect to a change in characteristics of the projected image of a certain Zernike term combination cross-term whose interaction affects the characteristics of the projected image.

According to this method, information on wavefront aberration of the projection optical system is obtained, and furthermore, information related to the projected image of the pattern is obtained. And, based on such information, on adjusting the projection optical system, among a plurality of Zernike terms that are a series expansion of the wavefront aberration using the Zernike polynomial, the projection optical system is adjusted taking into consideration the Zernike sensitivity of a certain Zernike term combination cross-term whose interaction affects the characteristics of the projected image with respect to a change in characteristics of the projected image. That is, in the third adjustment method of a projection optical system, because the projection optical system is adjusted taking into consideration the Zernike sensitivity of the projected image of a certain Zernike term combination cross-term whose interaction affects the characteristics of the projected image with respect to a change in characteristics, which was not taken into consideration conventionally, it has become possible to adjust an aberration component that had been difficult to adjust in the past, such as a high order aberration component, and the projection optical system can be adjusted so that the formed state of the image of the pattern can be improved.

In this case, when the pattern includes a line pattern, the characteristics of the projected image can include line width of an image of the line pattern.

According to an eighth aspect of the present invention, there is provided a third exposure method of transferring a circuit pattern on a first surface onto an object disposed on a second surface via a projection optical system, the method comprising: adjusting the projection optical system using a third adjustment method of a projection optical system of the present invention; and transferring the circuit pattern onto the object using the projection optical system that has undergone the adjustment.

According to this method, because the projection optical system is adjusted using the second adjustment method of a projection optical system of the present invention, the projection optical system is adjusted so that the formed state of the image of the pattern becomes more favorable, and because the circuit pattern is transferred onto the object using such an adjusted projection optical system, pattern transfer with high precision can be achieved.

According to a ninth aspect of the present invention, there is provided a third exposure apparatus that transfers a pattern formed on a mask onto an object via an exposure optical system, the apparatus comprising: a projection optical system that has been adjusted using a third adjustment method of a projection optical system in the present invention as the exposure optical system.

According to this apparatus, because it comprises the projection optical system that has been adjusted using the third adjustment method of a projection optical system in the present invention as the exposure optical system, by transferring the pattern formed on the mask onto the object using the projection optical system, pattern transfer with high precision can be achieved.

According to a tenth aspect of the present invention, there is provided a fourth exposure apparatus that irradiates a pattern arranged on a first surface with an energy beam and transfers the pattern via a projection optical system onto an object disposed on a second surface, the apparatus comprising: an optical properties measuring unit that measures optical properties including a first optical property of the projection optical system; a line width measurement unit that respectively measures a line width of an image of a first line pattern that extends in a predetermined direction on the first surface and a line width of an image of a second line pattern that is orthogonal to the first line pattern, formed on the second surface by the projection optical system; an image forming state adjustment unit that adjusts an image forming state of a pattern image by the projection optical system; and a control unit that controls magnitude of a second optical property that affects a line width difference by interaction with the first optical property according to a value of the first optical property measured by the optical properties measuring unit and the line width difference using the image forming state adjustment unit, the line width difference being the difference between a first line width that is the line width of the image of the first line pattern and a second line width that is the line width of the image of the second line pattern measured by the line width measurement unit.

According to this apparatus, the optical properties measuring unit measures optical properties that include at least the first optical property of the projection optical system. In addition, the line width measurement unit respectively measures the line width of the image of a first line pattern that extends in a predetermined direction on the first surface (the object plane) and a line width of an image of a second line pattern that is orthogonal to the first line pattern, formed on the second surface (the image plane) by the projection optical system. In this case, the line width measurement unit may measure line width of the transferred images (such as latent images, resist images, or etched images) of the vertical line pattern and the horizontal line pattern formed on the object disposed on the second surface, or aerial images of the vertical line pattern and the horizontal line pattern may be formed on the second surface and the line width of such aerial images may be measured.

And when the first optical property can be measured by the optical properties measuring unit, the control unit controls the magnitude of the second optical property that affects the line width difference by interaction with the first optical property, according to the value of the first optical property measured by the optical properties measuring unit and the line width difference using the image forming state adjustment unit, the line width difference being the difference between the first line width that is the line width of the image of the first line pattern and the second line width that is the line width of the image of the second line pattern measured by the line width measurement unit.

Therefore, even when the first optical property is an optical property difficult to adjust, by controlling the magnitude of the second optical property, which is easy to adjust using the image forming state adjustment unit, the line width difference that occurs due to the first optical property can be controlled.

Accordingly, by illuminating the pattern formed on the first surface with an energy beam and transferring the pattern onto the object disposed on the second surface via the projection optical system whose second optical property has been adjusted by the image forming state adjustment unit, a favorable exposure whose line width difference between the transferred images of orthogonal line patterns has been effectively reduced can be achieved.

In this case, the optical properties measuring unit can be a wavefront aberration measuring unit that measures wavefront aberration of the projection optical system.

In this case, among a plurality of Zernike terms resulting from series expansion using the Zernike polynomial of wavefront aberration measured with the wavefront aberration measuring unit, the first optical property can be an optional 2-times rotational symmetry component term in the fourth order and over, whereas the second optical property can be a rotational symmetry component term in the same order as the 2-times rotational symmetry component term.

In this case, the 2-times rotational symmetry component term can be one of the $12^{th}$ term and the $13^{th}$ term, which are fourth order $2\theta$ component terms, and the rotational symmetry component term can be the $9^{th}$ term, which is a fourth order $0\theta$ component term.

With the fourth exposure apparatus in the present invention, the line width measurement unit can include an aerial image measurement unit that measures a projected image of the patterns formed on the second surface, respectively, or, the line width measurement unit can include an imaging unit that picks up an image formed on the object disposed on the second surface.

With the fourth exposure apparatus in the present invention, the image forming state adjustment unit can perform at least one of: adjusting the position of at least one optical element that structures the projection optical system in at least a direction of one degree of freedom; adjusting gas pressure in a part of an optical path; adjusting wavelength shift amount of the energy beam; and adjusting the position of at least one of a pattern formed member on which the pattern is formed and the object in an optical axis direction of the projection optical system.

According to an eleventh aspect of the present invention, there is provided a prediction method of predicting characteristics of an image of a pattern via a projection optical system, the method comprising: predicting a fluctuation curve in which based on linear combination of a plurality of terms that each have an aberration component obtained by expanding in series wavefront aberration of the projection optical system using a predetermined equation, calculation of movement amount due to the wavefront aberration is performed for a fluctuation curve that shows a size variation related to defocus amount from a best focus position of an image of a predetermined pattern projected via the projection optical system under predetermined exposure conditions, and prediction of the fluctuation curve is performed based on the calculated movement amount.

When a pattern is transferred via a projection optical system, the size of the image of the pattern varies depending on the defocus amount of the transferring position from the best focus position, and the fluctuation curve that shows the variation, that is, the so-called CD-focus curve, is known to vary depending on the wavefront aberration of the projection optical system. In addition, the wavefront aberration of the projection optical system is known to be decomposable into a plurality of Zernike terms (aberration component terms) using a predetermined equation such as the Zernike polynomial in series expansion.

Through extensive research of the inventors of the present invention, it has been discovered that there is a close relation in between a coefficient of the above Zernike terms, that is, the linear combination value of a plurality of terms that each have an aberration component, and the variation of the fluctuation curve of the image of the pattern projected via the projection optical system (that is, the translation movement of the fluctuation curve in the defocus amount direction and the image size direction on a coordinate system whose coordinate axes indicate the defocus amount and the size of the pattern image).

Therefore, according to the prediction method in the present invention, by using the above relation, the CD-focus curve related to the pattern via a projection optical system whose aberration state is predetermined exposed under predetermined exposure conditions can be predicted within a short period of time by an extremely simple calculation of obtaining the linear combination value of a plurality of terms that each have an aberration component, without using any imaging simulation that requires a time consuming complicated calculation, and based on the prediction results, characteristics of the projected image (or the transferred image) of the pattern can be predicted within a short period of time.

In this case, the method can further comprise prior to the predicting: obtaining a fluctuation curve that shows a size variation of the image related to the defocus amount in the case when it is assumed that the projection optical system is free from aberration under the predetermined exposure conditions by simulation, and approximating the fluctuation curve into a high order function.

In this case, in the predicting, movement amount of the fluctuation curve in a direction of the defocus amount can be calculated, based on linear combination of each aberration component whose coefficient shows the sensitivity of each aberration component to the defocus amount under the predetermined exposure conditions, and movement amount of the fluctuation curve in a direction of size variation of the image can be calculated, based on linear combination of the square of each aberration component whose coefficient shows the sensitivity of the square of each aberration component to the size variation of the image under the predetermined exposure conditions.

As is previously described, the movement of the fluctuation curve can be divided into the movement of the curve in the direction of the axis showing the defocus amount (defocus amount axis direction) and the movement of the curve in the direction of the axis showing the size of the pattern image (image size axis direction). The movement amount of the fluctuation curve in the axis direction of the defocus amount is sensitive to each aberration component when expanding the wavefront aberration of the projection optical system, and the movement amount can be predicted by linear combination of each aberration component. In addition, the movement amount of the fluctuation curve in the axis direction of the image size is sensitive to the square of each aberration component, and the movement amount can be predicted by linear combination of the square of each aberration component.

In this case, in the predicting, in addition to the linear combination of the square of each aberration component, the movement amount of the fluctuation curve related to the direction of size variation of the image can be calculated, based on linear combination of respective cross terms whose coefficients show the sensitivity of cross terms that have different aberrations in the direction of size variation of the image under the predetermined exposure conditions.

The movement of the fluctuation curve in the axis direction of the image size can be predicted more accurately when taking into consideration the linear combination of cross terms that have different aberrations, since the movement of the fluctuation curve in the axis direction of the image size is sensitive not only to the square of each aberration component but is sensitive also to the cross terms that each have a different aberration.

In the prediction method in the present invention, the high order function can be a function made up only of even order terms.

In the prediction method in the present invention, in the predicting, fluctuation behavior of the fluctuation curve due to the wavefront aberration can be calculated, based on linear combination of a plurality of terms that each have an aberration component, and the fluctuation curve can be predicted based on the movement amount and the fluctuation behavior. In such a case, because the fluctuation behavior of the fluctuation curve due to the wavefront aberration of the projection optical system is calculated based on not only the movement amount of the fluctuation curve but also on the linear combination of terms that each have an aberration component, the fluctuation curve can be predicted more accurately.

In this case, the method can further comprise prior to the predicting: obtaining a fluctuation curve that shows a size variation of the image related to the defocus amount in the case when it is assumed that the projection optical system is free from aberration under the predetermined exposure conditions by simulation, and approximating the fluctuation curve into a high order function.

In this case, the method can further comprise prior to the predicting: calculating the fluctuation curve related to an image of the pattern projected under the predetermined exposure conditions via the projection optical system in an actual aberration state, and in the predicting, a difference function can be obtained as the fluctuation behavior of the fluctuation curve due to the wavefront aberration that shows the difference between a high order function that approximates the fluctuation curve, which has been moved based on the movement amount, and a function that shows the fluctuation curve obtained in the calculating.

In this case, the calculating can be performed by simulation.

In the prediction method in the present invention, in the case the difference function is obtained as the fluctuation behavior of the fluctuation curve due to the wavefront aberration that shows the difference between a high order function that approximates the fluctuation curve, which has been moved based on the movement amount, and a function that shows the fluctuation curve obtained in the calculating, in the predicting, coefficients of even order terms of the difference function can be calculated, based on linear combination of the square of each aberration component whose coefficient shows the sensitivity of the square of each aberration component to the even order terms of the different function under the predetermined exposure conditions, and coefficients of odd order terms of the difference function can be calculated, based on linear combination of each aberration component whose coefficient shows the sensitivity of each aberration component to the odd order terms of the different function under the predetermined exposure conditions. In such a case, coefficients of the even order terms of the difference function that show the fluctuation behavior of the variation function are sensitive to the square of each aberration component obtained when expanding the wavefront aberration of the projection optical system, therefore, the coefficients can be predicted by the linear combination of the square of each aberration component. In addition, coefficients of the odd order terms of the difference function are sensitive to each aberration component; therefore, the coefficients can be predicted by the linear combination of each aberration component. As a consequence, this also allows an accurate prediction of the fluctuation behavior of the fluctuation curve within a short period of time using the linear combination of terms that each has an aberration component of the wavefront aberration of the projection optical system.

In the prediction method in the present invention, the predetermined equation can be a Zernike polynomial, and each aberration component can be a coefficient of each Zernike term.

According to a twelfth aspect of the present invention, there is provided a first evaluation method of evaluating characteristics of an image of a pattern via a projection optical system, the method comprising: predicting a fluctuation curve that shows a size variation related to defocus amount from a best focus position of an image of a predetermined pattern projected in at least one measurement point via the projection optical system under predetermined exposure conditions, using a prediction method in the present invention, in at least one measurement point within an effective field of the projection optical system; and evaluating characteristics of the image of the predetermined pattern based on results of the prediction.

According to this method, because the fluctuation curve of the image of a predetermined pattern projected via the projection optical system under predetermined exposure conditions can be accurately predicted in at least one measurement point within an effective field of the projection optical system using the prediction method in the present invention, the characteristics of the image of the predetermined pattern within the effective field of the projection optical system can be evaluated with good precision.

In this case, the predetermined pattern can be arranged corresponding to a plurality of measurement points within the effective field of the projection optical system, and the characteristics can include uniformity of the image within the effective field of the projection optical system.

In the first evaluation method in the present invention, the predetermined pattern can include two line patterns that are arranged on a plane perpendicular to an optical axis direction of the projection optical system, orthogonal to each other, and in the predictiong, the fluctuation curve can be predicted for each line pattern.

In this case, in the evaluating, line width difference of the images of the line patterns can be evaluated as the characteristics of the image. In such a case, the line width difference of two line patterns arranged orthogonal to each other occurring due to, for example, mainly astigmatism, can be evaluated as the characteristics in at least one measurement point.

In the first evaluation method in the present invention, the predetermined pattern can include two line patterns that are arranged in parallel on a plane perpendicular to an optical axis direction of the projection optical system, and in the predicting, the fluctuation curve can be predicted for each line pattern.

In this case, in the evaluating, line width difference of the images of the line patterns can be evaluated as the characteristics of the image. In such a case, as the characteristics, items such as the line width abnormal value, mainly due to coma, can be evaluated.

According to a thirteenth aspect of the present invention, there is provided a first adjustment method of adjusting a formed state of an image of a pattern via a projection optical system, the method comprising: evaluating characteristics of an image of a predetermined pattern arranged corresponding to at least one measurement point in an effective field of the projection optical system is evaluated, using a first evaluation method in the present invention; and adjusting the formed state of the image of the predetermined pattern via the projection optical system based on results of the evaluation.

According to this method, the characteristics of the image of a predetermined pattern arranged corresponding to at least one measurement point in the effective field of the projection optical system is evaluated, using the first evaluation method in the present invention, and the formed state of the image of the predetermined pattern via the projection optical system is adjusted based on the evaluation results. Accordingly, it becomes possible to adjust the characteristics of the image of the predetermined pattern into a desired state, according to the evaluation results.

In this case, in the adjusting, regarding the measurement point, adjustment amount of an adjustment parameter for adjusting the formed state of the image of the predetermined pattern can be calculated, using a variation amount of each aberration component per unit adjustment quantity of the adjustment parameter, the sensitivity of each aberration component to size variation of the image of the predetermined pattern under the predetermined exposure conditions, and the deviation from a target value of coefficients of terms in each order of a fluctuation curve that shows size variation of the image of the predetermined pattern with respect to the defocus amount, and the formed state of the image of the predetermined pattern can be adjusted based on the adjustment amount that has been calculated.

The fluctuation curve changes at the measurement point, due to the influence of aberration or the like of the projection optical system. Accordingly, if the aberration component is changed by methods such as adjusting the projection optical system, the fluctuation curve at the measurement point can be changed so that it forms a desired curve (target). Therefore, in the present invention, the adjustment amount of the adjustment parameters (adjustment parameters for adjusting the formed state of the image of the pattern) required for canceling the deviation between the fluctuation curve at the measurement point and the desired curve is calculated, using the variation amount of each aberration component per unit adjustment quantity of the adjustment parameter, the sensitivity of each aberration component to size variation of the image of the predetermined pattern under the predetermined exposure conditions, and the deviation from the target value of coefficients of terms in each order of the fluctuation curve that shows size variation of the image of the predetermined pattern with respect to the defocus amount. And, based on the calculated adjustment amount, the formed state of the image of the predetermined pattern is adjusted. In this manner, the formed state of the image of the pattern can be adjusted so that the fluctuation curve that shows size variation of the image of the predetermined pattern with respect to the defocus amount can be changed so that it nears the desired fluctuation curve.

In this case, the outcome of the desired curve (target) depends on the adjustment items of the image of the pattern that is to be obtained. For example, in the evaluating, characteristics of an image of a predetermined pattern arranged corresponding to a plurality of measurement points within an effective field of the projection optical system can be evaluated, respectively, and in the adjusting, the target value related to coefficients of terms that have the same order in the fluctuation curve can be the same among the measurement points. In such a case, the surface uniformity of the image of the pattern within the effective field of the projection optical system can be improved. In addition, when the predetermined pattern comprises a plurality of patterns, the target value related to coefficients of terms that have the same order in the fluctuation curve can be the same among the patterns. In such a case, for example, adjustment of the line width of the image of the vertical line pattern and the image of the horizontal line pattern, or the line widths of the images of a parallel pattern at the same measurement point can be performed, so that the line widths coincide with each other to the utmost extent.

In the first adjustment method in the present invention, the adjustment amount can be obtained, using the least squares method.

According to a fourteenth aspect of the present invention, there is provided a fourth exposure method of transferring a circuit pattern on a first surface onto an object disposed on a second surface via a projection optical system, the method comprising: adjusting a formed state of an image of the circuit pattern via the projection optical system, using a first adjustment method of the present invention; and transferring the circuit pattern is transferred onto the object via the projection optical system, in a state where adjustment has been performed on the formed state of the image.

According to this method, because the formed state of the image of the circuit pattern via the projection optical system is adjusted using the first adjustment method of the present invention, and the circuit pattern is transferred onto the object in a state where the formed state of the image is already adjusted, it becomes possible to transfer the circuit pattern onto the object with good accuracy.

According to a fifteenth aspect of the present invention, there is provided a second evaluation method of evaluating characteristics of an image of a pattern via a projection optical system, the method comprising: obtaining information on wavefront aberration of the projection optical system; obtaining information related to a projected image of the pattern; and evaluating characteristics of the image of the pattern, among a plurality of Zernike terms that are a series expansion of the wavefront aberration using the Zernike polynomial, taking into consideration the Zernike sensitivity of a certain Zernike term combination cross-term whose interaction affects the characteristics of the projected image with respect to a change in characteristics of the projected image.

According to this method, information on wavefront aberration of the projection optical system is obtained, and furthermore, information related to a projected image of the pattern is obtained. Then, based on the information, characteristics of the image of the pattern is evaluated, taking into consideration the Zernike sensitivity of a certain Zernike term combination cross-term whose interaction affects the characteristics of the projected image with respect to a change in characteristics of the projected image, among a plurality of Zernike terms that are a series expansion of the wavefront aberration using the Zernike polynomial. That is, in the second evaluation method, the characteristics of the image of the pattern can be evaluated with more accuracy because the characteristics of the image of the pattern is evaluated taking into consideration the Zernike sensitivity of a certain Zernike term combination cross-term whose interaction affects the characteristics of the projected image with respect to a change in characteristics of the projected image, which was not considered in the conventional method.

In this case, when the pattern includes a line pattern, characteristics of the projected image can include line width of an image of the line pattern.

According to a sixteenth aspect of the present invention, there is provided a second adjustment method of adjusting a formed state of an image of a pattern via a projection optical system, the method comprising: evaluating characteristics of an image of a predetermined pattern arranged corresponding to at least one measurement point in an effective field of the projection optical system, using a second evaluation method of the present invention; and adjusting the formed state of the image of the predetermined pattern via the projection optical system based on results of the evaluation.

According to this method, characteristics of the image of the predetermined pattern arranged corresponding to at least one measurement point in the effective field of the projection optical system is evaluated with good precision, using the second evaluation method of the present invention, and the formed state of the image of the predetermined pattern via the projection optical system is adjusted, based on the evaluation results. Accordingly, based on the evaluation results, adjustment can be made to make the formed state of the image of the pattern favorable.

According to a seventeenth aspect of the present invention, there is provided a fifth exposure method of transferring a pattern on a first surface onto an object disposed on a second surface via a projection optical system, the method comprising: adjusting a formed state of an image of the pattern via the projection optical system is adjusted, using a second adjustment method of the present invention; and transferring the pattern onto the object via the projection optical system, in a state where adjustment has been performed on the formed state of the image.

According to an eighteenth aspect of the present invention, there is provided a program that makes a computer execute prediction of characteristics of an image of a pattern via a projection optical system, the program making the computer execute a prediction procedure of: calculating movement amount due to wavefront aberration of the projection optical system for a fluctuation curve that shows a size variation related to defocus amount from a best focus position of an image of a predetermined pattern projected via the projection optical system under predetermined exposure conditions, based on linear combination of a plurality of terms that each have an aberration component obtained by expanding in series the wavefront aberration using a predetermined equation; and predicting the fluctuation curve based on the calculated movement amount.

When this program is installed into a computer, the computer executes each of the procedures described above. And, in this manner, the computer executes the prediction method of the present invention. Accordingly, as is previously described, the CD-focus curve related to the pattern via a projection optical system whose aberration state is predetermined exposed under predetermined exposure conditions can be predicted within a short period of time by an extremely simple calculation of obtaining the linear combination value of a plurality of terms that each have an aberration component, without using any imaging simulation that requires a time consuming complicated calculation, and based on the prediction results, the transferred characteristics of the pattern can be predicted within a short period of time.

In this case, the program can further make the computer execute prior to the prediction procedure: an approximation procedure in which a fluctuation curve that shows a size variation of the image related to the defocus amount in the case when it is assumed that the projection optical system is free from aberration under the predetermined exposure conditions is approximated into a high order function.

In this case, as the prediction procedure, the program can make the computer execute the procedures of: predicting movement amount of the fluctuation curve in a direction of the defocus amount, based on linear combination of the each aberration component whose coefficient shows the sensitivity of each aberration component to the defocus amount under the predetermined exposure conditions, and predicting movement amount of the fluctuation curve in a direction of size variation of the image, based on linear combination of the square of each aberration component whose coefficient shows the sensitivity of the square of each aberration component to the size variation of the image under the predetermined exposure conditions.

In the program of the present invention, as the prediction procedure, the program can make the computer execute the procedure of: predicting the movement amount of the fluctuation curve in a direction of size variation of the image based on linear combination of respective cross terms whose coefficients show the sensitivity of cross terms that have different aberrations to the size variation of the image under the predetermined exposure conditions, in addition to the linear combination of the square of each aberration component.

In the program of the present invention, the high order function can be a function made up only of even order terms.

In the program of the present invention, as the prediction procedure, the program can make the computer execute the procedure of: calculating fluctuation behavior of the fluctuation curve due to the wavefront aberration, based on linear combination of a plurality of terms that each have an aberration component, and predicting the fluctuation curve based on the movement amount and the fluctuation behavior.

In this case, the program can further make the computer execute prior to the prediction procedure: an approximation procedure in which a fluctuation curve that shows a size variation of the image related to the defocus amount in the case when it is assumed that the projection optical system is free from aberration under the predetermined exposure conditions is approximated into a high order function.

In this case, the program can further make the computer execute prior to the prediction procedure: a calculation procedure in which size variation with respect to the defocus amount of an image of the pattern projected under the predetermined exposure conditions via the projection optical system in an actual aberration state is calculated; and as the prediction procedure, the program can make the computer execute a procedure of obtaining a difference function as the fluctuation behavior of the fluctuation curve due to the wavefront aberration that shows the difference between a high order function that has been moved based on the movement amount and a variation function that has been obtained in the calculation procedure.

In this case, as the prediction procedure, the program can make the computer execute the procedures of: predicting coefficients of even order terms of the difference function, based on linear combination of the square of each aberration component whose coefficient shows the sensitivity of the square of each aberration component to the even order terms of the different function under the predetermined exposure conditions, and predicting coefficients of odd order terms of the difference function, based on linear combination of each aberration component whose coefficient shows the sensitivity of each aberration component to the odd order terms of the different function under the predetermined exposure conditions.

In the program of the present invention, the predetermined equation can be a Zernike polynomial, and each aberration component can be a coefficient of each Zernike term.

The program of the present invention can be brought to the market in a state where the program is stored in an information storage medium. Therefore, according to a nineteenth aspect of the present invention, there is provided an information storage medium in which a program in the present invention is recorded that can be read by a computer.

In addition, according to a twentieth aspect of the present invention, there is provided a making method of an exposure apparatus that transfers a pattern formed on a mask onto an object via a projection optical system, the making method comprising: adjusting the projection optical system, which uses an adjustment method of a projection optical system according to any one of the first to third adjustment method of the present invention.

In addition, in a lithographic process, by performing exposure using any one of the first to fourth exposure apparatus of the present invention, the pattern can be formed on the object with good precision, which allows highly integrated microdevices to be produced with good yield, which consequently leads to improving the productivity. Similarly, in the lithographic process, by performing exposure using any one of the first to fifth exposure methods of the present invention, the pattern can be formed on the object with good precision, which allows highly integrated microdevices to be produced with good yield, which consequently leads to improving the productivity. Accordingly, further from another aspect, the present invention can also be said to be a device manufacturing method that uses any one of the first to fourth exposure apparatus of the present invention, or it can be said to be a device manufacturing method that uses any one of the first to fifth exposure methods of the present invention.

BRIEF DESCRIPTION OF THE DRAWINGS

In the accompanying drawings;

FIGS. 6A to 6F are views for describing wavefront distortion in a pupil plane according to the changes in values in the $9^{th}$ term and the $12^{th}$ term of the Zernike polynomial, which is an expansion of wavefront aberration of a projection optical system;

FIGS. 7A to 7F are views for describing wavefront distortion in a pupil plane according to the changes in values in the $4^{th}$ term and the $5^{th}$ term of the Zernike polynomial, which is an expansion of wavefront aberration of a projection optical system;

FIG. 8 is a CD-focus diagram for describing a state in which line difference between an image of a vertical line pattern (V) and an image of a horizontal line pattern (H) occurs, corresponding to a difference in best focus position of the vertical line pattern and the horizontal line pattern;

FIG. 9 is a view showing an example of line width difference (experimental result) in vertical and horizontal lines that is obtained when measuring line width of a transferred resist image of a pattern on a measurement reticle, under the exposure conditions of using a KrF light source of a wavelength of 248.3 nm, illumination condition a ⅔ annular illumination condition of illumination σ=0.75, and numerical aperture (N.A.) of projection optical system PL 0.68;

FIG. 13 is a chart showing an example of a cross-term calculation result of aberrations that are obtained by simulation under a predetermined condition;

FIG. 18 is a graph showing an example of the Zernike sensitivity $S\alpha_i$;

DESCRIPTION OF THE PREFERRED EMBODIMENTS

An embodiment of the present invention is described below, referring to FIGS. 1 to 12.

Figure 1:
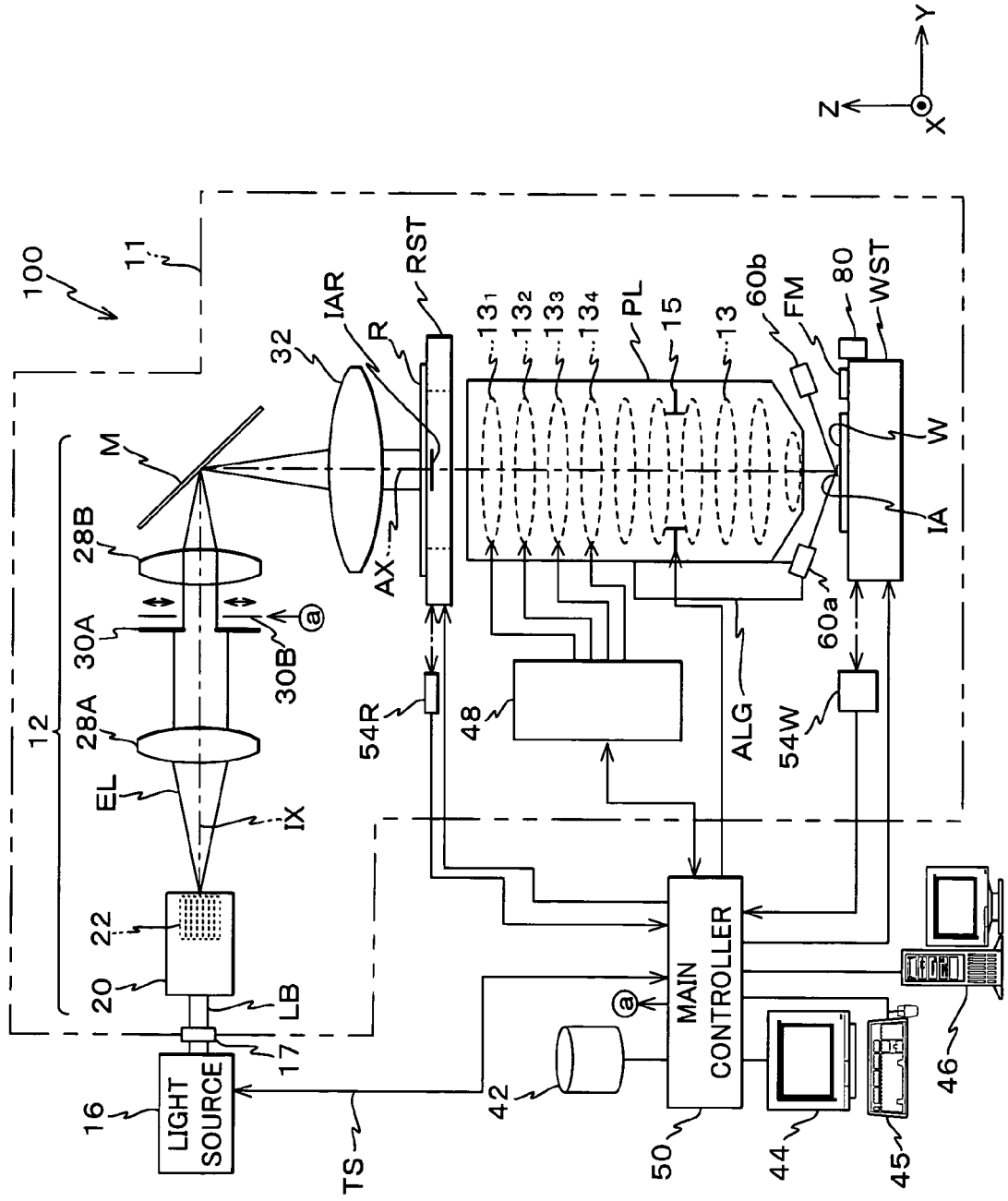
FIG. 1 is a view of the entire configuration of an exposure apparatus related to an embodiment in the present invention.

FIG. 1 shows an entire structure of an exposure apparatus 100 related to the embodiment. Exposure apparatus 100 is a reduction projection exposure apparatus (a so-called scanner) that uses a pulsed laser light source as its exposure light source (hereinafter referred to as 'light source').

Exposure apparatus 100 comprises: an illumination system made up of a light source 16 and an illumination optical system 12; a reticle stage RST serving as a mask stage that holds a reticle R serving as a mask, which is illuminated by an exposure illumination light EL serving as an energy beam from the illumination system; a projection optical system PL that projects exposure illumination light EL outgoing from reticle R onto a wafer W (on the image plane) serving as an object; a wafer stage WST that holds wafer W; a control system for the above parts, and the like.

As light source 16, in this case, a KrF excimer laser (output wavelength 248 nm) is used. Incidentally, as light source 16, a pulsed ultraviolet light source that emits pulsed light in the vacuum ultraviolet region such as an $F_2$ laser (output wavelength 157 nm) or an ArF excimer laser (output wavelength 193 nm) may also be used.

In actual, light source 16 is arranged in a service room whose degree of cleanliness is lower than that of a clean room where a chamber 11 is provided, in which the exposure apparatus main body made up of parts such as the components of illumination optical system 12 and reticle stage RST, projection optical system PL, wafer stage WST, and the like are housed. Light source 16 is connected to chamber 11 via a light transmitting optical system (not shown) that contains an optical axis adjusting optical system called a beam matching unit in at least a part of its system. In light source 16, an internal controller controls the output operation (on/off) of a laser beam LB, energy per pulse of laser beam LB, oscillation frequency (repetition frequency), center wavelength and spectral line half width (wavelength width), and the like, based on control information TS from a main controller 50.

Illumination optical system 12 comprises parts such as: a beam shaping illuminance unifying optical system 20, which includes a cylinder lens, a beam expander (none of which are shown), and an optical integrator (homogenizer) 22; an illumination system aperture stop plate 24; a first relay lens 28A; a second relay lens 28B; a fixed reticle blind 30A; a movable reticle blind 30B; an optical path bending mirror M; a condenser lens 32, and the like. As the optical integrator, a fly-eye lens, a rod integrator (an internal reflection type integrator), or a diffractive optical element can be used. In the embodiment, a fly-eye lens is used as optical integrator 22; therefore, hereinafter it will also be referred to as fly-eye lens 22.

Beam shaping illuminance unifying optical system 20 connects to the light transmitting optical system (not shown) via a light transmitting window 17 provided in chamber 11. Beam shaping illuminance unifying optical system 20 shapes the sectional shape of laser beam LB, which is the pulsed light emitted from light source 16 that enters beam shaping illuminance unifying optical system 20 via light transmitting window 17, using parts such as the cylinder lens or the beam expander. In addition, in beam shaping illuminance unifying optical system 20, laser beam LB reaches optical integrator 22 after passing through an energy rough adjuster (not shown), which comprises an ND filter that can change the transmittance in geometric series in a plurality of steps or continuously, and an optical unit that includes at least one of a plurality of diffractive optical elements that are arranged switchable in the illumination optical system, prisms (such as a cone prism or a polyhedral prism) that can move along the optical axis of the illumination optical system, and a zoom optical system. The above optical unit changes the light quantity distribution of the illumination light on the pupil plane of the illumination optical system (the size and shape of the secondary light source), that is, changes illumination conditions of reticle R, by changing the intensity distribution of the illumination light on the entering surface when optical integrator 22 is a fly-eye lens, or by changing the angle of incidence of the illumination light to the entering surface when optical integrator 22 is an internal reflection type integrator. In addition, the optical unit is made so that light quantity loss is suppressed to the utmost when illumination conditions are changed.

Then, in order to illuminate reticle R with uniform distribution, fly-eye lens 22 located inside beam shaping illuminance unifying optical system 20 on the outgoing side forms an area light source (a secondary light source), which is composed of multiple point sources, on the focusing plane on the outgoing side of the laser beam arranged substantially coinciding with the pupil plane of illumination optical system 12, when the laser beam enters beam shaping illuminance unifying optical system 20. The laser beam outgoing from the secondary light source will hereinafter be referred to as 'illumination light EL'.

In the vicinity of the focusing plane on the outgoing side of fly-eye lens 22, the illumination system aperture stop plate, made of a circular plate shaped member, may be disposed. In the illumination system aperture stop plate, for example, the following aperture stops are formed spaced substantially apart at an equal angle: a conventional aperture stop made up of a circular aperture (conventional aperture); an aperture stop made up of small circular apertures to reduce a σ value, which is a coherence factor (small σ aperture); a ring shaped aperture stop for annular illumination (ring-shaped aperture); and a modified aperture stop made up of a plurality of apertures arranged eccentrically for a modified light source method. In such a case, by using the illumination system aperture stop plate with the optical unit and selectively setting one of the aperture stops on the optical path of illumination light EL, the light quantity distribution of the illumination light on the pupil plane of the illumination optical system (the size and shape of the secondary light source), that is, changes illumination conditions of reticle R can be changed. Especially, even when the illumination conditions cannot be set only with the optical unit, by providing the illumination system aperture stop plate, the illumination conditions can be set easily while reducing the light quantity loss.

On the optical path of illumination light EL outgoing from fly-eye lens 22 (or the illumination system aperture stop plate), a relay optical system is arranged, composed of the first relay lens 28A and the second relay lens 28B with fixed reticle blind 30A and movable reticle blind 30B disposed in between. Fixed reticle blind 30A is disposed slightly defocused from the conjugate surface to the pattern surface of reticle R, and a rectangular opening is formed that sets a rectangular shaped illumination area IAR on reticle R. In addition, in the vicinity of fixed reticle blind 30A, movable reticle blind 30B, which has an opening whose position corresponding to the scanning direction (lateral direction of the page surface in FIG. 1) and width are variable, is disposed, and by further restricting the illumination area via movable reticle blind 30B at the beginning and end of scanning exposure, exposure of unnecessary areas can be prevented. Furthermore, the width of the opening of movable reticle blind 30B is variable also in the non-scanning direction (an X-axis direction, which is the direction perpendicular to the page surface in FIG. 1), which is perpendicular to the scanning direction, and the width of the illumination area in the non-scanning direction is adjustable according to the pattern of reticle R that is to be transferred onto wafer W.

On the optical path EL in the rear of the second relay lens 28B that structures the relay optical system, bending mirror M that reflects illumination light EL having passed through the second relay lens 28B towards reticle R is disposed, and in the rear of mirror M on the optical path of illumination light EL, condenser lens 32 is disposed.

In the arrangement described so far, the entering surface of fly-eye lens 22, the disposal surface of movable reticle blind 30B, and the pattern surface of reticle R are set optically conjugate with one another, while the light source plane formed on the focusing plane (the pupil plane of the illumination optical system) on the outgoing side of fly-eye lens 22 and the Fourier transform plane (outgoing pupil plane) of projection optical system PL are set optically conjugate, making up a Koehler illumination system.

Following is a brief description of the operation of the illumination system having such an arrangement. With the system, laser beam LB, which is the pulsed light emitted from light source 16, enters fly-eye lens 22 after entering beam shaping illuminance unifying optical system 20 where its' sectional shape is shaped. With this operation, the secondary light source previously described is formed on the focusing plane on the outgoing side of the fly-eye lens 22.

Illumination light EL outgoing from the above secondary light source then passes through the first relay lens 28A and then reaches fixed reticle blind 30A. It then passes through the opening of fixed reticle blind 30A and then movable reticle blind 30B, and further through the second relay lens 28B until it reaches mirror M where its optical path is bent vertically downward. Then, illumination light EL then passes through condenser lens 32, and then illuminates the rectangular illumination area IAR of reticle R held on reticle stage RST with uniform illuminance distribution.

On reticle stage RST, reticle R is mounted and held by suction via electrostatic chucking (or vacuum chucking) or the like (not shown). Reticle stage RST is structured so that it can be finely driven (including rotation) within a horizontal plane (an XY plane) by a drive system (not shown). Reticle stage RST is made, for example, finely drivable (including rotation around a Z-axis) within the XY plane perpendicular to an optical axis IX of the illumination system (coincides with an optical axis AX of projection optical system PL that will be described later in the description), as well as drivable in a predetermined scanning direction (in this case, a Y-axis direction) at a designated scanning velocity by a reticle stage drive section (not shown) that includes parts such as a linear motor.

The position of reticle stage RST within the XY plane is detected at all times by a reticle laser interferometer 54R (hereinafter simply referred to as 'reticle interferometer'), at a resolution of, for example, approximately 0.5 to 1 nm. Positional information on reticle stage RST from reticle interferometer 54R is supplied to main controller 50, which is arranged outside main body chamber 11. And, main controller 50 controls and drives reticle stage RST via the reticle stage drive section (not shown) based on the positional information of reticle stage RST.

The material used for reticle R needs to be different depending on the light source that is used. That is, when a KrF excimer laser or an ArF excimer laser is used as the light source, materials such as synthetic quartz, fluoride crystal as in fluorite, or fluorine-doped quartz can be used, however, when an $F_2$ laser is used, the reticle has to be made of fluoride crystal such as fluorite, or fluorine-doped quartz.

Projection optical system PL is, for example, a double telecentric reduction system. The projection magnification of projection optical system PL is for example, ¼, ⅕, or ⅙. Therefore, when illumination area IAR on reticle R is illuminated with illumination light EL as is previously described, a reduced image of the circuit pattern or the like of reticle R within illumination area IAR is formed via projection optical system PL, on an irradiation area (exposure area) IA of illumination light EL on wafer W that is conjugate to illumination area IAR.

As projection optical system PL, a refraction system consisting only of a plurality of dioptric elements (lens elements) 13, such as around 10 to 20 pieces, is used. Of the plurality of lens elements 13 that make up projection optical system PL (in this case, 5 lenses in order to simplify the description), lens elements $13_1$, $13_2$, $13_3$, $13_4$, and $13_5$ disposed on the object surface side (reticle R side) are movable lenses that can be moved from the outside by an image forming quality correction controller 48. Lens elements $13_1$ to $13_5$ are each held by the barrel via lens holders that have a double structure (not shown). These lens elements $13_1$ to $13_5$ are each held by inner lens holders, and these inner lens holders are supported by drive elements (not shown) such as piezo elements at three points in the gravitational direction with respect to outer lens holders. And, by independently adjusting the applied voltage to the drive elements, each of the lens elements $13_1$ to $13_5$ can be shifted along the Z-axis direction, which is the optical axis direction of projection optical system PL, and can also be driven (tiltable) in a direction of inclination with respect to an XY plane (that is, a rotational direction around the X-axis (θx) and a rotational direction around the Y-axis (θy)).

The barrel holds lens elements 13 other than the ones referred to above via typical lens holders. Optical elements other than lens elements $13_1$ to $13_5$ may be made drivable, such as the lenses disposed in the vicinity of the pupil plane of projection optical system PL, the lenses disposed on the image plane side, or an aberration correction plane (optical plate) that corrects the aberration of projection optical system PL, especially the non-rotational symmetric component. Furthermore, the degree of freedom (the movable direction) of such drivable optical elements is not limited to three, and may be one, two, or four and over.

In addition, a pupil aperture stop 15 that can continuously change the numerical aperture (N.A.) within a predetermined range is provided in the vicinity of the pupil plane of projection optical system PL. As pupil aperture stop 15, for example, the so-called iris diaphragm is used, which operates under the control of main controller 50.

When the KrF excimer laser beam or the ArF excimer laser beam is used as illumination light EL, synthetic quartz can also be used besides materials such as fluoride crystal as in fluorite, or fluorine-doped quartz can be used for each lens elements structuring projection optical system PL, however, when the $F_2$ laser is used, the material of all the lenses used in projection optical system PL has to be fluoride crystal such as fluorite, or fluorine-doped quartz.

On wafer stage WST, wafer W is held by electrostatic suction (or vacuum chucking) or the like via a wafer holder (not shown).

Wafer stage WST is disposed below projection optical system PL, and is drivable in a direction within the XY plane and in the Z-axis direction by a wafer stage drive section (not shown) made up of parts such as a linear motor and a voice coil motor (VCM), and also finely drivable in the direction of inclination with respect to the XY plane (that is, the rotational direction around the X-axis (θx) and the rotational direction around the Y-axis (θy)). That is, wafer stage WST is structured movable not only in the scanning direction (the Y-axis direction) but also in the non-scanning direction (the X-axis direction) perpendicular to the scanning direction, so that scanning exposure of a plurality of shot areas on wafer W can be performed with the areas relatively moving with respect to exposure area IA. With such an arrangement, the step-and-scan operation in which scanning exposure operation of each shot area on wafer W and stepping operation of moving wafer W to the acceleration starting point for exposure of the next shot are repeatedly performed can be performed.

The position of wafer stage WST within the XY plane (including rotation around the Z-axis (θz rotation)) is detected at all times at a resolution of, for example, around 0.5 to 1 nm, by a wafer laser interferometer (hereinafter simply referred to as 'wafer interferometer') 54W via a reflection surface provided or formed on wafer stage WST. Wafer interferometer 54W comprises a plurality of multi-axis interferometers that each have a plurality of length measuring axes, and with these interferometers, rotation of wafer stage WST (θz rotation (yawing), θy rotation (pitching) which is rotation around the Y-axis, and θx rotation (rolling) which is rotation around the X-axis) can be measured.

Positional information (or velocity information) on wafer stage WST detected by wafer interferometer 54W is supplied to main controller 50. And, based on the positional information (or velocity information), main controller 50 controls the position of wafer stage WST via the wafer stage drive section (not shown).

In addition, a fiducial mark plate FM is fixed on wafer stage WST, on which reference marks such as reference marks for the so-called baseline measurement by an alignment system ALG (to be described later) are formed, with its surface substantially at the same height as the surface of wafer W.

In addition, on the side surface of wafer stage WST on the +Y side (on the right side of the page surface in FIG. 2), a wavefront aberration measuring unit 80 is attached, serving as a freely detachable portable wavefront measuring unit.

Figure 2:
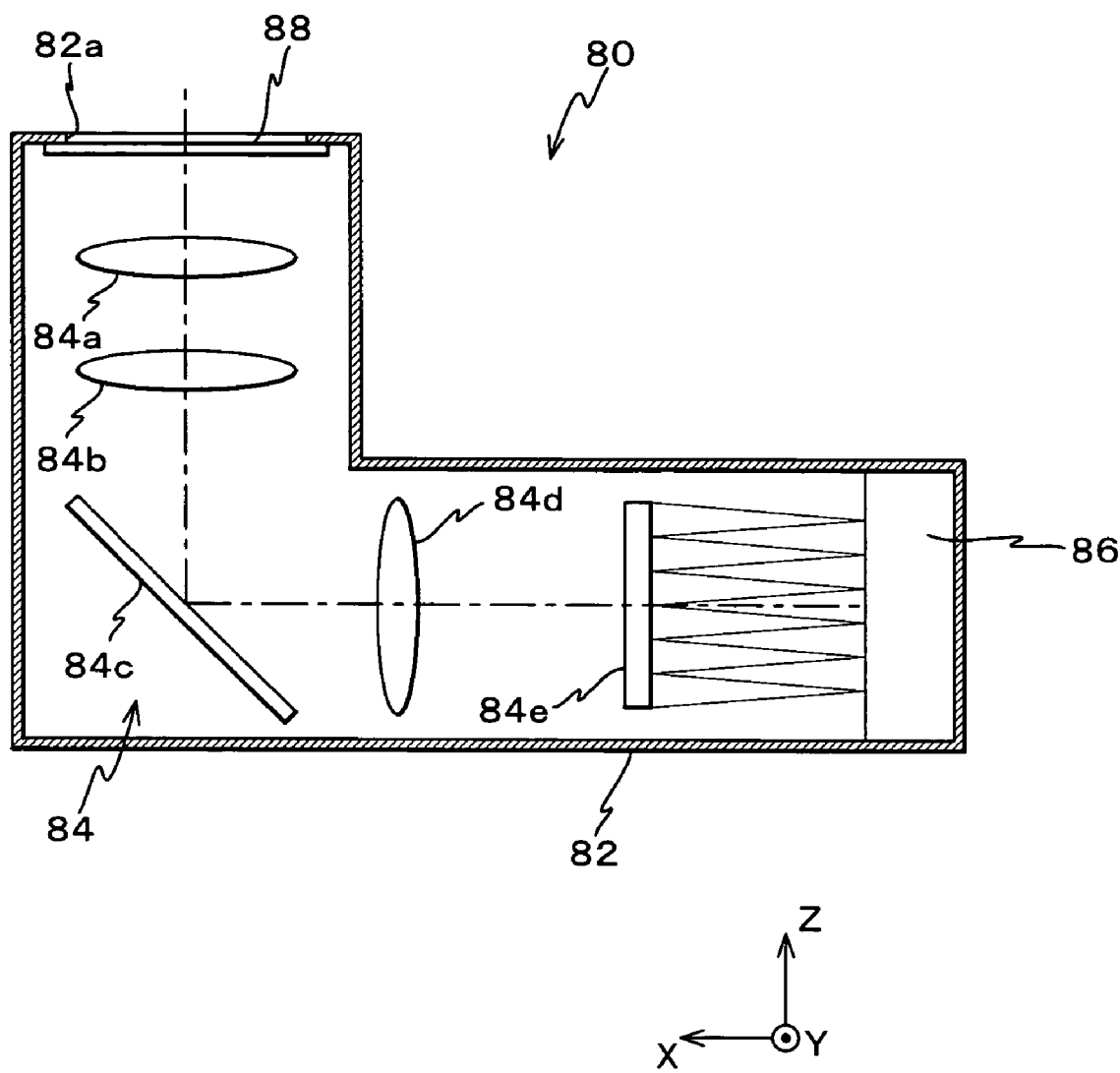
FIG. 2 is a sectional view of a wavefront aberration measuring unit in FIG. 1.

As is shown in FIG. 2, wavefront aberration measuring unit 80 comprises a hollow casing 82, a photodetection optical system 84 made up of a plurality of optical elements arranged at a predetermined positional relationship within casing 82, and a photodetection portion 86 disposed on the −X side end inside casing 82.

Casing 82 is made from a member that has an L-shaped section in an XZ plane and a space formed inside, and at its uppermost portion (the end portion in the +Z direction), an opening 82a of a circular shape in a planar view (when viewed from above) is formed so that the light from above casing 82 proceeds into the space inside. In addition, a cover glass 88 is provided to cover opening 82a from the inside of casing 82. On the upper surface of cover glass 88, a light shielding membrane that has a circular opening in the center is formed by vapor deposition of metal such as chrome, which shields unnecessary light from entering photodetection optical system 84 when the wavefront aberration of projection optical system PL is measured.

Photodetection optical system 84 is made up of an objective lens 84*a*, a relay lens 84*b*, and a deflecting mirror 84*c*, which are sequentially arranged from under cover glass 88 inside casing 82 in a downward direction, and a collimator lens 84*d* and a microlens array 84*e*, which are sequentially arranged on the −X side of deflecting mirror 84*c*. Deflecting mirror 84*c* is provided having an inclination of 45°, and by deflecting mirror 84*c*, the optical path of the light entering the objective lens 84*a* from above in a downward vertical direction is deflected toward the collimator lens 84*d*. Each of the optical members that make up photodetection optical system 84 is fixed to the wall of casing 82 on the inner side, via holding members (not shown), respectively. Microlens array 84*e* has a plurality of small convex lenses (lens elements) that are arranged in an array shape on a plane perpendicular to the optical path.

Photodetection portion 86 is made up of parts like a photodetection element such as a two-dimensional CCD, and an electric circuit such as a charge transport controlling circuit. The area of photodetection element is large enough to receive all the beams that have entered objective lens 84*a* and are emitted from microlens array 84*e*. The measurement data of photodetection portion 86 is output to main controller 50 via a signal line (not shown) or by radio transmission.

Using the above wavefront aberration measuring unit 80 allows the wavefront aberration of projection optical system PL to be measured on body (that is, in a state where projection optical system PL is already assembled into the exposure apparatus). The measuring method of wavefront aberration using wavefront aberration measuring unit 80 will be described later in the description.

Referring back to FIG. 1, in exposure apparatus 100 in the embodiment, a multiple point focus position detection system based on an oblique incident method (hereinafter simply referred to as a 'focus position detection system') is provided. The system is made up of an irradiation system 60*a*, which has a light source whose on/off operation is controlled by main controller 50 and irradiates an imaging beam toward the image forming plane of projection optical system PL from an oblique direction against the optical axis AX for forming multiple pinholes or slit images, and a photodetection optical system 60*b* that receives the reflection beams of the imaging beam reflected off the surface of wafer W. Details on a multiple point focus position detection system that has a structure similar to that of the focus position detection system (60*a* and 60*b*) in the embodiment are disclosed in, for example, Japanese Patent Application No. H06-283403, and the corresponding U.S. Pat. No. 5,448,332. As long as the national laws in designated states or elected states, to which this international application is applied, permit, the disclosures of the above publication and the above U.S. patent are incorporated herein by reference.

The multiple point focus position detection system disclosed in the above publication and above U.S. patent not only detects the positional information of wafer W at least in the direction parallel to optical axis AX of projection optical system PL (the Z-axis direction) at a plurality of points set apart in the non-scanning direction within exposure area IA, but also has the function of predicting the unevenness of wafer W in the scanning direction. Such functions, however, is not necessarily required, and the beam irradiated by irradiation system 60*a* may be shaped into other shapes such as a parallelogram.

On scanning exposure or the like, main controller 50 performs auto-focusing (automatic focusing) and auto-leveling based on defocus signals such as S-curve signals from photodetection optical system 60*b* so that the defocus becomes zero or within the depth of focus, by controlling the Z position and the inclination with respect to the XY plane of wafer W via the wafer stage drive section (not shown). In addition, when wavefront aberration is measured in the manner that will be described later in the description, main controller 50 measures and aligns the Z position of wavefront aberration measuring unit 80 using the focus position detection system (60*a* and 60*b*). Upon this operation, the inclination of wavefront aberration measuring unit 80 may also be measured if necessary.

Furthermore, exposure apparatus 100 comprises alignment system ALG based on an off-axis method that is used for measuring the alignment marks on wafer W held on wafer stage WST and the position of the reference marks formed on fiducial mark plate FM. As alignment system ALG, a sensor of an FIA (Field Image Alignment) system based on an image processing method is used that uses an image pickup device (such as a CCD) to pick up images of a subject mark on a photodetection surface formed by irradiating a broadband detection beam on the subject mark so that the mark will not be exposed and outputs the pick-up signals. Besides the FIA system, a sensor that detects scattered light or diffracted light generated from a subject mark when the subject mark is irradiated with a coherent detection beam, or a sensor that a light of two diffracted lights (such as in the same order) generated from the subject mark and made to interfere with each other can be used independently, or in a combined arrangement.

Furthermore, although it is omitted in the drawings, in exposure apparatus 100 in the embodiment, above reticle R, a pair of reticle alignment systems is provided, which is made up of a TTR (Through The Reticle) alignment system that uses light of the exposure wavelength in order to observe reticle marks formed on reticle R and the corresponding reference marks on the fiducial mark plate at the same time via projection optical system PL. In the embodiment, as such reticle alignment systems, units having the same structure as the ones disclosed in, for example, Japanese Patent Application Laid-open No. H07-176468 and its corresponding U.S. Pat. No. 5,646,413 are used. As long as the national laws in designated states or elected states, to which this international application is applied, permit, the disclosures of the above publication and the above U.S. patent are incorporated herein by reference.

In FIG. 1, the control system is mainly composed of main controller 50. Main controller 50 is made up of a so-called workstation (or a microcomputer) comprising a CPU (Central Processing Unit), ROM (Read Only Memory), RAM (Random Access Memory), or the like, and other than performing various controls that are previously described, also controls the overall operation of the apparatus. For example, main controller 50 controls the overall operation such as the stepping of wafer stage WST in between shots and the exposure timing so that exposure operations are appropriately performed.

In addition, for example, a storage unit 42 made up of a hard disk, an input unit 45 comprising a keyboard and a pointing-device such as a mouse, and a display unit 44 such as a CRT display (or liquid-crystal display) connects to main controller 50. In addition, a computer 46 for simulation such as a workstation or a personal computer connects to main controller 50 through a communication network such as a LAN. In simulation computer 46, an image forming simulation software in which an optical model of exposure apparatus 100 is set, that is, an image forming simulator, is installed.

Next, a measuring method of wavefront aberration in exposure apparatus 100 performed during maintenance or the like will be described. In the following description, for the sake of simplicity, the aberration of photodetection optical system 84 in wavefront aberration measuring unit 80 is to be small enough to be ignored.

During normal exposure, because wavefront aberration measuring unit 80 is detached from wafer stage WST, on measuring wavefront aberration, first of all, the operator or the service technician or the like (hereinafter referred to as 'operator or the like' as appropriate) attaches wavefront aberration measuring unit 80 onto the side surface of wafer stage WST. In this operation, wavefront aberration measuring unit 80 is fixed onto a predetermined reference surface (in this case, the surface on the +Y side) via a bolt or a magnet or the like, so that when wavefront is measured, wavefront aberration measuring unit 80 is within the movement strokes of wafer stage WST.

When the above attachment is completed, in response to a command to start measurement input by the operator or the like, main controller 50 moves wafer stage WST via the wafer stage drive section (not shown) so that wavefront aberration measuring unit 80 is positioned under alignment system ALG. Then, main controller 50 makes alignment system ALG detect the alignment marks (not shown) provided in wavefront aberration measuring unit 80, and based on the detection results and the measurement values of wafer interferometer 54W at that point, main controller 50 calculates the position coordinates of the alignment marks and obtains the accurate position of wavefront aberration measuring unit 80. When the position of wavefront aberration measuring unit 80 has been measured, then main controller 50 measures wavefront aberration in the manner described below.

First of all, main controller 50 loads a measurement reticle (not shown) (hereinafter referred to as a 'pinhole reticle') on which pinhole patterns are formed onto reticle stage RST using a reticle loader (not shown). The pinhole reticle is a reticle on which pinholes (pinholes that become substantially ideal point light sources and generate spherical waves) are formed on its pattern surface at a plurality of points. When, for example, the pinhole reticle is set so that its center coincides with optical axis AX of projection optical system PL, the plurality of pinholes are arranged within illumination area IAR, and their projected images are also formed at the plurality of points within the field of projection optical system PL where wavefront aberration is to be measured (the $1^{st}$ measurement point to the $n^{th}$ measurement point that will be described later).

In the pinhole reticle used in this case, by making the distribution of light from the pinhole patterns cover substantially the whole pupil plane, for example, by providing a diffusing surface on its upper surface, the wavefront aberration can be measured on the entire pupil plane of projection optical system PL. In the embodiment, since pupil aperture stop 15 is provided in the vicinity of the pupil plane of projection optical system PL, the wavefront aberration will actually be measured on the pupil plane set by pupil aperture stop 15.

After the pinhole reticle has been loaded, main controller 50 detects the reticle alignment marks formed on the pinhole reticle using the reticle alignment system, and based on the detection results, aligns the pinhole reticle at a predetermined position. With this operation, the center of the pinhole reticle substantially coincides with the optical axis of projection optical system PL.

Then, main controller 50 sends control information TS to light source 16 to start emission of laser beam LB. With this operation, illumination light EL from illumination optical system 12 irradiates the pinhole reticle. The lights outgoing from the plurality of pinholes of the pinhole reticle then condense on the image plane via projection optical system PL and form images of the pinholes on the image plane.

Next, main controller 50 moves wafer stage WST via the wafer stage drive section (not shown) while monitoring the measurement values of wafer interferometer 54W, so that an image forming point where an image of a pinhole of the pinhole reticle (hereinafter referred to as the 'focused pinhole') is formed substantially coincides with the center of opening 82a in wavefront aberration measuring unit 80. When performing such an operation, main controller 50 finely moves wafer stage WST in the Z-axis direction via the wafer stage drive section (not shown) based on the detection results of focus position detection system (60a and 60b), so as to make the upper surface of cover glass 88 in wavefront aberration measuring unit 80 coincide with the image plane where the pinhole image is formed. In this case, the angle of inclination of wafer stage WST is also adjusted if necessary. With the above operations, the imaging beams of the focused pinhole enters photodetection optical system 84 via the opening in the center of cover glass 88, and is received by the photodetection elements that make up photodetection portion 86.

More particularly, the focused pinhole on the pinhole reticle generates spherical waves, which become parallel beams that irradiate microlens array 84e, via projection optical system PL and objective lens 84a, relay lens 84b, mirror 84c, and collimator lens 84d that make up photodetection optical system 84 of wavefront aberration measuring unit 80. When the parallel beams irradiate microlens array 84e, the pupil plane of projection optical system PL is relayed and divided by microlens array 84e. Each lens element of microlens array 84e condenses the lights (divided light) on the photodetection surface of the photodetection element, and the images of the pinhole are each formed on the photodetection surface.

Figure 3A:
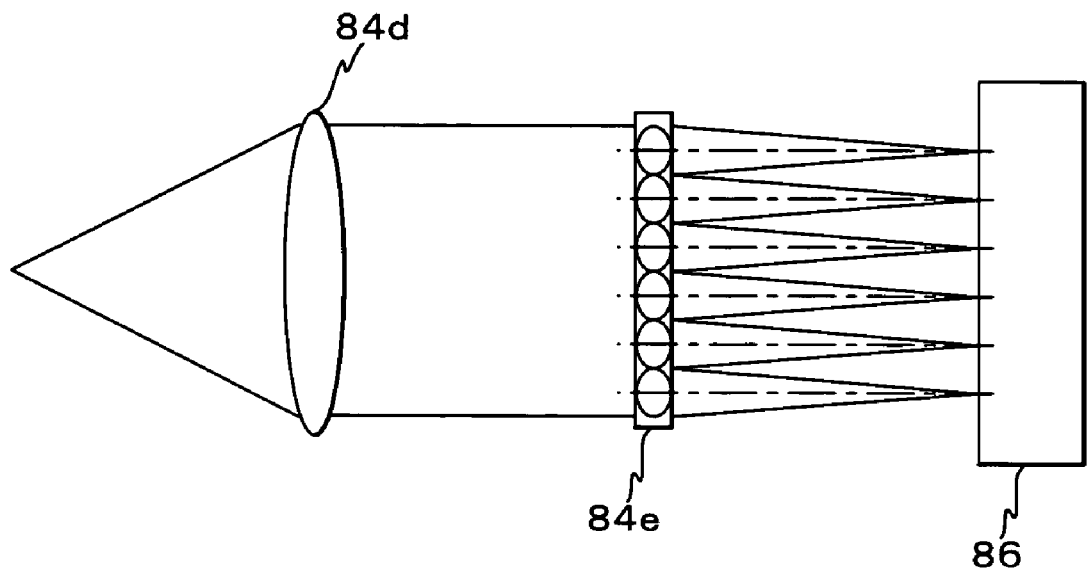
FIG. 3A is a view of beams outgoing from a microlens array in the case there is no aberration in an optical system.

In this case, when projection optical system PL is an ideal optical system that does not have any wavefront aberration, the wavefront in the pupil plane of projection optical system PL becomes an ideal shape (in this case, a planar surface), and as a consequence, the parallel beams entering microlens array 84e is supposed to be a plane wave that has an ideal wavefront. In this case, as is shown in FIG. 3A, a spot image (hereinafter also referred to as a 'spot') is formed at a position on the optical axis of each lens element that make up microlens array 84e.

Figure 3B:
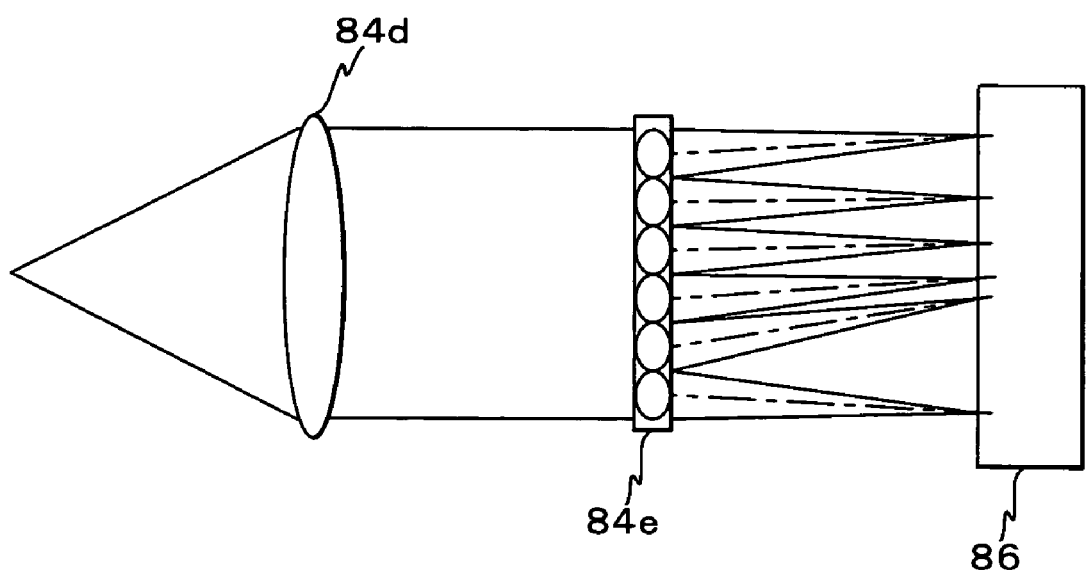
FIG. 3B is a view of beams outgoing from the microlens array in the case there is aberration in the optical system.

However, because projection optical system PL normally has wavefront aberration, the wavefront of the parallel beams incident on microlens array 84e deviates from the ideal wavefront, and corresponding to the deviation, that is, the inclination of the wavefront with respect to the ideal wavefront, the image forming position of each spot deviates from the position on the optical axis of each lens element of microlens array 84e, as is shown in FIG. 3B. In this case, the positional deviation of each spot from its reference point (the position on the optical axis of each lens element) corresponds to the inclination of the wavefront.

Then, the lights incident on each of the condensing points on the photodetection element making up photodetection portion 86 (beams of the spot images) are photoelectrically converted at the photodetection element, and the photoelectric conversion signals are sent to main controller 50 via the electric circuit. Based on the photodetection conversion signals, main controller 50 calculates the image forming position of each spot, and furthermore, calculates the positional deviation ($\Delta\xi$, $\Delta\eta$) using the calculation results and the positional data of the known reference points, and stores it in the RAM. During such operation, the measurement values of wafer interferometer 54W at the above point ($X_i$, $Y_i$) are sent to main controller 50.

When measurement of positional deviation of the spot images by wavefront aberration measuring unit 80 at the image forming point of the focused pinhole image is completed in the manner described above, main controller 50 moves wafer stage WST so that the substantial center of opening 82a of wavefront aberration measuring unit 80 coincides with the image forming point of the next pinhole image. When this movement is completed, main controller 50 makes light source 16 generate laser beam LB as is previously described, and similarly calculates the image forming position of each spot. Hereinafter, a similar measurement is sequentially performed at the image forming point of other pinhole images.

At the point where all the necessary measurements have been completed in the manner described above, the data on positional deviation ($\Delta\xi$, $\Delta\eta$) of each pinhole image at the image forming point previously described and the coordinate data of each image forming point (the measurement values of wafer interferometer 54W ($X_i$, $Y_i$) when performing measurement the image forming point of each pinhole image) is stored in the RAM of main controller 50. During the above measurement, illumination light EL may be irradiated on all the pinholes at the same time, or, for example, the position and size of the illumination area on the reticle per pinhole can be changed using reticle blind 30B, so that only the focused pinhole on the reticle or only the area including the focused pinhole is illuminated by illumination light EL.

Next, main controller 50 calculates the wavefront (wavefront aberration) corresponding to the image forming point of the pinhole images according to the following principle, that is, the wavefront corresponding to each of the measurement points from the $1^{st}$ measurement point to the $n^{th}$ measurement point within the field of projection optical system PL, in this case, the coefficients of each term in the Fringe Zernike polynomial (hereinafter simply referred to appropriately as 'Zernike polynomial') in equation (3) (to be described later in the description) such as coefficient $Z_1$ of the $1^{st}$ term up to coefficient $Z_{37}$ of the $37^{th}$ term are calculated according to a conversion program, based on the positional deviation data ($\Delta\xi$, $\Delta\eta$) for the image forming point of each pinhole images stored in the RAM and the coordinate data for each image forming point. In the embodiment, the following description will be made picking up the Fringe Zernike polynomial as the Zernike polynomial.

In the embodiment, the wavefront of projection optical system PL is obtained by calculation according to the conversion program, based on the above positional deviations ($\Delta\xi$, $\Delta\eta$). That is, positional deviations ($\Delta\xi$, $\Delta\eta$) are values that reflect the gradient of the wavefront with respect to an ideal wavefront, which on the contrary means that the wavefront can be reproduced based on the positional deviation ($\Delta\xi$, $\Delta\eta$). As is obvious from the above physical relation between the positional deviations ($\Delta\xi$, $\Delta\eta$) and the wavefront, the principle of this embodiment for calculating the wavefront is the known Shack-Hartmann wavefront calculation principle.

Next, the method of calculating the wavefront based on the above positional deviations will be briefly described.

As is described above, the positional deviations ($\Delta\xi$, $\Delta\eta$) correspond to the gradient of the wavefront, and by integrating them the shape of the wavefront (or to be more precise, deviations from the reference plane (the ideal wavefront)) is obtained. When the wavefront (deviations from the reference plane) is expressed as W(x,y) and the proportional coefficient is expressed as k, then the relation in the following equations (1) and (2) exist.

$$\Delta\xi = k\frac{\partial W}{\partial x} \quad (1)$$

$$\Delta\eta = k\frac{\partial W}{\partial y} \quad (2)$$

Because it is not easy to integrate the gradient of the wavefront given only at spot positions, the surface shape is expanded in series so that it fits the wavefront. In this case, an orthogonal system is to be chosen for the series. The Zernike polynomial is a series suitable for expansion of an axially opposite surface, expanding in a trigonometric series in the circumferential direction. That is, when wavefront W is expressed using a polar coordinate system ($\rho$, $\theta$), it can be expanded as in equation (3).

$$W(\rho, \theta) = \sum_i Z_i f_i(\rho, \theta) \quad (3)$$

Because the system is an orthogonal system, coefficient $Z_i$ of each term can be decided independently. Cutting off $_i$ at a suitable value corresponds to performing a kind of filtering. Table 1 is an example showing the value $f_i(\rho,\theta)$ (a radial polynomial, with $\rho$ serving as the independent variable) from the $1^{st}$ term up to the $37^{th}$ term, along with its coefficient $Z_i$. In the actual Zernike polynomial, however, the $37^{th}$ term in Table 1 corresponds to the $49^{th}$ term, but in this description, it will be handled as i=37 (the $37^{th}$ term). That is, in the invention, the number of terms in the Zernike polynomial is not limited in particular.

TABLE 1

| $Z_i$ | $f_i$ |
|---|---|
| $Z_1$ | 1 |
| $Z_2$ | $\rho \cos\theta$ |
| $Z_3$ | $\rho \sin\theta$ |
| $Z_4$ | $2\rho^2 - 1$ |
| $Z_5$ | $\rho^2 \cos 2\theta$ |
| $Z_6$ | $\rho^2 \sin 2\theta$ |
| $Z_7$ | $(3\rho^3 - 2\rho) \cos\theta$ |
| $Z_8$ | $(3\rho^3 - 2\rho) \sin\theta$ |
| $Z_9$ | $6\rho^4 - 6\rho^2 + 1$ |
| $Z_{10}$ | $\rho^3 \cos 3\theta$ |
| $Z_{11}$ | $\rho^3 \sin 3\theta$ |
| $Z_{12}$ | $(4\rho^4 - 3\rho^2) \cos 2\theta$ |
| $Z_{13}$ | $(4\rho^4 - 3\rho^2) \sin 2\theta$ |
| $Z_{14}$ | $(10\rho^5 - 12\rho^3 + 3\rho) \cos\theta$ |
| $Z_{15}$ | $(10\rho^5 - 12\rho^3 + 3\rho) \sin\theta$ |
| $Z_{16}$ | $20\rho^6 - 30\rho^4 + 12\rho^2 - 1$ |
| $Z_{17}$ | $\rho^4 \cos 4\theta$ |
| $Z_{18}$ | $\rho^4 \sin 4\theta$ |

TABLE 1-continued

| $Z_i$ | $f_i$ |
|---|---|
| $Z_{19}$ | $(5\rho^5 - 4\rho^3) \cos 3\theta$ |
| $Z_{20}$ | $(5\rho^5 - 4\rho^3) \sin 3\theta$ |
| $Z_{21}$ | $(15\rho^6 - 20\rho^4 + 6\rho^2) \cos 2\theta$ |
| $Z_{22}$ | $(15\rho^6 - 20\rho^4 + 6\rho^2) \sin 2\theta$ |
| $Z_{23}$ | $(35\rho^7 - 60\rho^5 + 30\rho^3 - 4\rho) \cos \theta$ |
| $Z_{24}$ | $(35\rho^7 - 60\rho^5 + 30\rho^3 - 4\rho) \sin \theta$ |
| $Z_{25}$ | $70\rho^8 - 140\rho^6 + 90\rho^4 - 20\rho^2 + 1$ |
| $Z_{26}$ | $\rho^5 \cos 5\theta$ |
| $Z_{27}$ | $\rho^5 \sin 5\theta$ |
| $Z_{28}$ | $(6\rho^6 - 5\rho^4) \cos 4\theta$ |
| $Z_{29}$ | $(6\rho^6 - 5\rho^4) \sin 4\theta$ |
| $Z_{30}$ | $(21\rho^7 - 30\rho^5 + 10\rho^3) \cos 3\theta$ |
| $Z_{31}$ | $(21\rho^7 - 30\rho^5 + 10\rho^3) \sin 3\theta$ |
| $Z_{32}$ | $(56\rho^8 - 105\rho^6 + 60\rho^4 - 10\rho^2) \cos 2\theta$ |
| $Z_{33}$ | $(56\rho^8 - 105\rho^6 + 60\rho^4 - 10\rho^2) \sin 2\theta$ |
| $Z_{34}$ | $(126\rho^9 - 280\rho^7 + 210\rho^5 - 60\rho^3 + 5\rho) \cos \theta$ |
| $Z_{35}$ | $(126\rho^9 - 280\rho^7 + 210\rho^5 - 60\rho^3 + 5\rho) \sin \theta$ |
| $Z_{36}$ | $252\rho^{10} - 630\rho^8 + 560\rho^6 - 210\rho^4 + 30\rho^2 - 1$ |
| $Z_{37}$ | $924\rho^{12} - 2772\rho^{10} + 3150\rho^8 - 1680\rho^6 + 420\rho^4 - 42\rho^2 + 1$ |

In actual, the differential is detected as the above positional deviations, therefore, the fitting needs to be performed on the derivatives. In the polar coordinate system ($x=\rho \cos \theta$, $y=\rho \sin \theta$), they are expressed as in the following equations (4) and (5).

$$\frac{\partial W}{\partial x} = \frac{\partial W}{\partial \rho} \cos\theta - \frac{1}{\rho} \frac{\partial W}{\partial \theta} \sin\theta \quad (4)$$

$$\frac{\partial W}{\partial y} = \frac{\partial W}{\partial \rho} \sin\theta + \frac{1}{\rho} \frac{\partial W}{\partial \theta} \cos\theta \quad (5)$$

Because the differential of the Zernike polynomial is not an orthogonal system, the fitting needs to be performed in the least squares method. The information on the image forming point of an spot image (the deviation amount) is given for the X direction and the Y direction, therefore, when the number of pinholes is set as n (n corresponds to the number of measurement points (evaluation points) within the field of projection optical system PL, and in the embodiment, for the sake of simplicity, n is, for example, 33), the number of the observation equations that will be given in the above equations (1) to (5) are 2n (=66).

Each term of the Zernike polynomial corresponds to an optical aberration. Moreover, the low order terms (the terms whose value $i$ is small) substantially corresponds to the Seidel aberrations. So, by using the Zernike polynomial, the wavefront aberration of projection optical system PL can be obtained.

The calculation procedure of the conversion program is decided according to the principle described above, and by the calculation process according to the conversion program, information on the wavefront (wavefront aberration) corresponding to each of the measurement points from the 1$^{st}$ measurement point to the n$^{th}$ measurement point within the field of projection optical system PL is obtained, which is in this case, the coefficients of each term of the Zernike polynomial, such as the coefficient $Z_1$ of the 1$^{st}$ term to the coefficient $Z_{37}$ of the 37$^{th}$ term.

In storage unit 42, database of a wavefront aberration variation table of projection optical system PL is stored. In this case, the wavefront aberration variation table is a variation table, which is composed of data groups that are arranged according to a predetermined rule. The data in the data groups are the results that are obtained by performing simulation using a model substantially equivalent to projection optical system PL, and they show a relation between the change in a unit adjustment amount of an adjustment parameter that can be used to optimize the state of the projected image of the pattern formed on the wafer and the image forming quality corresponding to each of the plurality of measurement points within the field of projection optical system PL, or to be more specific, wavefront data, such as the variation amount of the coefficients of the Zernike polynomial from the 1$^{st}$ term to the 37$^{th}$ term.

In the embodiment, as the above adjustment parameters, a total of 19 parameters are used: $z_1$, $\theta x_1$, $\theta y_1$, $z_2$, $\theta x_2$, $\theta y_2$, $z_3$, $\theta x_3$, $\theta y_3$, $z_4$, $\theta x_4$, $\theta y_4$, $z_5$, $\theta x_5$, and $\theta y_5$, which are the drive amount of movable lenses $13_1$, $13_2$, $13_3$, $13_4$, and $13_5$ in directions of each degree of freedom (drivable direction); Wz, W$\theta$x, and W$\theta$y, which are the drive amount of the surface of wafer W (wafer stage WST) in directions of three degrees of freedom; and $\Delta\lambda$, which is the shift amount of the wavelength of exposure light EL.

The procedure of making the database of the above wavefront aberration variation table will now be briefly described. First of all, optical conditions of exposure apparatus 100 (for example, designed values of projection optical system PL (such as numerical aperture N.A. and each lens data), coherence factor value σ (illumination σ) or numerical aperture N.A. of the illumination optical system, and wavelength λ of illumination light EL) are input into a simulation computer where specific optical software is installed. Next, data at the first measurement point somewhere within the field of projection optical system PL is input into simulation computer 46.

Next, unit quantity data on the shift amount is input for movable lenses $13_1$ to $13_5$ in directions of each degree of freedom (movable directions), the surface of wafer W in the above degrees of freedom, and the illumination wavelength. For example, when instructions are input to drive movable lens $13_1$ by only a unit quantity in a + direction in a Z direction shift, simulation computer 46 calculates the variation amount data of a first wavefront from the ideal wavefront at a first measurement point decided in advance within the field of projection optical system PL, such as the variation amount of the coefficients of each of the terms in the Zernike polynomial (for example, from the 1$^{st}$ term to the 37$^{th}$ term), and the variation amount data is shown on the screen of simulation computer 46, as well as stored in memory as parameter PARA1P1.

Next, when instructions are input to drive movable lens $13_1$ by a only unit quantity in a + direction in a Y direction tilt (rotation $\theta$x around the X-axis), simulation computer 46 calculates the data of a second wavefront at the first measurement point, such as the variation amount of the coefficients of the above terms in the Zernike polynomial, and the variation data is shown on the screen of the above display, and is also stored in memory as parameter PARA2P1.

Then, when instructions are input to drive movable lens $13_1$ by a only unit quantity in a + direction in an X direction tilt (rotation $\theta$y around the Y-axis), simulation computer 46 calculates the data of a third wavefront at the first measurement point, such as the variation amount of the coefficients of the above terms in the Zernike polynomial, and the variation data is shown on the screen of the above display, and is also stored in memory as parameter PARA3P1.

Hereinafter, in the same procedure as in the above description, the input for each measurement point from the 2$^{nd}$ measurement point to the n$^{th}$ measurement point is performed, and each time instructions are input to drive movable lens $13_1$ in a Z direction shift, a Y direction tilt, or an X direction tilt, simulation computer 46 calculates the data of a first, a second, and a third wavefront at each measurement point, such as the variation of the coefficients of the above terms in the Zernike polynomial, and the variation data is shown on the screen of the display, and is also stored in memory as parameters PARA1P2, PARA2P2, PARA3P2, ..., PARA1Pn, PARA2Pn, and PARA3Pn.

The input for each measurement point and instructions to drive the movable lens in by only a unit quantity in the + direction in directions of each degree of freedom are performed also on other movable lenses $13_2$, $13_3$, $13_4$, and $13_5$, in the same procedure as in the above description, and in response simulation computer 46 calculates the data of the wavefront at each of the $1^{st}$ measurement point to the $n_{th}$ measurement point for movable lenses $13_2$, $13_3$, $13_4$, and $13_5$, such as the variation amount of the coefficients of the above terms in the Zernike polynomial, and parameter (PARA4P1, PARA5P1, PARA6P1, ..., PARA15P1), parameter (PARA4P2, PARA5P2, PARA6P2, ..., PARA15P2), ..., and parameter (PARA4Pn, PARA5Pn, PARA6Pn, ..., PARA15Pn) are stored in memory.

In addition, in the same procedure as in the above description, input for each measurement point and instructions input for driving wafer W by only a unit quantity in the + direction in directions of each degree of freedom are also performed, and in response simulation computer 46 calculates the data of the wavefront at each of the $1^{st}$ measurement point to the $n^{th}$ measurement point when wafer W is driven only by a unit quantity in directions of each degree of freedom, that is, in the Z, θx, and θy directions, such as the variation amount of the coefficients of the terms in the Zernike polynomial, and parameter (PARA1P1, PARA17P1, PARA18P1), parameter (PARA16P2, PARA17P2, PARA18P2), ..., and parameter (PARA16Pn, PARA17Pn, PARA18Pn) are stored in memory.

Furthermore, regarding wavelength shift, input for each measurement point and instructions to shift the wavelength by only a unit quantity in the + direction are also performed in the same procedure as in the above description, and in response the simulation computer calculates the data of the wavefront at each of the $1^{st}$ measurement point to the $n^{th}$ measurement point when the wavelength is shifted in the +direction only by a unit quantity, such as the variation amount of the coefficients of the terms in the Zernike polynomial, and PARA19P1, PARA19P2, ..., and PARA19Pn are stored in memory.

Each of the above parameters PARAiPj (i=1 to 19, j=1 to n) is a column-matrix (column vector) of 37 rows and 1 column. That is, when n=33, an adjustment parameter PARA1 can be expressed as in the following equation, (6). Parameter PARAiPj are all column-matrices, however, in equation (6) and the following equations, they are expressed as if they were row-matrices for the sake of simplicity.

$$\left.\begin{array}{l}PARA1P1 = [\, Z_{1,1} \quad Z_{1,2} \quad \cdots \quad Z_{1,37}\,] \\ PARA1P2 = [\, Z_{2,1} \quad Z_{2,2} \quad \cdots \quad Z_{2,37}\,] \\ \vdots \\ PARA1Pn = [\, Z_{33,1} \quad Z_{33,2} \quad \cdots \quad Z_{33,37}\,]\end{array}\right\} \quad (6)$$

In addition, an adjustment parameter PARA2 can be expressed in the following equation, (7).

$$\left.\begin{array}{l}PARA2P1 = [\, Z_{1,1} \quad Z_{1,2} \quad \cdots \quad Z_{1,37}\,] \\ PARA2P2 = [\, Z_{2,1} \quad Z_{2,2} \quad \cdots \quad Z_{2,37}\,] \\ \vdots \\ PARA2Pn = [\, Z_{33,1} \quad Z_{33,2} \quad \cdots \quad Z_{33,37}\,]\end{array}\right\} \quad (7)$$

Similarly, the other adjustment parameters PARA3 to PARA19 can be expressed as in the following equation, (8).

$$\left.\begin{array}{l}PARA3P1 = [\, Z_{1,1} \quad Z_{1,2} \quad \cdots \quad Z_{1,37}\,] \\ PARA3P2 = [\, Z_{2,1} \quad Z_{2,2} \quad \cdots \quad Z_{2,37}\,] \\ \vdots \\ PARA3Pn = [\, Z_{33,1} \quad Z_{33,2} \quad \cdots \quad Z_{33,37}\,] \\ \vdots \\ PARA19P1 = [\, Z_{1,1} \quad Z_{1,2} \quad \cdots \quad Z_{1,37}\,] \\ PARA19P2 = [\, Z_{2,1} \quad Z_{2,2} \quad \cdots \quad Z_{2,37}\,] \\ \vdots \\ PARA19Pn = [\, Z_{33,1} \quad Z_{33,2} \quad \cdots \quad Z_{33,37}\,]\end{array}\right\} \quad (8)$$

Then, column-matrices (column vectors) PARA1P1 to PARA19Pn, which are composed of the variation amount of the coefficients of each of the Zernike polynomial that are stored in memory, are grouped by each adjustment parameter and then sorted into a wavefront aberration variation table for each of the 19 adjustment parameters. As a consequence, matrix O whose elements are the column-matrices (column vectors) PARA1P1 to PARA19Pn expressed as in equation (9) below is made. In equation (9), m=19.

$$O = \begin{bmatrix} PARA1P1 & PARA2P1 & \ldots & \ldots & PARAmP1 \\ PARA1P2 & PARA2P2 & \ldots & \ldots & PARAmP2 \\ \vdots & \vdots & & & \vdots \\ \vdots & \vdots & & & \vdots \\ PARA1Pn & PARA2Pn & \ldots & \ldots & PARAmPn \end{bmatrix} \quad (9)$$

And, the database consisting of the wavefront aberration variation table of projection optical system PL made in the manner above is stored in storage unit 42.

Next, details on the setting method of the 19 adjustment parameters of movable lenses $13_1$ to $13_5$ in order to adjust the image forming state of the pattern image by projection optical system PL, performed during periods such as maintenance in exposure apparatus 100 in the embodiment, or in other words, the normal adjustment method of projection optical system PL, will be described, including its principle.

First of all, wavefront aberration of projection optical system PL is measured using wavefront aberration measuring unit 80 in the procedure described above. And, as the measurement results, data on wavefront (wavefront aberration) corresponding to the first measurement point (evaluation point) to the $n^{th}$ measurement point within the field of projection optical system PL, or in other words, each of the terms of the Zernike polynomial, such as from coefficient $Z_1$ of the $1^{st}$ term to coefficient $Z_{37}$ of the $37^{th}$ term, are obtained, and stored in memory in the RAM of main controller 50.

In the description below, data on wavefront (wavefront aberration) corresponding to the first measurement point (evaluation point) to the n$^{th}$ measurement point is expressed in a column-matrix Q, as in the following equation (10).

$$Q = \begin{bmatrix} P_1 \\ P_2 \\ \vdots \\ \vdots \\ P_n \end{bmatrix} \quad (10)$$

In the above equation (10), elements $P_1$ to $P_n$ of matrix Q are each a column-matrix (column vector), made up of coefficients ($Z_1$ to $Z_{37}$) of the 1$^{st}$ to 37$^{th}$ term in the Zernike polynomial.

Next, main controller 50 calculates the adjustment amount of movable lenses $13_1$ to $13_5$ in directions of each degree of freedom, the adjustment amount of wafer W in directions of each degree of freedom, and the wavelength shift amount of illumination light EL in the manner described below.

More particularly, in between data Q on wavefront (wavefront aberration) corresponding to the first measurement point (evaluation point) to the n$^{th}$ measurement point, the database (matrix O) described above, and the 19 adjustment amount P described above, the relation shown in the following equation (11) stands.

$$Q = O \cdot P \quad (11)$$

In the above equation (11), P is a column-matrix (that is, a column vector) made up of m elements, as is shown in equation (12) below, that is, 19 elements.

$$P = \begin{bmatrix} ADJ1 \\ ADJ2 \\ \vdots \\ \vdots \\ ADJm \end{bmatrix} \quad (12)$$

Accordingly, by performing the calculation in the equation below (13) with the above equation (12), that is, by performing the least squares method, each element of P, ADJ1 to ADJm, or in other words, the adjustment amount (target adjustment amount) of movable lenses $13_1$ to $13_5$ in directions of each degree of freedom, the adjustment amount (target adjustment amount) of wafer W in directions of each degree of freedom, and the wavelength shift amount (target shift amount) of illumination light EL, can be obtained.

$$P = (O^T \cdot O)^{-1} \cdot O^T \cdot Q \quad (13)$$

In the above equation (13), $O^T$ is a transposed matrix of matrix O, and $(O^T \cdot O)^{-1}$ is an inverse matrix of $(O^T \cdot O)$.

Accordingly, main controller 50 calculates adjustment amount ADJ1 to ADJm, while sequentially loading the database within storage device 42 into the RAM.

Next, according to adjustment amount ADJ1 to ADJ15 stored in storage device 42, main controller 50 gives image forming quality correction controller 48 instruction values for driving movable lenses $13_1$ to $13_5$ in directions of each degree of freedom. With this operation, image forming quality correction controller 48 controls the applied voltage to each drive element that drives movable lenses $13_1$ to $13_5$ in directions of each degree of freedom, and adjusts at least either the position or the attitude of movable lenses $13_1$ to $13_5$ at substantially the same time. And, at the same time, during the actual scanning exposure, main controller 50 gives instruction values to the wafer stage drive section (not shown) and drives wafer stage WST, so that wafer W is driven in directions of each degree of freedom, Z, θx, and θy directions in order to maintain wafer W at an attitude equal to the attitude adjusted by adjustment amounts ADJ16 to ADJ 18 at all times within exposure area IA. Furthermore, simultaneously with each of the above operations, main controller 50 gives instructions to light source 16 according to adjustment amount ADJ19 to shift the wavelength of illumination light EL. With this operation, optical properties of projection optical system PL such as distortion, curvature of field, coma, spherical aberration, and astigmatism are corrected. Regarding coma, spherical aberration, and astigmatism, high order aberration can also be corrected, as well as low order aberration.

Figure 4:
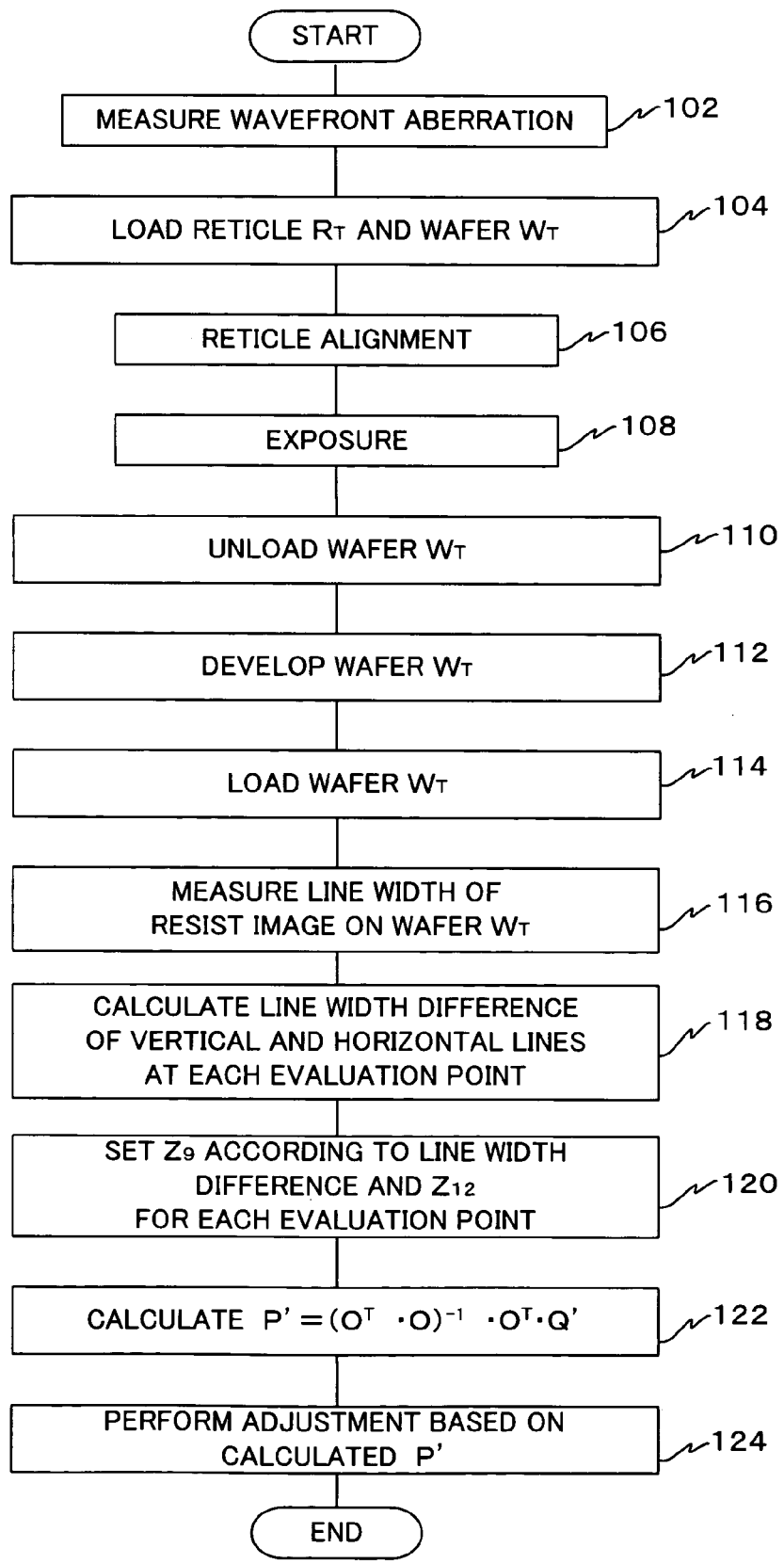
FIG. 4 is a flow chart that shows an adjustment method of projection optical system PL whose purpose is to adjust line width difference of images of line patterns orthogonal in two axial directions.

Next, an adjustment method of projection optical system PL, which is performed in exposure apparatus 100 in the embodiment and is aimed at adjusting the line width difference of line patterns orthogonal in two axial directions, is described according to a flow chart in FIG. 4 and also by appropriately referring to other drawings.

First of all, in step 102 in FIG. 4, wavefront aberration of projection optical system PL is measured using wavefront aberration measuring unit 80 in the procedure previously described, and the measurement results, that is, each of the terms in the Zernike polynomial at n (in this case, n=33) measurement points (evaluation points) within the field of projection optical system PL, such as coefficient $Z_1$ of the 1$^{st}$ term up to coefficient $Z_{37}$ of the 37$^{th}$ term, are obtained, and stored in memory such as the RAM in main controller 50.

In the next step, step 104, a measurement reticle $R_T$ (to be described later, hereinafter simply referred to as 'reticle $R_T$') is loaded onto reticle stage RST, and a measurement wafer (will be referred to as 'wafer $W_T$' for the sake of convenience) is loaded onto wafer stage WST. The reticle loader and the wafer loader (both of them not shown) perform the loading of reticle $R_T$ and wafer $W_T$, under the instructions from main controller 50.

Figure 5:
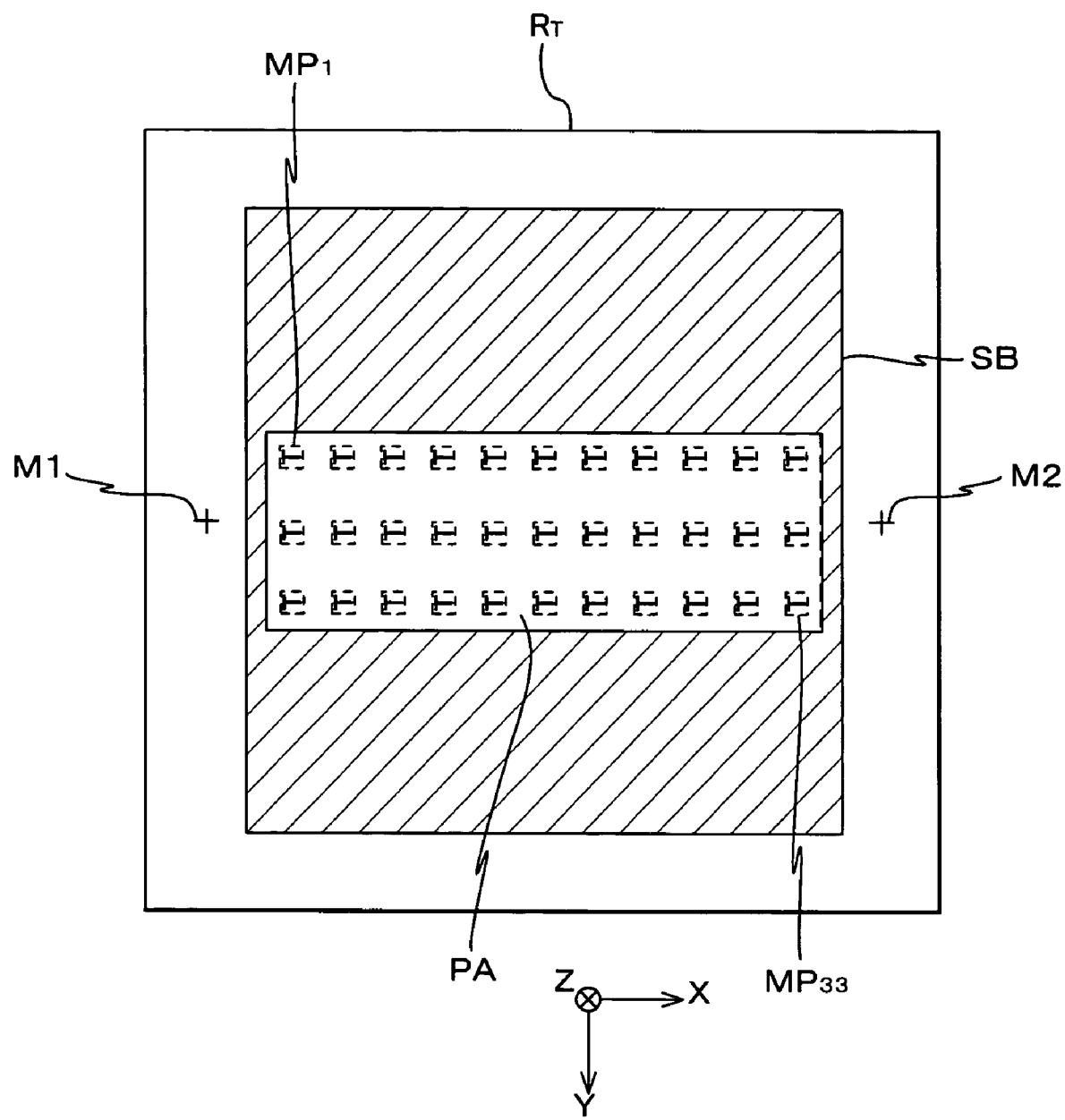
FIG. 5 is a planar view of a measurement reticle when viewed from a pattern surface side.

Reticle $R_T$ will now be described, according to FIG. 5. FIG. 5 is a planar view of reticle $R_T$ when viewed from the pattern surface side. As it can be seen from FIG. 5, reticle $R_T$ is made of a square glass substrate, and in the center of the pattern surface, a rectangular pattern area PA that substantially has the same shape as illumination area IAR is formed, enclosed by a shielding band SB. Within pattern area PA, a total of 33 measurement patterns, $MP_1$ to $MP_{33}$, are formed. The position of each measurement pattern $MP_j$ (j=1 to 33) is set so that, for example, when the center of reticle $R_T$ (pattern area PA) coincides with optical axis AX of projection optical system PL, each measurement pattern is arranged at a position corresponding to each measurement point (evaluation point) within the effective field of projection optical system PL where the wavefront aberration is measured.

As is shown in FIG. 5, each measurement pattern $MP_j$ comprises a first line pattern that extends in the Y-axis direction having a designed line width of, for example, 600 nm, and a second line pattern that extends in the X-axis direction also having a designed line width of, for example, 600 nm. When the first line pattern and the second line pattern is transferred onto the wafer with the projection magnification of projection optical system PL set at ¼, in an ideal state where there are no aberration such as spherical aberration or astigmatism in projection optical system PL, line pattern images whose line width is 150 nm are obtained as the first line pattern and the second line pattern.

In addition, reticle alignment marks M1 and M2 are formed on the X-axis that passes through the center of pattern area PA (coincides with the reticle center), on both sides outside pattern area PA. When reticle $R_T$ is loaded on reticle stage RST, the pattern surface (the surface closer to the page surface of FIG. 5) will be the surface that faces projection optical system PL.

Referring back to FIG. 4, in the next step, step 106, reticle alignment is performed. As is disclosed in detail in, for example, Japanese Patent Application Laid-open No. H07-176468 and its corresponding U.S. Pat. No. 5,646,413, in this reticle alignment, main controller 50 detects the positional deviation between reticle alignment marks M1 and M2 formed on reticle $R_T$ and their corresponding fiducial marks formed on fiducial mark plate FM on wafer stage WST using the reticle alignment detection system referred to earlier, and based on the detection results, the position of reticle stage RST within the XY plane (including the θz rotation) is adjusted so that the positional deviations are minimal. With this reticle alignment, the center of reticle $R_T$ and the optical axis of projection optical system PL substantially coincide with each other.

In the next step, step 108, each measurement pattern $MP_j$ of reticle $R_T$ arranged within illumination area IAR is transferred onto wafer $W_T$ under predetermined illumination conditions via projection optical system PL, with reticle stage RST and wafer stage WST in a static state, and the image (latent image) of measurement pattern $MP_j$ within pattern area PA is formed on the positive resist layer coated on the surface of wafer $W_T$. In prior to transferring pattern area PA formed on reticle $R_T$, main controller 50 finely drives wafer stage WST in the Z-axis direction via wafer stage drive section (not shown) so that the surface of wafer $W_T$ coincides with the image plane where the images of measurement patterns $MP_j$ are formed, based on the detection results of the focus position detection system (60a and 60b), and also adjusts the angle of inclination of wafer state WST if necessary. As a matter of course, wafer stage WST can be stepped, and pattern area PA of reticle $R_T$ may be sequentially transferred onto a plurality of areas on wafer $W_T$.

In the next step, step 110, the above wafer $W_T$ on which measurement pattern $MP_j$ is transferred is unloaded from wafer stage WST according to instructions from main controller 50, and it is delivered to a resist coater/developer (not shown) connected inline to exposure apparatus 100 by a carrier system (not shown).

In the next step, step 112, main controller 50 gives instructions to the control system of the coater/developer (not shown), and based on the instructions, the coater/developer forms a resist image of measurement pattern MPj on wafer $W_T$.

In the next step, step 114, wafer $W_T$ that has been developed is loaded onto wafer stage WST again, in the manner previously described.

In the next step, step 116, the line width of the resist image of measurement pattern $MP_j$ on wafer $W_T$ is measured. As an example, main controller 50 performs this line width measurement by sequentially picking up a resist image of at least one measurement pattern $MP_j$ on wafer $W_T$ using alignment system ALG, while moving wafer stage WST within the XY plane, and performing a predetermined processing (including calculation) based on the imaging signals obtained by the above imaging. As a consequence, for each evaluation point (measurement point) of projection optical system PL, that is, for each measurement pattern $MP_j$, a first line width L1, which is the line width of the image of the first line pattern (in this case, a resist image), and a second line width L2, which is the line width of the image of the second line pattern (in this case, a resist image), are obtained, which are stored in memory such as the RAM.

In the next step, step 118, based on line width L1 and line width L2 of each measurement pattern $MP_j$ obtained above, main controller 50 obtains line width difference $\Delta L = L1 - L2$ for each measurement pattern $MP_j$, and stores the data in memory such as the RAM.

In the case the transfer of measurement pattern $MP_j$ and formation of the resist image described above have been performed on a plurality of areas on wafer $W_T$, the above line width measurement and line width difference calculation are preformed for each of the plurality of areas. In this case, for example, the simple average value of the line width difference obtained from each measurement pattern $MP_j$ in each of the plurality of areas may be set as the line width difference for each measurement pattern $MP_j$. In such a case, measurement error is reduced due to the averaging effect, and the line width difference (that is, the difference in the line width of the image of the first line pattern (vertical line pattern) and the line width of the image of the second line pattern (horizontal line pattern)(hereinafter also referred to as 'line width difference of vertical and horizontal lines')) can be accurately obtained for each measurement pattern $MP_j$.

In the next step, step 120, coefficient $Z_9$ of the $9^{th}$ term is set per each evaluation point, according to line width difference of vertical and horizontal lines $\Delta L$ and the value (amount) of coefficient $Z_{12}$ of the $12^{th}$ term in the Zernike polynomial.

In this case, at all evaluation points, coefficient $Z_{12}$ of the $12^{th}$ term obtained as measurement results when measuring wavefront aberration is not zero, that is, all evaluation points are to have a high order astigmatism, which is expressed as a fourth order (the degree of ρ is the fourth order) cos2θ component in Table 1. As is shown in the simulation results in FIG. 6, when $Z_{12}$ is zero, that is, when $Z_{12}=0$ mλ, wavefront within the pupil plane has similar patterns in all directions, regardless of the amount of coefficient $Z_9$, which is the fourth order 0θ component. This is obvious from the fact that when $Z_{12}=0$, or in other words, in the figures shown in the upper half of FIG. 6 (FIGS. 6A to 6C), all figures show a contour line drawing consisting of a plurality of concentric circles.

That is, when $Z_{12}$ is zero, it is difficult to control (adjust) the line width difference of vertical and horizontal lines, which is the purpose in this case. Therefore, coefficient $Z_{12}$ of the $12^{th}$ term obtained as measurement results when measuring wavefront aberration has not been set as zero for all the evaluation points. In the actual projection optical system, because coefficient $Z_{12}$ of the $12^{th}$ term in the Zernike polynomial, which is the expansion of wavefront aberration, is usually not zero at any evaluation point within the field, it can be said that such a premise is in line with the actual situation.

In addition, in the embodiment, setting coefficient $Z_9$ of the $9^{th}$ term refers to the processing described below.

More precisely, target values $r_1, r_2, \ldots, r_n$ (n=33) of the variation amount of coefficient $Z_9$ of the $9^{th}$ term are calculated (the basis of the calculation method will be described later in the description) by performing a predetermined calculation, according to line width difference of vertical and horizontal lines $\Delta L$ and the value (amount) of coefficient $Z_{12}$ of the $12^{th}$ term in the Zernike polynomial, and wavefront aberration variation amount target value Q', which can be expressed as in equation (14) below where variation amount target value of other terms is set to zero, is calculated.

$$Q' = \begin{bmatrix} P'_1 \\ P'_2 \\ \vdots \\ \vdots \\ P'_{n'} \end{bmatrix} \quad (14)$$

In the above equation (14), each of the elements $P_1'$, $P_2'$, ..., to $P_n'$ (n=33) are column-matrices (column vectors) of 37 rows and one column that are expressed as in the following equations $(15_1)$, $(15_2)$, ..., $(15_n)$.

$$P'_1 = \begin{bmatrix} Z_{1,1} \\ \vdots \\ Z_{1,8} \\ Z_{1,9} \\ Z_{1,10} \\ \vdots \\ Z_{1,37} \end{bmatrix} = \begin{bmatrix} 0 \\ \vdots \\ 0 \\ r_1 \\ 0 \\ \vdots \\ 0 \end{bmatrix} \quad (15_1)$$

$$P'_2 = \begin{bmatrix} Z_{2,1} \\ \vdots \\ Z_{2,8} \\ Z_{2,9} \\ Z_{2,10} \\ \vdots \\ Z_{2,37} \end{bmatrix} = \begin{bmatrix} 0 \\ \vdots \\ 0 \\ r_2 \\ 0 \\ \vdots \\ 0 \end{bmatrix} \quad (15_2)$$

$$\vdots$$

$$P'_n = \begin{bmatrix} Z_{33,1} \\ \vdots \\ Z_{33,8} \\ Z_{33,9} \\ Z_{33,10} \\ \vdots \\ Z_{33,37} \end{bmatrix} = \begin{bmatrix} 0 \\ \vdots \\ 0 \\ r_{33} \\ 0 \\ \vdots \\ 0 \end{bmatrix} \quad (15_n)$$

As is obvious from the above equations $(15_1)$, $(15_2)$, ..., $(15_n)$, each of the elements $P_1'$, $P_2'$, ..., to $P_n'$ can be regarded as column-matrices (column vectors) of 37 rows and one column whose coefficient of the $9^{th}$ term in the Zernike polynomial is $r_j$ (j=1 to 33), and the remaining coefficients of terms other than the $9^{th}$ term are all zero at each evaluation point (measurement point)

Accordingly, the relation in equation (16) below stands, using matrix O previously described, when the adjustment amount of each adjustment parameter in this case is expressed as column-matrix P'.

$$Q' = O \cdot P' \quad (16)$$

P' in the above equation (16) is a column-matrix, which is shown in equation (17) below.

$$P' = \begin{bmatrix} ADJ1 \\ ADJ2 \\ \vdots \\ \vdots \\ ADJm \end{bmatrix} \quad (17)$$

In the next step, step 122, main controller 50 solves equation (16) by the least squares method and obtains column-matrix P' consisting of each adjustment amount. That is, main controller 50 performs the calculation in equation (18) below.

$$P' = (O^T \cdot O)^{-1} \cdot O^T \cdot Q' \quad (18)$$

In the next step, step 124, main controller 50 adjusts projection optical system PL or the like by controlling each adjustment section such as movable lenses $13_1$ to $13_5$ in the manner previously described according to P' calculated above, that is, according to adjustment amounts ADJ1 to ADJ15, and ADJ19, which concludes the series of processing in FIG. 4. Adjustment amounts ADJ16 to ADJ18 related to the position and attitude of the wafer are to be stored in the RAM or storage unit 42, because they will be used when controlling the position of wafer stage WST during scanning exposure (to be described later). And, with this operation, adjustment of wavefront aberration at the 33 evaluation points within the field of projection optical system PL, or to be more specific, adjusting projection optical system PL so that the coefficient of the $9^{th}$ term in the Zernike polynomial shifts only by $r_j$, is completed.

As a result, when the circuit pattern on reticle R that contains both vertical line (V-line) patterns and horizontal line (H-line) patterns is transferred onto wafer W using projection optical system PL that has been adjusted, the line difference between the image of such vertical line (V-line) patterns and horizontal line (H-line) patterns (line width difference of vertical and horizontal lines) is corrected so that they become closer to the designed values, such as zero.

The reason why the line width difference of vertical and horizontal lines can be corrected by the above adjustment of projection optical system PL will now be described in detail.

The lower half of the drawings in FIG. 6 (FIGS. 6D to 6F) show the variation in wavelength within the pupil plane (simulation results) according to the change in coefficient $Z_9$ of the $9^{th}$ term in the Zernike polynomial, which is the term corresponding to low order spherical aberration, when coefficient $Z_{12}$ of the $12^{th}$ term in the Zernike polynomial, which is the term corresponding to high order astigmatism, is +20 mλ ($Z_{12}$=+20 mλ). Of the drawings, FIG. 6D shows the case of $Z_9$=−20 mλ, FIG. 6E shows the case of $Z_9$=−0 mλ, and FIG. 6F shows the case of $Z_9$=+20 mλ.

As is obvious from these drawings, when the $9^{th}$ term is changed when the $12^{th}$ term component is not zero, the shape of the combined wavefront differs in the vertical direction and in the horizontal direction.

When the sign of the $12^{th}$ term is positive, the phase in the right and left side of the pupil is positive and the upper and lower side is negative, such as in the case of FIG. 6E. Meanwhile, when the sign of the $9^{th}$ term is positive, the phase in the circumferential edge of the pupil is positive, as is shown in FIG. 6C, while when the sign of the $9^{th}$ term is negative, the phase in the circumferential edge of the pupil is negative, as is shown in FIG. 6A. Accordingly, when the sign of the $12^{th}$ term is positive, if the sign of the $9^{th}$ term is also positive the phase shift is enhanced in the positive direction at the right and left side of the pupil due to the phase shift by the $12^{th}$ term and the $9^{th}$ term, however at the upper and lower side of the pupil, because the phase shift by the $12^{th}$ term is negative and the phase shift of the $9^{th}$ term is positive, the phase shift is weakened. In this case, the wavefront is greatly distorted at the horizontal direction of the pupil as is shown in, for example, FIG. 6F, while the wavefront is less distorted in the vertical direction.

Because the vertical line (V-line) pattern on the reticle contains a spatial frequency component in the lateral direction, the vertical line (V-line) pattern generates diffracted light in the horizontal direction, while the horizontal line (H-line) pattern generates diffracted light in the vertical direction due to the spatial frequency component in the longitudinal direction that the horizontal line pattern has.

Accordingly, as is described above, when the signs of the $9^{th}$ term and the $12^{th}$ term are equal (such as in the case of FIG. 6F), the contrast of the image of the vertical line pattern that generates diffracted light in the horizontal direction where the phase shift is large decreases, and the line width becomes narrow. On the other hand, because there is hardly any reduction in the contrast of the image of the horizontal line pattern that generates diffracted light in the vertical direction where the phase shift is small, the line width is substantially the same as the design value. As a result, the line width difference of the vertical and horizontal lines becomes a negative value.

On the contrary, when the sign of the $12^{th}$ term is positive, if the sign of the $9^{th}$ term is negative the phase shift is weakened at the right and left side of the pupil because of the positive phase shift by the $12^{th}$ term and the negative phase shift by the $9^{th}$ term, while the phase shift is enhanced in the negative direction at the upper and lower side of the pupil due to the negative phase shift by the $12^{th}$ term and the $9^{th}$ term. FIG. 6D shows a wavefront distribution that occurs within the pupil plane in such a case. In this case, the contrast of the image of the horizontal line pattern that generates diffracted light in the vertical direction where the phase shift is large decreases, and the line width becomes narrow. On the other hand, because there is hardly any reduction in the contrast of the image of the vertical line pattern that generates diffracted light in the horizontal direction where the phase shift is small, the line width is substantially the same as the design value. As a result, the line width difference of the vertical and horizontal lines becomes a positive value.

From the description above, it can be seen that when both the $9^{th}$ term and the $12^{th}$ term are not zero, the distortion of the wavefront in the vertical and lateral directions differs depending on the positive/negative sign of the $9^{th}$ and $12^{th}$ terms. And, focusing on the point, the line width difference of the vertical and horizontal lines can be adjusted by adjusting the $9^{th}$ term (the low order spherical aberration component), which can be adjusted easily, while the value of the $12^{th}$ term is fixed.

The directional difference of the phase shift of the $9^{th}$ term (0θ component whose degree of ρ is the fourth order) and the 12th term (2θ component whose degree of ρ is the fourth order (cos 2θ component)) is easy to understand when lowering the degree of ρ and comparing it with the relation between the $4^{th}$ term (the term corresponding to defocus that is a 0θ component whose degree of ρ is the second order: coefficient $Z_4$) and the $5^{th}$ term (the term corresponding to low order astigmatism that is a 2θ component whose degree of ρ is the second order (cos2θ component): coefficient $Z_5$).

When the sign of the $5^{th}$ term is positive, the phase in the horizontal direction of the pupil is positive and the phase in the vertical direction is negative, as is shown in FIG. 7E. Meanwhile, when the sign of the $4^{th}$ term is positive, the phase in the outer periphery of the pupil is positive, for example, as is shown in FIG. 7C, and when the sign of the $4^{th}$ term is negative, the phase in the outer periphery of the pupil is negative, for example, as is shown in FIG. 7A. Therefore, in the case of FIG. 7F where the sign of the $5^{th}$ and $4^{th}$ terms is equal, the phase shift in the horizontal direction of the pupil is large whereas the phase shift in the vertical direction is small. On the contrary, when the sign of the $5^{th}$ and $4^{th}$ terms is not equal (opposite) as in FIG. 7D, the phase shift in the horizontal direction of the pupil is small while the phase shift in the vertical direction is large.

In the case where the $5^{th}$ term is not zero, because the best focus position differs in the vertical line pattern and the horizontal line pattern depending on the value of coefficient $Z_5$, when the $4^{th}$ term is altered a line width difference occurs in the image of the vertical line (V-line) pattern and the horizontal line (H-line) pattern due to defocus, that is, according to the change in the $4^{th}$ term. That is, in the case the line width changes due to defocus, as is shown in the CD-focus diagram in FIG. 8, at a focus position where the $4^{th}$ term is not zero, a line width difference occurs in the image of the vertical line pattern (V) and the image of the horizontal line pattern (H) corresponding to the difference in best focus position in the vertical line pattern and the horizontal line pattern by the $5^{th}$ term. This line difference is the difference in influence on the line width of the image of the vertical line pattern and the image of the horizontal line pattern that can normally be seen due to a 0θ component shift (defocus) when astigmatism, which is a 2θ component, exists. From the description above, when the $5^{th}$ term, which is the low order astigmatism component, is not zero, by adjusting the $4^{th}$ term showing defocus, the line width difference of the image of the vertical line pattern and the image of the horizontal line pattern can obviously be made smaller.

Figure 10:
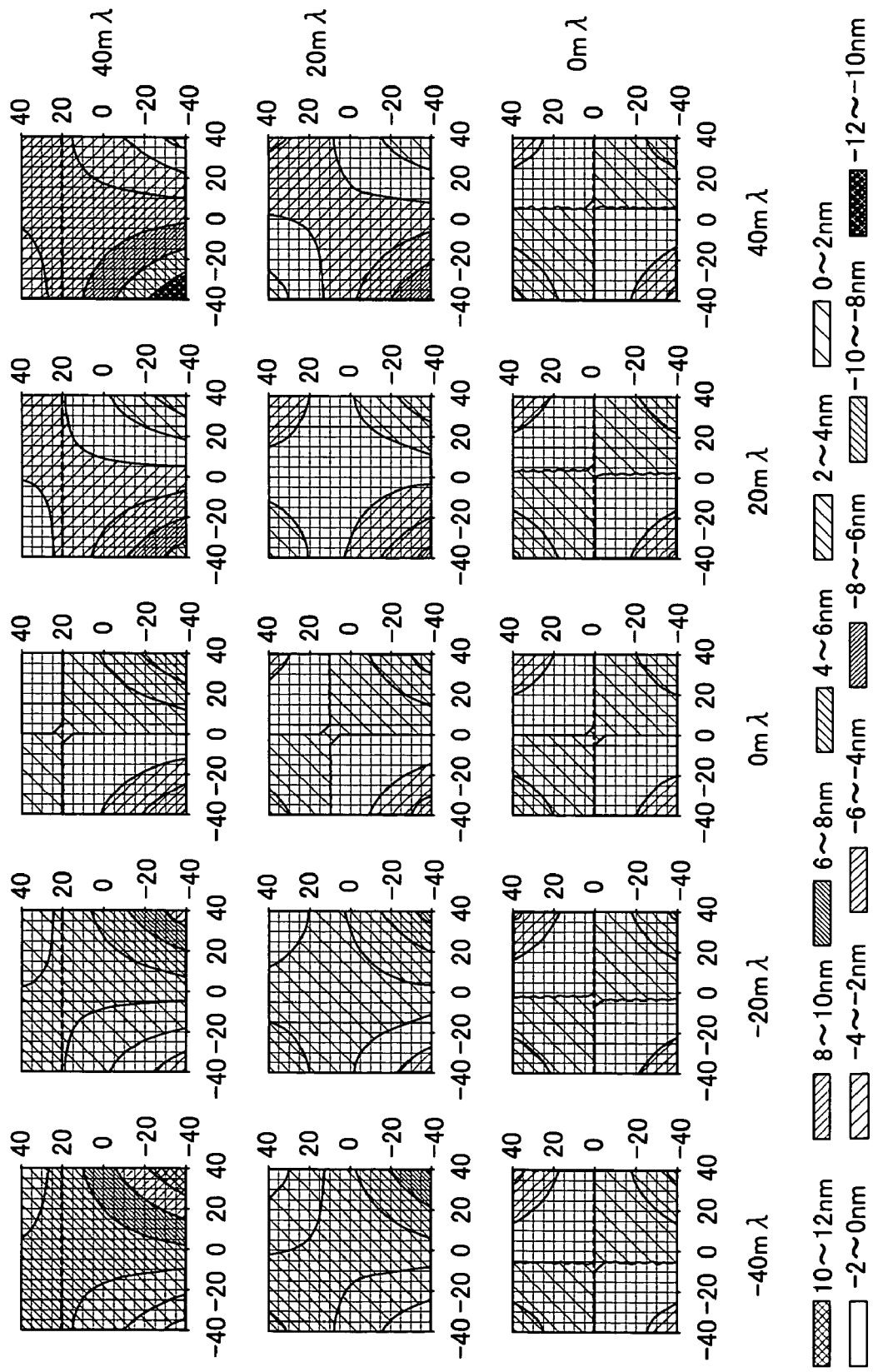
FIG. 10 is a detailed view (a contour line map) of FIG. 9 where $Z_{12}$ is 40 mλ, 20 mλ, and 0 mλ (the three sections in the upper half of FIG. 9)
Figure 11:
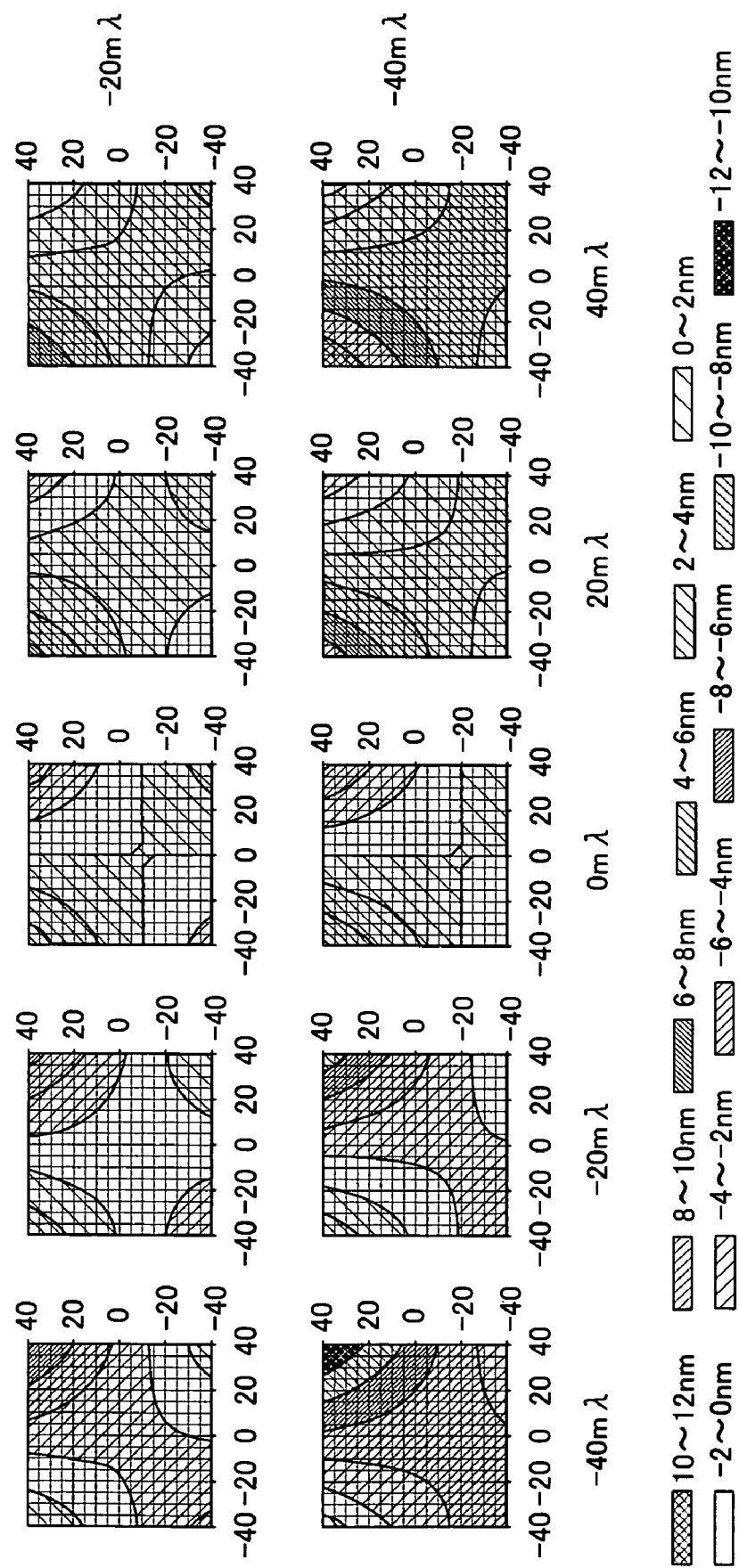
FIG. 11 is a detailed view (a contour line map) of FIG. 9 where $Z_{12}$ is −20 mλ and −40 mλ (the two sections in the lower half of FIG. 9)

FIG. 9 shows an example of an experimental result of line width difference in vertical and horizontal lines obtained by measuring the line width of the resist image obtained when the pattern on measurement reticle $R_T$ previously described is transferred, in the case when the light source is a KrF laser having a wavelength of 248.3 nm, the illumination condition a ⅔ annular illumination condition of illumination σ=0.75, and the numerical aperture (N.A.) of projection optical system PL is 0.68. In addition, FIG. 10 shows a more detailed view of the parts where $Z_{12}$ is 40 mλ, 20 mλ, and 0 mλ (the three sections in the upper half of FIG. 9), while FIG. 11 shows a more detailed view of the parts where $Z_{12}$ is −20 mλ and −40 mλ (the two sections in the lower half of FIG. 9). In FIGS. 10 and 11, the horizontal axis in each contour line map shows coefficient $Z_4$ of the $4^{th}$ term, and the vertical axis shows coefficient $Z_5$ of the $5^{th}$ term.

As is obvious from the description above, FIG. 9 shows a relation of line width difference between vertical and horizontal lines regarding a combination of coefficient $Z_9$ of the $9^{th}$ term and coefficient $Z_{12}$ of the $12^{th}$ term whose values are altered within the range of ±40 mλ at a step of 20 mλ, when coefficients $Z_4$ and $Z_5$ are altered. Hatching or the like printed in each of the areas in FIG. 9 shows the line width difference in the vertical and horizontal lines like the ones shown at the bottom of FIG. 9. Such hatchings indicate that in areas where the line width difference values are positive, the line width of the image of the vertical line (V-line) pattern is wider than that of the image of the horizontal line (H-line) pattern, whereas, in areas where the line width difference values are negative, the line width of the image of the vertical line (V-line) pattern is narrower than that of the image of the horizontal line (H-line) pattern.

Figure 12A:
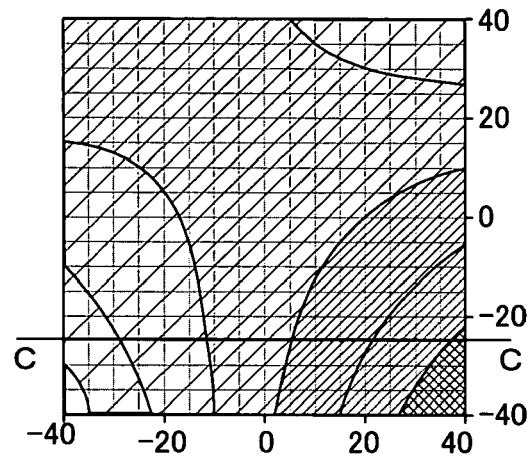
FIGS. 12A to 12D are views for describing the meaning of each contour line map in FIG. 9.
Figure 12B:
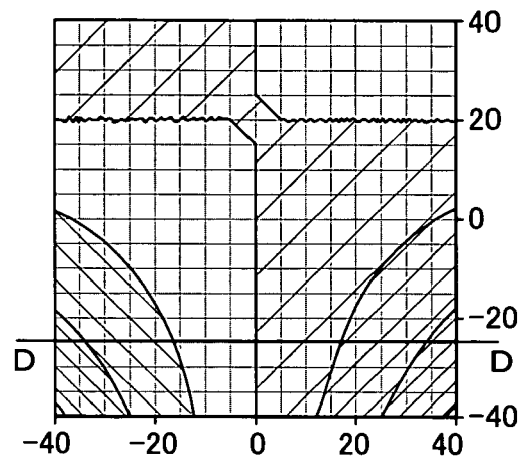
Figure 12C:
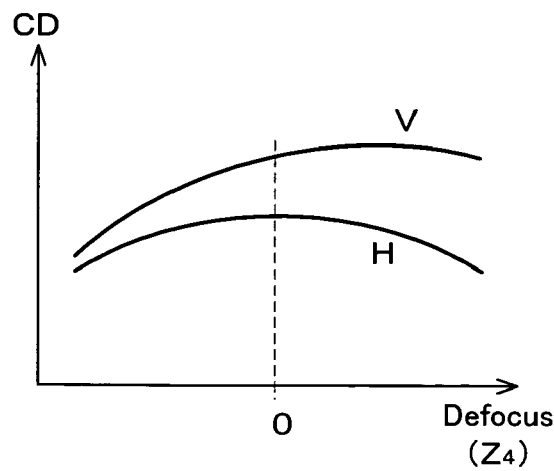
Figure 12D:
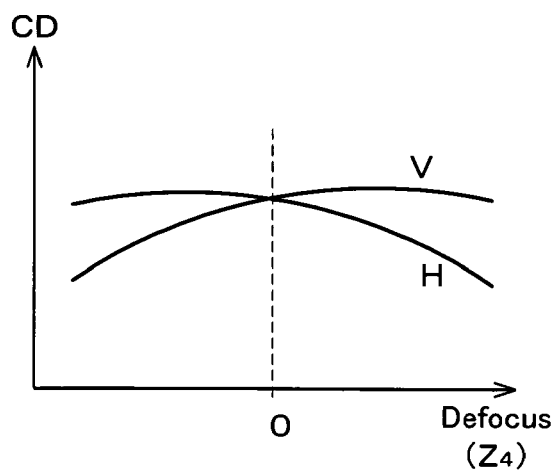

FIG. 12A shows a contour line map extracted from the upper left corner of FIG. 9, in which $Z_{12}$=40 mλ and $Z_9$=−40 mλ, and FIG. 12C shows a CD-focus diagram corresponding to the line C—C in FIG. 12A. In addition, FIG. 12B shows a contour line map extracted from the middle of the upper row in FIG. 10, in which $Z_{12}$=40 mλ and $Z_9$=0 mλ, and FIG. 12D shows a CD-focus diagram corresponding to the line D—D in FIG. 12B. As is obvious from these drawings, each of the contour line maps in FIG. 9 show how the line width difference in the V-line pattern and H-line pattern (hereinafter also referred to as 'V-H difference') changes depending on the defocus term (coefficient $Z_4$) and the low order astigmatism term (coefficient $Z_5$), under certain combination conditions of $Z_{12}$ and $Z_9$.

When the value of $Z_{12}$ is zero (the five contour line maps arranged in the third row from the top in FIG. 9), the value of $Z_9$ differs in each map, however, as is shown in each map in the bottom row of FIG. 10, there is no V-H difference at any focus position in any map when the value of $Z_5$ is zero.

On the other hand, when the value of $Z_{12}$ is not zero such as when $Z_{12}$=+40 mλ, as is obvious from each map arranged in the upper row of FIG. 10, when $Z_5$ equals zero, a best focus difference occurs in the V-line pattern and the H-line pattern due to $Z_{12}$, and the V-H difference of the line width changes depending on the value of $Z_4$, and also in this case, the value of the V-H difference in each $Z_4$ changes depending on the magnitude of $Z_9$. The case when such dependency of the value of the V-H difference to $Z_9$ is most obvious is when a $Z_5$ of 20 mλ is given, which corresponds to ½ of the value of coefficient $Z_{12}$ of the high order astigmatism term, the best focus difference of the V-line pattern and the H-line pattern due to the $12^{th}$ term, which is the high order astigmatism term, is corrected with the low order astigmatism term (coefficient $Z_5$), and the line width difference focus dependency is removed.

When the V-H difference of the line width is dependent on the value of $Z_9$ and $Z_{12}$ is a positive value, the line width of the image of the V-line pattern is narrower than the line width of the image of the H-line pattern, and on the contrary, when $Z_{12}$ is a negative value, the V-line is wider than the H-line. This supports the contents described earlier, referring to FIG. 6.

The findings in experiments that the inventors performed have confirmed that the V-H difference of the line width can be reduced from 27 nm to 7–8 nm, by changing the magnitude of the spherical aberration term $Z_9$ from −0.18 μm to −0.02 μm at a best focus difference (the difference in best focus position between a line-and-space pattern (L/S pattern) having a line width of 0.72 μm and a L/S pattern having a line width of 1.4 μm, under the normal illumination condition of illumination σ=0.04).

As is obvious from the description so far, it has been supported that the line width difference of the vertical and horizontal lines can be adjusted by performing a predetermined calculation at each evaluation point within the field of the projection optical system according to line width difference of vertical and horizontal lines ΔL and the value (magnitude) of coefficient $Z_{12}$ of the $12^{th}$ term in the Zernike polynomial as is previously described in order to obtain target values $r_1, r_2, \ldots, r_n$ (n=33) of the variation amount of coefficient $Z_9$ of the $9^{th}$ term, and by adjusting the projection optical system in the manner previously described, based on the target values of the variation amount of coefficient $Z_9$ of the $9^{th}$ term.

In exposure apparatus 100 in the embodiment, when semiconductor devices are manufactured, reticle R for device manufacturing is mounted on reticle stage RST, and then preparatory operations such as reticle alignment and wafer alignment as in the so-called baseline measurement and EGA (Enhanced Global Alignment) are performed.

Details on preparatory operations such as the above reticle alignment and baseline measurement are disclosed in, for example, Japanese Patent Application Laid-open No. H07-176468, and the corresponding U.S. Pat. No. 5,646,413. In addition, details on the following operation, EGA, are disclosed in, Japanese Patent Application Laid-open No. S61-44429, and the corresponding U.S. Pat. No. 4,780,617. As long as the national laws in designated states or elected states, to which this international application is applied, permit, the disclosures of the above publications and the above U.S. patents are incorporated herein by reference.

Then, based on the wafer alignment results, exposure based on the step-and-scan method is performed. Since the operations on exposure is the same as those of a typical scanning exposure apparatus, details on exposure operations will be omitted. However, exposure apparatus 100 in the embodiment uses projection optical system PL, which has been adjusted in the adjustment method shown in the flow chart in FIG. 4, when performing the above step-and-scan exposure, and furthermore, in exposure apparatus 100, the position and attitude of wafer W in exposure area IA during scanning exposure is controlled based on the calculated adjustment amounts ADJ16 to ADJ18. Due to such an arrangement, in the embodiment, the images (latent images) of the vertical line patterns and the horizontal line patterns in the circuit pattern formed on reticle R are formed on each shot area on wafer W, in a state where the line width differences are reduced.

As is obvious from the description so far, in the embodiment, movable lenses $13_1$ to $13_5$, wafer stage WST, and light source 16 make up an adjustment section, and the adjustment amounts are the position (or the variation amount) of movable lenses $13_1$ to $13_5$ and wafer stage WST in the Z, θx, and θy directions, and the shift amount of the wavelength of the illumination light from light source 16. And, the above adjustment section, drive elements that drive the movable lenses, image forming quality correction controller 48, and wafer stage drive section (not shown), which drives wafer stage WST, make up an image forming state adjustment unit. In addition, main controller 50 makes up a control unit that controls the image forming state adjustment unit. The structure of the image forming state adjustment unit, however, is not limited to the one described above, and for example, the adjustment section may be structured including only movable lenses $13_1$ to $13_5$. Even in such a case, the image forming qualities (aberrations) of the projection optical system can be adjusted.

In addition, in the embodiment, alignment system ALG, which picks up the resist image of measurement patterns formed on the wafer, and main controller 50, which calculates the line width of the resist image of the vertical line patterns and the horizontal line patterns included in the measurement pattern based on imaging signals from alignment system ALG, structure a line width measurement unit. Incidentally, as the line width measurement unit, for example, a measurement unit (such as a SEM) used only for measurement purposes may be arranged externally.

In the description so far, the wavefront aberration measurement performed when adjusting projection optical system PL or the like has been performed using wavefront aberration measuring unit 80, based on aerial images formed via pinholes and projection optical system PL. The present invention, however, is not limited to this, and as is disclosed in, for example, U.S. Pat. No. 5,978,085, the wavefront aberration can be calculated using a measurement mask that has a specific structure, by sequentially exposing each of a plurality of measurement patterns formed on the mask onto a substrate via pinholes individually provided and the projection optical system, and also by exposing reference patterns on the mask via projection optical system without passing through the condenser lens and the pinholes, measuring the positional deviation of the resist images of a plurality of measurement patterns obtained by each exposure from the resist images of the reference patterns, and performing a predetermined calculation.

As is described in detail above, according to the adjustment method of projection optical system PL related to the embodiment, for example, the line width difference of the vertical and horizontal lines previously described that occurs due to the high order astigmatism (the $12^{th}$ term), which makes adjusting projection optical system PL difficult, can be controlled by adjusting projection optical system PL so that the magnitude of the low order spherical aberration (the $9^{th}$ term), which can be adjusted easily, is controlled. Accordingly, it becomes possible to freely control the line width difference of the image of the vertical line patterns and horizontal line patterns without fail, which was conventionally said to be difficult.

In addition, according to exposure apparatus 100 related to the embodiment and the exposure method, the wavefront aberration of projection optical system PL is measured by wavefront aberration measuring unit 80. In addition, measurement patterns of measurement reticle $R_T$ is transferred onto wafer W via projection optical system PL, and the resist image of the measurement pattern formed on the wafer after development is picked up by main controller 50 using alignment system ALG. And based on the imaging signals, the line widths of the resist image of the vertical line patterns and horizontal line patterns included in the measurement pattern are each calculated.

Then, when the $12^{th}$ term of the Zernike polynomial corresponding to the high order astigmatism term (a first optical property) is not zero, the Zernike polynomial being an expansion of the wavefront aberration measured by wavefront aberration measuring unit 80, main controller 50 controls the magnitude of the $9^{th}$ term of the Zernike polynomial corresponding to the low order spherical aberration term (a second optical property) that affects the above line widths by interacting with the $12^{th}$ term, using the image forming state adjustment unit referred to above. The control is performed according to the value of the $12^{th}$ term (coefficient $Z_{12}$) and a line width difference, which is the difference between the first line width and the second line width measured above, the first line width being the line width of the image of the vertical line pattern and the second line width being the line width of the image of the horizontal line pattern. That is, by controlling the magnitude of the low order spherical aberration that can be adjusted easily using the image forming state adjustment unit, it becomes possible to control the line width difference referred to earlier caused by the high order astigmatism, which is said to be difficult to adjust.

Then, the circuit pattern of reticle R is illuminated with illumination light EL, and the circuit pattern is transferred onto wafer W via projection optical system PL that has been adjusted. In this manner, a favorable exposure can be performed in which the line width differences of the transferred images of the vertical line pattern and horizontal line pattern are effectively reduced.

In the embodiment above, the case has been described where the first optical property is the high order astigmatism term, which is the $12^{th}$ term of the Zernike polynomial that is an expansion of the wavefront aberration, and the second optical property is the low order spherical aberration term, which is the $9^{th}$ term of the Zernike polynomial, however, the present invention is not limited to this. For example, as the first optical property, the $13^{th}$ term can be measured, which is a $2\theta$ component (sin $2\theta$ component) whose degree of $\rho$ (the fourth order) is the same as the above $12^{th}$ term (a cos $2\theta$ component whose degree of $\rho$ is the fourth order). In this case, as the second optical property, the $9^{th}$ term that has been used in the embodiment above can be used without any modification. Due to the interaction of the $9^{th}$ term and the $13^{th}$ term, the line widths of the image of a first diagonal line pattern on the reticle whose direction is in a direction intersecting with the vertical line (V-line) and the horizontal line (H-line) referred to earlier at an angle of 45° and a second diagonal line pattern orthogonal to the first diagonal line pattern are affected. Accordingly, similar to the embodiment above, when the $13^{th}$ term of the Zernike polynomial is not zero, by controlling the magnitude of the low order spherical aberration, which is the $9^{th}$ term of the Zernike polynomial, using the image forming state adjustment unit previously described, it becomes possible to control the line width difference referred to earlier. This control is performed according to the value of the $13^{th}$ term (coefficient $Z_{13}$) and a line width difference, which is the difference between a first line width, being the line width of the image of the first diagonal line pattern, and a second line width, being the line width of the image of the second diagonal line pattern.

Besides the description above, other than the above $12^{th}$ and $13^{th}$ term of the Zernike polynomial, which is an expansion of the wavefront aberration, the first optical property may be a 2-times rotational symmetry component whose degree of $\rho$ is m (m≧4). And, other than the $9^{th}$ term, the second optical property may also be a rotational symmetry component whose order is the same as that of the 2-times rotational symmetry component above. Even when such an arrangement is employed, when the magnitude of the first optical property is not zero, by adjusting projection optical system PL so that the second optical property is controlled according to the magnitude of the first optical property and the line width difference of the image of the line patterns orthogonal in a two-axis direction that are measured, it is assumed that the same effect as in the embodiment above can be expected.

Furthermore, as the combination of the first optical property and the second optical property that affects the line width difference of the vertical and horizontal lines referred to earlier (V-H difference), other than the $9^{th}$ term and the $12^{th}$ term of the Zernike polynomial that has been described so far, the Zernike combination of the $6^{th}$ term (coefficient $Z_6$) and the $18^{th}$ term (coefficient $Z_{18}$), the $13^{th}$ term (coefficient $Z_{13}$) and the $18^{th}$ term (coefficient $Z_{18}$), and the $12^{th}$ term (coefficient $Z_{12}$) and the $17^{th}$ term (coefficient $Z_{17}$) may also be given.

Inventors of the present invention performed a simulation for systematically finding the combination that causes the V-H difference, in order to effectively judge whether a combination of the terms of the Zernike polynomial (Zernike terms), which is an expansion of the wavefront aberration, actually becomes the cause of V-H difference.

FIG. 13 shows a chart containing calculation results of cross-term interactions of aberrations when an isolated line with a line width of 100 nm is to be formed on the wafer, under the conditions of: the light source being an ArF excimer laser (wavelength: 193 nm), the numerical aperture (N.A.) of projection optical system PL=0.68, illumination σ=0.85, the reticle pattern being an isolated line (2 μm pitch) whose reduced value on the wafer is to be 140 nm (including mask bias: +40 nm) under a ⅔ annular illumination condition, and the phase shift mask (reticle) used being a halftone mask that has a 6% transmittance. In FIG. 13, Zi (i=4 to 20) indicates the $i^{th}$ term of the Zernike term.

In FIG. 13, the upper right hand side of the diagonal borderline is the cross-term magnitude in each aberration (Zernike term) with respect to horizontal lines, whereas the lower left hand side is the cross-term magnitude in each aberration with respect to vertical lines. From FIG. 13, the cross-term of the $9^{th}$ term (Z9) and $12^{th}$ term (Z12) combination is 759 for horizontal lines and −759 for vertical lines, and they obviously have opposite signs.

Besides the above combination, in the Zernike combinations of the $6^{th}$ term (Z6) and the $18^{th}$ term (Z18), the $13^{th}$ term (Z13) and the $18^{th}$ term (Z18), and the $12^{th}$ term (Z12) and the $17^{th}$ term (Z17) referred to earlier, the signs in the cross-term of the vertical and horizontal lines are opposite, showing that such combinations are a cause of V-H difference.

As the combination of the first optical property and the second optical property, the above Zernike combinations can be considered. The combination, however, is not limited to this, and the first optical property may be astigmatism and the second optical property may be spherical aberration. Even in such a case, when considering the fact that the interaction between astigmatism and spherical aberration affects the line width difference of the vertical line pattern image and the horizontal line pattern image, in the case astigmatism exists in the measurement results of the optical properties of the projection optical system, the line width difference can be suppressed by adjusting projection optical system PL so that spherical aberration is controlled according to the magnitude of astigmatism and the line width difference between the line pattern images perpendicular in two axial directions that have been measured.

In addition, as is obvious when considering this case, the optical properties measuring unit of projection optical system PL is not limited to the wavefront aberration measuring unit, and the unit may be a unit for measuring the Five Seidel Aberrations such as spherical aberration and astigmatism of projection optical system PL. For example, as such a unit, a so-called aerial image measuring instrument that forms a slit shaped or rectangular shaped aperture pattern on wafer stage WST, scans the aperture pattern against an aerial image of a predetermined measurement pattern formed by projection optical system PL, and detects the light that has passed through the aperture pattern with a photodetection device can be used.

In the embodiment above, the case has been described where wavefront aberration of projection optical system PL is directly measured using wavefront aberrations measuring unit 80. The present invention, however, is not limited to this, and since the $12^{th}$ term (coefficient $Z_{12}$) is a high order astigmatism term, for example, the $12^{th}$ term can be obtained by approximation, by obtaining the best focus position for each of a plurality of types of L/S patterns that have different periodic directions (or isolated line patterns that have different directions), and calculating each undetermined coefficient in a formula, which assumes that astigmatism obtained from the results of the best focus positions is a linear combination of the low order astigmatism term (coefficient $Z_5$) and the high order astigmatism term (coefficient $Z_{12}$), using the least squares method or the like. The best focus positions for the plurality of types of L/S patterns that have different periodic directions referred to above may be obtained by measuring the resist images formed in each shot area on the wafer that are obtained by exposing the above patterns onto the wafer while changing the position of the wafer in the optical axis direction, using a SEM or the like. Or, the aerial image measuring instrument referred to above may be used to measure the aerial image of the above patterns while changing the position of the aerial image measuring unit in the optical axis direction, and the $12^{th}$ term may be obtained based on the measurement results of the aerial images.

In addition, in the case the line width measurement unit has an arrangement similar to the one described in the embodiment above, the line width measurement is not limited only to the resist image, but latent images or etched images of vertical line patterns and horizontal line patterns formed on the wafer may be also measured. Or, the line width measurement unit may be structured by the aerial image measuring unit referred to above. In this case, for example, aerial images of the vertical line pattern and the horizontal line pattern are formed on the image plane, and the line width of the images is measured by the aerial image measuring unit. That is, the image forming and line width measurement are performed at the same time.

In the embodiment above, for the sake of simplicity in the description, the case has been described where line width control is performed so that the line difference between the images of the vertical line pattern and the horizontal line pattern with the same line width is substantially zero. The projection optical system adjustment method in the present invention, however, is not limited to this, and as long as the line patterns are line patterns orthogonal in two axial directions, line width difference of the images can be controlled, regardless of their line width (even if the line width of the images differs). As such line width difference control, the line width difference of the pattern images can be controlled so that it becomes precisely closer to the designed line width difference value.

In addition, in the embodiment above, the adjustment of the projection optical system is performed on-body (in a state where the projection optical system is assembled into the exposure apparatus), however, the projection optical system can be adjusted by itself, such as in, for example, during the making of the exposure apparatus (especially the projection optical system) before the projection optical system is built into the exposure apparatus.

The cause of the line width difference occurring in the images of line patterns orthogonal in two axial directions is not limited to aberration in the projection optical system, and it may also be due to a drawing error of the pattern on the reticle. In order to reduce line width difference that occurs in the images of line patterns orthogonal in two axial directions due to such causes, the projection optical system adjustment method, the exposure method, and the exposure apparatus related to the present invention can be employed. In this case, according to the first optical property measured in a manner similar to the embodiment above such as the value of the $12^{th}$ term in the Zernike polynomial, and the line width difference between the line width of a known first line pattern and the line width of a second line pattern orthogonal to the first line pattern (drawing error), the projection optical system is adjusted so that the second optical property such as the magnitude of the $9^{th}$ term in the Zernike polynomial, which affects the line width difference between the line width of the first line pattern image formed on the image plane by the projection optical system by interaction with the first optical property and the line width of the second line pattern image, is controlled. Therefore, in the case when line width difference occurs between the line width of the image of the first line pattern formed on the image plane by the projection optical system and the line width of the second line pattern due to drawing error in the pattern of the reticle, the line width difference of the orthogonal line patterns can be freely controlled.

As is obvious from the description so far, when information is obtained on wavefront aberration of the projection optical system as well as information related to the projected image of the pattern, and the projection optical system is adjusted based on such information, of the plurality of Zernike terms resulting from the expansion of the wavefront aberration using the Zernike polynomial, the projection optical system may be adjusted taking into consideration the Zernike sensitivity of the cross-term of certain Zernike term combinations whose interaction affects the characteristics of the projected images with respect to the change in characteristics in the projected images. When such an arrangement is employed, because the projection optical system is adjusted taking into consideration the Zernike sensitivity of the cross-term of certain Zernike term combinations whose interaction affects the characteristics of the projected images with respect to the change in characteristics in the projected images that was not considered in the past, aberration component that was difficult to adjust conventionally such as a high order aberration component becomes adjustable, and it becomes possible to adjust the projection optical system so that the formed state of the image of the pattern becomes more favorable. In this case, when the pattern includes the line pattern, as the characteristics of the projected image, the above Zernike sensitivity with respect to the change in characteristics including at least the line width of the line pattern may be taken into consideration. In addition, also in this case, the projection optical system that has been adjusted can be used to transfer the circuit pattern onto an object such as a wafer. Even in such a case, pattern transfer with high precision can be achieved.

Defocus amount affects not only the line width difference of vertical and horizontal lines, but also affects the line width of the image of an isolated line pattern. The inventors, therefore, performed an experiment in order to obtain the CD-focus curve previously described.

As the exposure conditions, the following conditions were set: an ArF excimer laser (wavelength 193 nm) used as the light source, numerical aperture (N.A.) of projection optical system PL 0.78, illumination σ=0.85, a ⅔ annular illumination condition, and object pattern an isolated line (2 μm pitch) whose reduced value on the wafer is 100 nm, formed on a halftone mask (reticle) with a 6% transmittance. In addition, the exposure amount (slice level) was obtained under the conditions of no aberration and no defocus, and line width dispersion ΔCD was obtained at a +0.15 μm defocused position.

Figure 14:
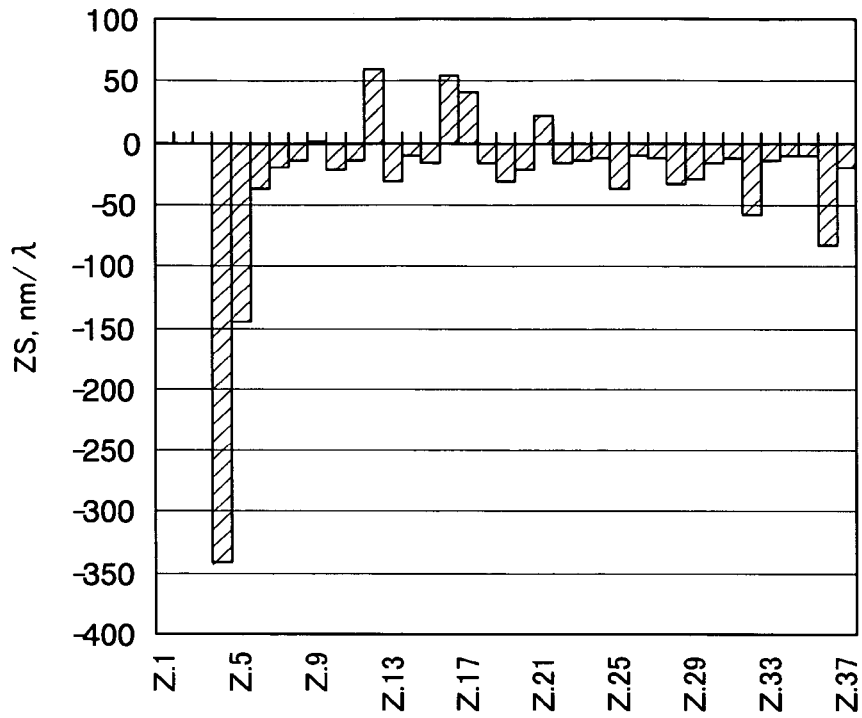
FIG. 14 is a view showing an example of a ZS (Zernike Sensitivity) calculation result of line width dispersion ΔCD.

FIG. 14 shows the result when Zernike sensitivity is obtained from the $1^{st}$ term to the $37^{th}$ term by simply inputting an aberration of, for example, 50 mλ per each Zernike term into the optical simulation computer. In FIG. 14, Z.i (i=1 to 37) in the horizontal axis indicates each of the Zernike terms.

In the conventional Zernike Sensitivity method, (Zernike Sensitivity Method: hereinafter appropriately shortened as 'ZS method'), line width dispersion ΔCD can be expressed as a linear combination of Zernike Sensitivity (hereinafter, the 'Zernike Sensitivity' is appropriately shortened as 'ZS') $s_i$ ($i$=1 to 37) as is shown in equation (19) below and magnitude $C_{n,i}$ (=coefficient $Z_i$) of each Zernike term at the $n^{th}$ measurement point (hereinafter also referred to as measurement point n). Hereinafter, $C_{n,i}$ will be outlined as the component of the Zernike term at each measurement point (Zernike term component).

$$\Delta CD = \sum_{i=1}^{37} S_i C_{n,i} \qquad (19)$$

Figure 15:
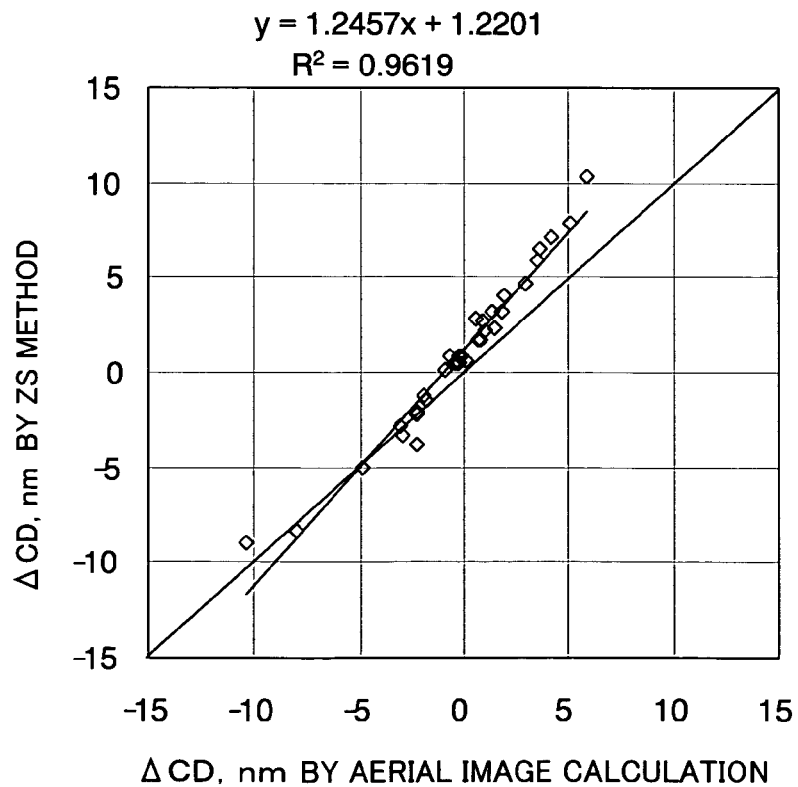
FIG. 15 is a view showing a relation between calculation results of line width dispersion ΔCD using the conventional ZS method and calculation results from an aerial image.

However, in between the calculation results using the ZS method that uses the above equation (19) and the method of directly calculating the aerial image by providing a suitable wavefront aberration, dispersion is evident, as in the graph shown in FIG. 15. That is, in the calculation using the ZS method that uses the above equation (19), the error is too large.

Therefore, the inventors worked out a method of assuming the line width by moving the CD-focus curve within a two-dimensional plane whose coordinate axes are focus and line width.

As is described above, because the line width prediction error is large in the method of directly expressing ΔCD in a linear combination of the Zernike term component, the method has been employed where a step of shifting the CD-focus curve in parallel is added in between the calculation of the Zernike sensitivity and the calculation of ΔCD, and then after the step (parallel translation) has been executed, ΔCD is calculated based on the shifted CD-focus curve.

For example, regarding the CD-focus curve shift, Zernike sensitivity is used to express the movement amount in the focus direction ($\alpha_n$) and the movement amount in the line width (CD) direction ($\beta_n$), respectively, for each measurement point n. Next, the CD-focus curve that was, for example, a function of y=f(x) is shifted in parallel to make a CD-focus curve of y=f(x−$\alpha_n$)+$\beta_n$, then ΔCD may be calculated for the new function.

<<Prediction Method>>

Hereinafter, an embodiment of a prediction method of a CD-focus curve related to an example of the prediction method in the present invention will be described, according to flow charts (FIGS. 16 and 24) showing the processing and also appropriately referring to other drawings.

In the embodiment as well, the CD-focus curve, which is one of the characteristics of the projected image of the pattern, is predicted for each measurement point n of wavefront aberration in exposure apparatus 100 earlier described, using the Zernike Sensitivity method that uses the linear combination of a plurality of terms including the Zernike term component $C_{n,i}$. As each Zernike term component $C_{n,i}$, the values obtained in advance by an image forming simulator in simulation computer 46 may be used, or, the values obtained by measurement using wavefront aberration measuring unit 80 may be used, as is previously described.

Figure 16:
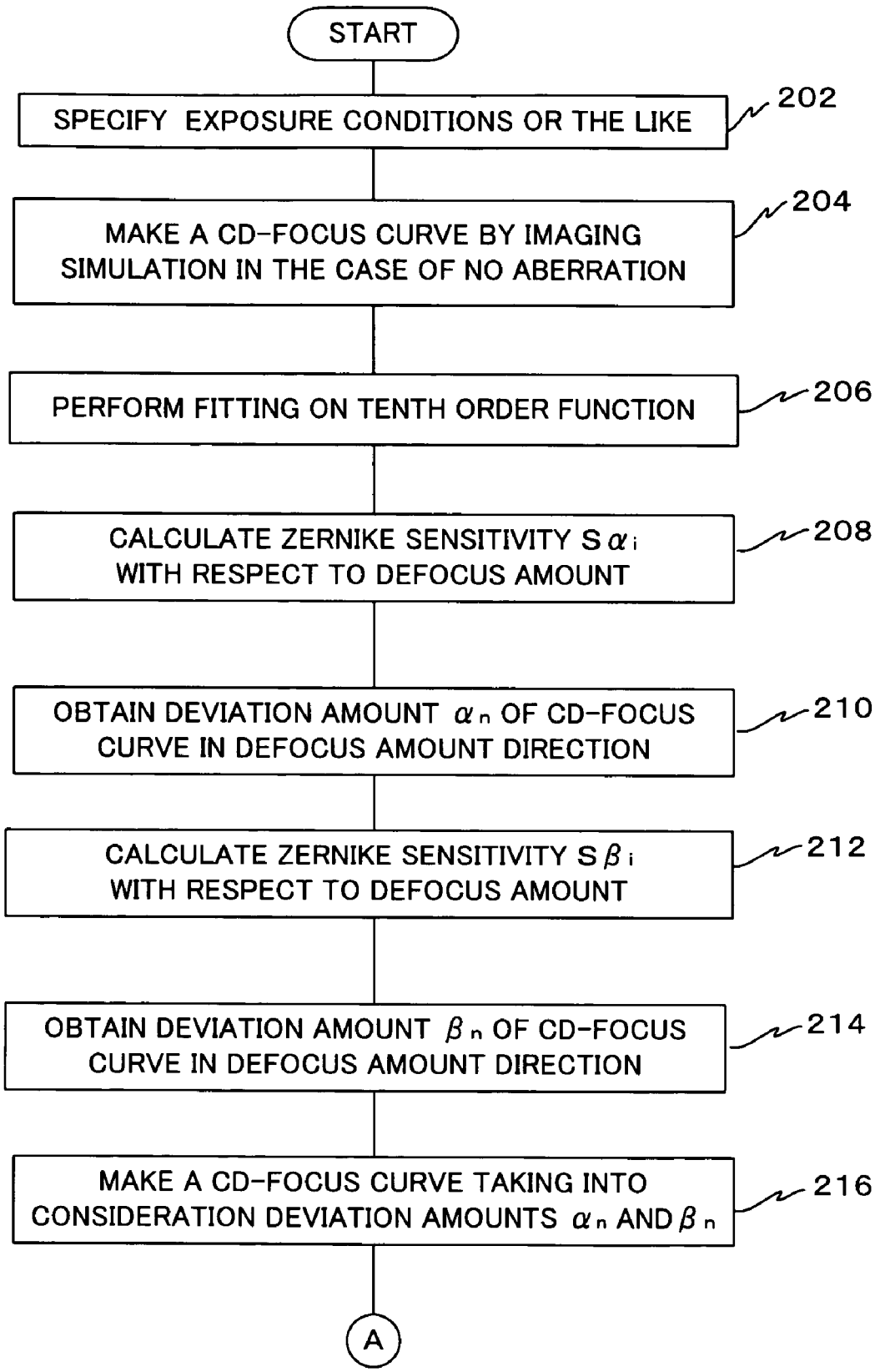
FIG. 16 is a flow chart (No. 1) showing a prediction method in an embodiment.

First of all, in step 202 in FIG. 16, exposure conditions including optical conditions during the actual exposure (such as, for example, wavelength of illumination light EL, that is exposure wavelength (and the type of light source 16 used for exposure), the maximum N. A. (numerical aperture) of projection optical system PL, N. A. to be used (the numerical aperture that is to be set to aperture stop 15 on exposure), coherence factor σ value (illumination σ) or illumination N. A. (numerical aperture of illumination optical system), and illumination conditions of the reticle (light quantity distribution of illumination light EL on the pupil plane of the illumination optical system, that is, the shape and size of the secondary light source)) are input to simulation computer 46 via its input unit. At this point, the image forming simulator is already running on simulator computer 46, and on its screen, the screen for setting exposure conditions for the image forming simulator is to be displayed. The operator or the like sets conditions such as optical condition that are used in the actual exposure, according to the condition setting screen. When these exposure conditions are set, information on the pattern such as the shape and size of the pattern on the reticle, which is to be transferred to each measurement point n (n=1 to 33), is also set at this point. The information related to the pattern includes, for example, the pattern type such as an isolated line pattern, a line-and-space (L/S) pattern, and an orthogonal pattern in which line patterns are orthogonal (including whether the pattern is a phase shift pattern or not, and its type), and pattern size related information such as line width of the line pattern, length, and pitch. The pattern to be used is selected, depending on the evaluation item that is to be evaluated. For example, when the line width difference of the vertical and horizontal lines is to be the evaluation item as is the case in the above operation, given that a reticle that has line patterns formed that are orthogonal to each other like reticle $R_T$ shown in FIG. 5 is used, information regarding the pattern on the reticle needs to be set. In this case, to simplify the description, a reticle that has an isolated line pattern of the same size formed at each measurement point will be used, and the setting of information on the pattern of the reticle has been completed.

In the next step, step 204, the image forming simulation makes the CD-focus curve when there is no aberration in projection optical system PL. To be more specific, the operator or the like gives instructions to simulation computer 46 to make the CD-focus curve when projection optical system PL has no aberrations, via the input unit. And, in response to the instructions, simulation computer 46 makes line width variations of the line pattern with respect to defocus amount, or in other words, the CD-focus curve, in a state where it is assumed that there are no aberrations in projection optical system PL (that is, the state in which Zernike term components $Z_i$ ($i=1$ to 37, that is, $C_{n,i}$) shown in equation (3) are all zero) under the conditions set in step 202 above, using the image forming simulator.

In the next step, step 206, simulation computer 46 fits the CD-focus curve that has been made in the tenth order function expressed in equation (20) below.

$$y = C_a x^{10} + C_b x^8 + C_c x^6 + C_d x^4 + C_e x^2 + C_f \quad (20)$$

Figure 17A:
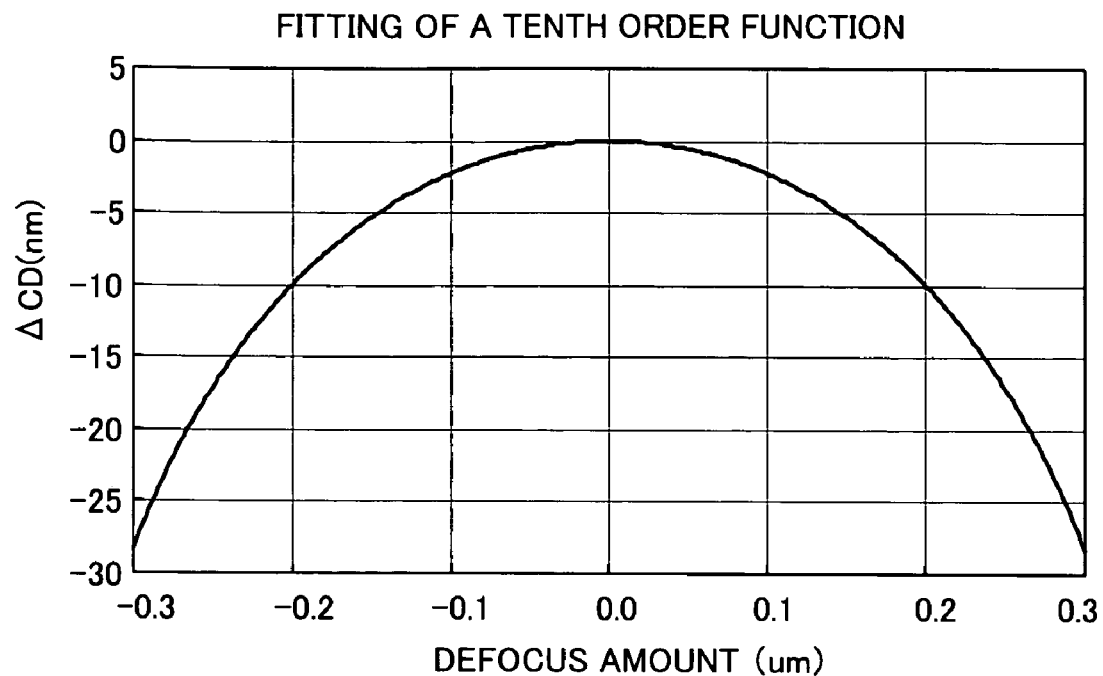
FIG. 17A is a view showing an example of a tenth order function.
Figure 17B:
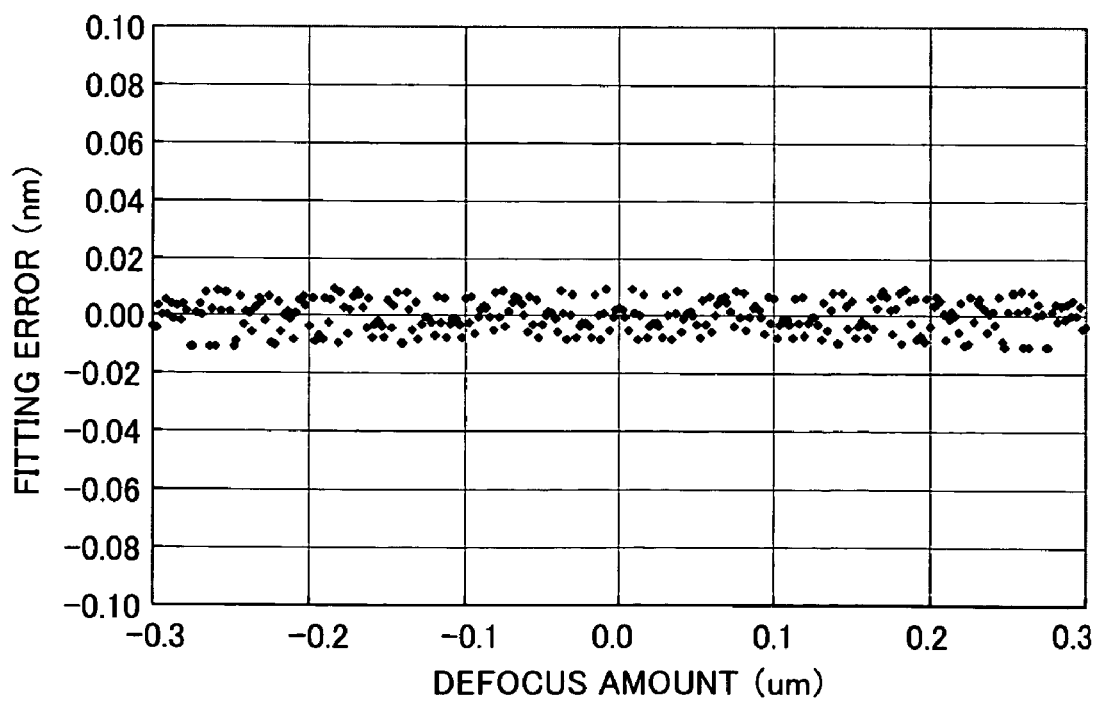
FIG. 17B is a view showing a fitting error of the function.

In this case, x shows defocus amount, and y shows the line width of the image of an object pattern corresponding to the defocus amount (the line pattern whose pattern information has been set in step 202 described above), and $C_a$ to $C_f$ are coefficients of the terms in each order in the tenth order function. As is obvious from equation (20), this function consists only of even terms, from the second order to the tenth order. FIG. 17A shows an example of a tenth order function obtained as a result of such fitting, and FIG. 17B shows an example of fitting error between the tenth order function and the CD-focus curve obtained by the image forming simulation. As is shown in FIG. 17B, the fitting error of the tenth order function is well within ±0.02 nm, and the fitting accuracy is obviously extremely high.

Next, in step 208, the operator or the like uses simulation computer 46 to obtain Zernike sensitivity $S\alpha_i$ of each Zernike term with respect to the defocus amount by aerial image calculation. When, for example, a CD-focus curve is made inputting only one type of aberration expressed in the Zernike polynomial, a different behavior can be seen for each term. In this case, of such behaviors, variation in the best focus position is obtained.

FIG. 18 shows Zernike sensitivity $S\alpha_i$ referred to above. In FIG. 18, the Z.i (i=1 to 37) of the horizontal axis indicate each of the Zernike terms. As is shown in FIG. 18, the terms that have sensitivity to the defocus amount are Zernike terms $Z_4$, $Z_9$, $Z_{16}$, $Z_{25}$, $Z_{36}$, and $Z_{37}$, which are rotational components, and $Z_5$, $Z_{12}$, $Z_{17}$, $Z_{21}$, $Z_{28}$, and $Z_{32}$, which are 2-times rotational components; that is, only the even θ components. Because the Zernike sensitivity is zero in other terms (odd θ components), the CD-focus curve is not affected by the odd θ components and the cross-term interaction between aberrations, regarding the shift in the focus direction.

Figure 19:
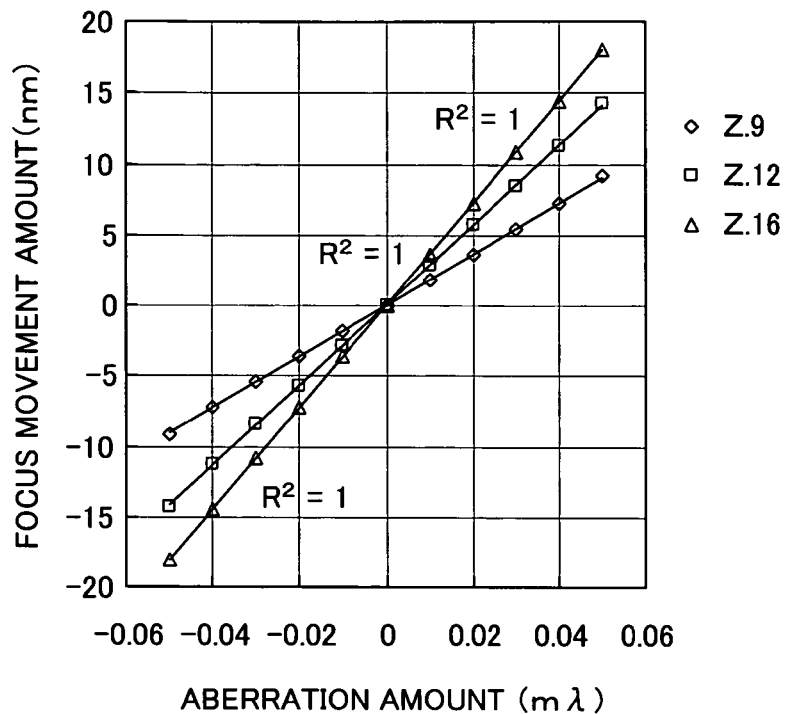
FIG. 19 is a view showing an example of calculation results when calculating a movement amount $(\alpha_n)$ in the focus direction from −50 mλ to 50 mλ at a pitch of 10 mλ at 11 points, respectively, and calculating an inclination of straight lines using the least squares method.

FIG. 19 shows the change of movement amount ($\alpha_n$) in the focus direction at 11 points when three types of Zernike terms, the $9^{th}$ term (Z.9), the $12^{th}$ term (Z.12) and the $16^{th}$ term (Z.16) are moved, from −50 mλ to 50 mλ at a pitch of 10 mλ, respectively. FIG. 19 also shows the inclination of the straight lines obtained based on each movement amount at the 11 points using the least squares method. That is, the inclination of each straight line indicates the values expressing the sensitivity for each Zernike term. Although FIG. 19 representatively shows only 3 terms, the $9^{th}$ term (Z.9), the $12^{th}$ term (Z.12) and the $16^{th}$ term (Z.16), it is confirmed that when the aberration amount is within the above range, linearity is substantially maintained for other Zernike terms as well. As is obvious from FIG. 19, because correlation function $R^2 \approx 1$, in a normal Zernike sensitivity calculation, in order to save the calculation time, the inclination of the straight line may be obtained by inputting only one value of aberration. In the case above, however, for the purpose of re-confirmation and for obtaining a more accurate value, the movement amount ($\alpha_n$) in the focus direction was calculated at 11 points at the pitch of 10 mλ, from −50 mλ to 50 mλ, and the inclination of the straight line (that is, the Zernike sensitivity value) was calculated using the least squares method.

Next, in step 210, simulation computer 46 obtains deviation amount $\alpha_n$ of the CD-focus curve in the focus direction at measurement point n (n=1 to 33), using Zernike sensitivity $S\alpha_i$ of each Zernike term and Zernike term component $C_{n,i}$ (i=1 to 37) at each measurement point n (n=1 to 33) in equation (21) below, which is an equation similar to the one used in the Zernike sensitivity method when obtaining total focus deviation (TFD), astigmatism, and spherical aberration amount.

$$\alpha_n = \sum_{i=1}^{37} S\alpha_i C_{n,i} \quad (21)$$

In the case aberration is input at 11 points at the pitch of 10 mλ, from −50 mλ to 50 mλ, for each Zernike term, and a relation between $\beta_n$ (line width variation at the best focus position) and aberration is obtained from its behavior, it can be assumed that $\beta_n$ can be expressed as a linear combination of the square of each Zernike term component, from the fact that the influence of the aberration amount is the same, whether the amount is a plus or a minus, and that when aberration increases, image deterioration that exceeds the proportionally relation can be observed.

Figure 20:
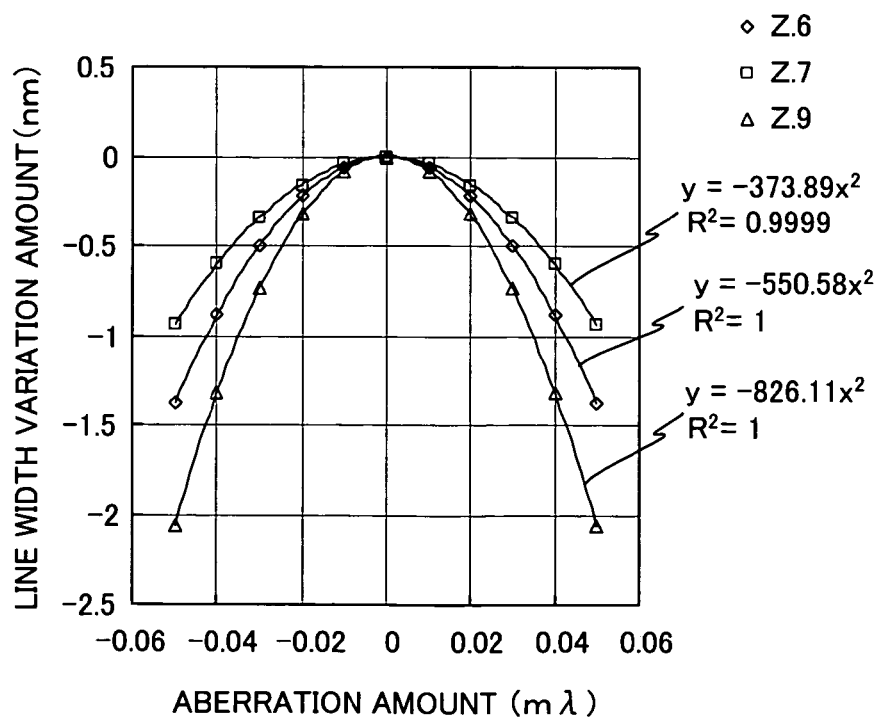
FIG. 20 is a view showing an example of calculation results when a quadric function is assumed for calculation results of line width variation amount at the 11 points obtained by a similar image calculation as in the case of FIG. 19, and approximation by the least squares method is performed.
Figure 21:
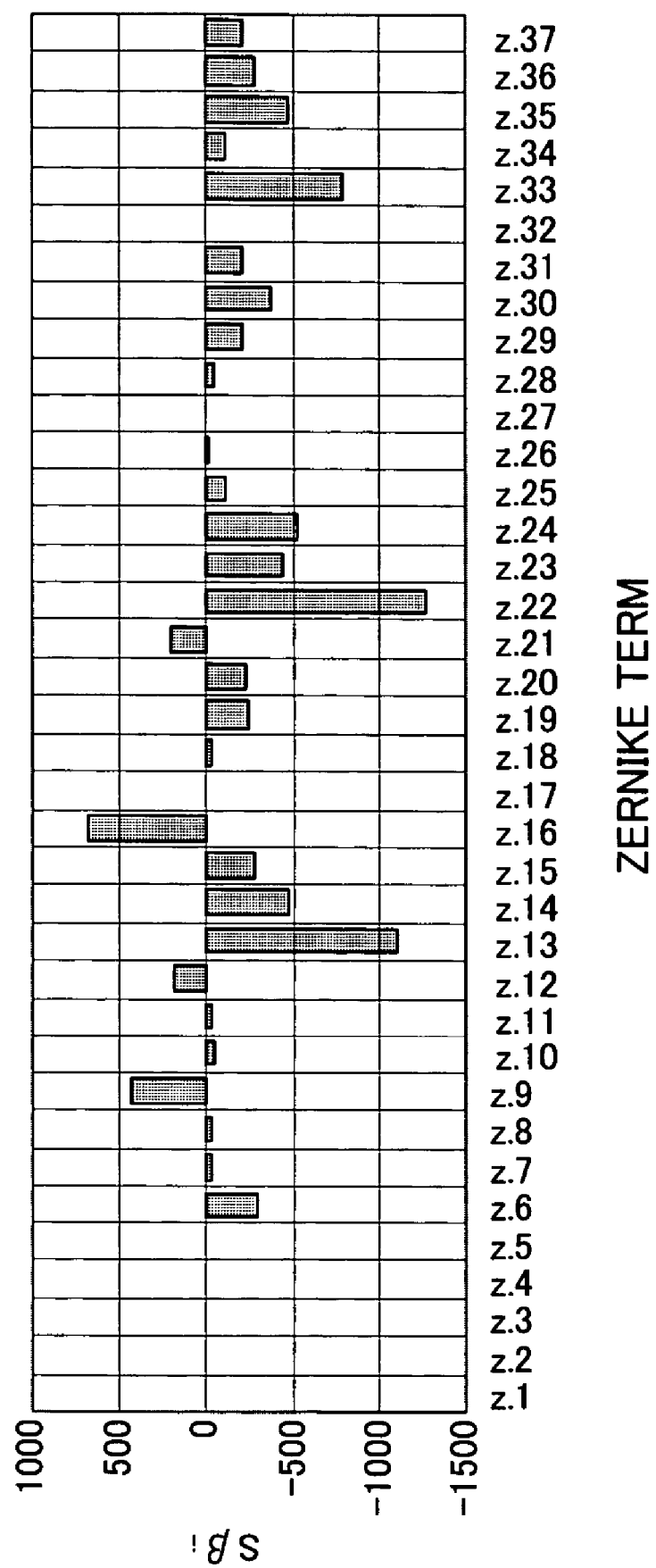
FIG. 21 is a graph showing an example of the Zernike sensitivity $S\beta_i$.

Therefore, in the next step, step 212, the operator or the like calculates Zernike sensitivity $S\beta_i$ with respect to the line pattern line width, which is the square of each Zernike term component, by aerial image calculation, using simulation computer 46 under the exposure condition that have been set. And, assuming a quadratic function for calculating the line width variation amount of the 11 points obtained by the image calculation, and performing approximation by the least squares method, it can be observed that the results matches a function $y=sx^2$, as is shown in FIG. 20. FIG. 20 representatively shows only three terms, the $6^{th}$ term (Z.6), the $7^{th}$ term (Z.7), and the $9^{th}$ term (Z.9); however it has been confirmed that other Zernike terms can also be expressed as a quadratic function. FIG. 21 shows sensitivity $S\beta_i$ (i=1 to 37) of each of the Zernike terms. In FIG. 21, the horizontal axis Z.i (i=1 to 37) indicates each of the Zernike terms. As is shown in FIG. 21, odd θ components and even θ components both have sensitivity to this line width variation.

In the next step, step 214, simulation computer 46 takes out Zernike term component $C_{n,i}$ at each measurement point from the memory, and obtains deviation amount βn of the CD-focus curve of the line pattern in the line width direction, using equation (22) below.

$$\beta_n = \sum_{i=1}^{37} S\beta_i C_{n,j}^2 \qquad (22)$$

Next, in step 216, simulation computer 46 obtains the CD-focus curve at measurement point n (n=1 to 33) based on equation (23) below, using $\alpha_n$ obtained in step 210 described above and $\beta_n$ obtained in step 214 also described above. The CD-focus curve obtained by this operation then becomes a CD-focus curve at each measurement point n that is predicted when taking into consideration the aberration of projection optical system PL at measurement point n. However, in the CD-focus curve obtained at this point does not take such transformation into account yet.

$$y_n = C_a(x-\alpha_n)^{10} + C_b(x-\alpha_n)^8 + C_c(x-\alpha_n)^6 + C_d(x-\alpha_n)^4 + C_e(x-\alpha_n)^2 + C_f + \beta_n \qquad (23)$$

On obtaining $\beta_n$, instead of using the above equation (22), the following equation (24) can also be used.

$$\beta_n = \sum_{i=1}^{37} \sum_{j=i}^{37} S\beta_{i,j} C_{n,i} C_{n,j} \qquad (24)$$

Figure 22A:
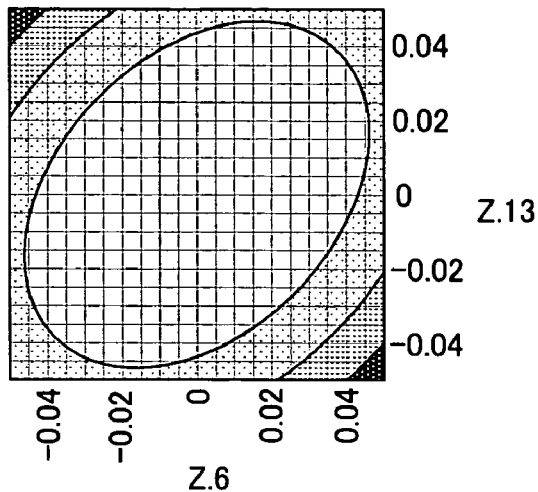
FIG. 22A is a view showing cross talk of $Z_6$ and $Z_{13}$.
Figure 22B:
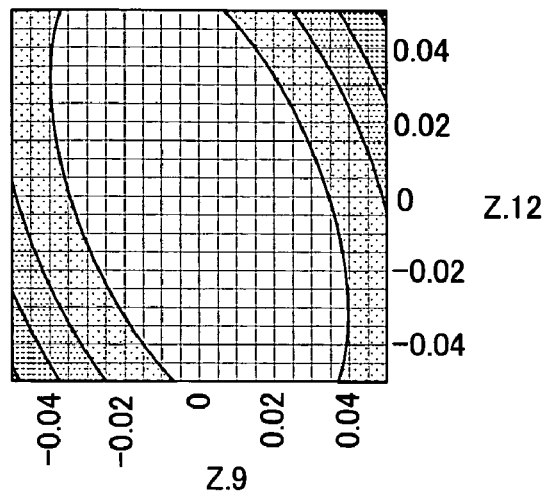
FIG. 22B is a view showing cross talk of $Z_9$ and $Z_{12}$.
Figure 23:
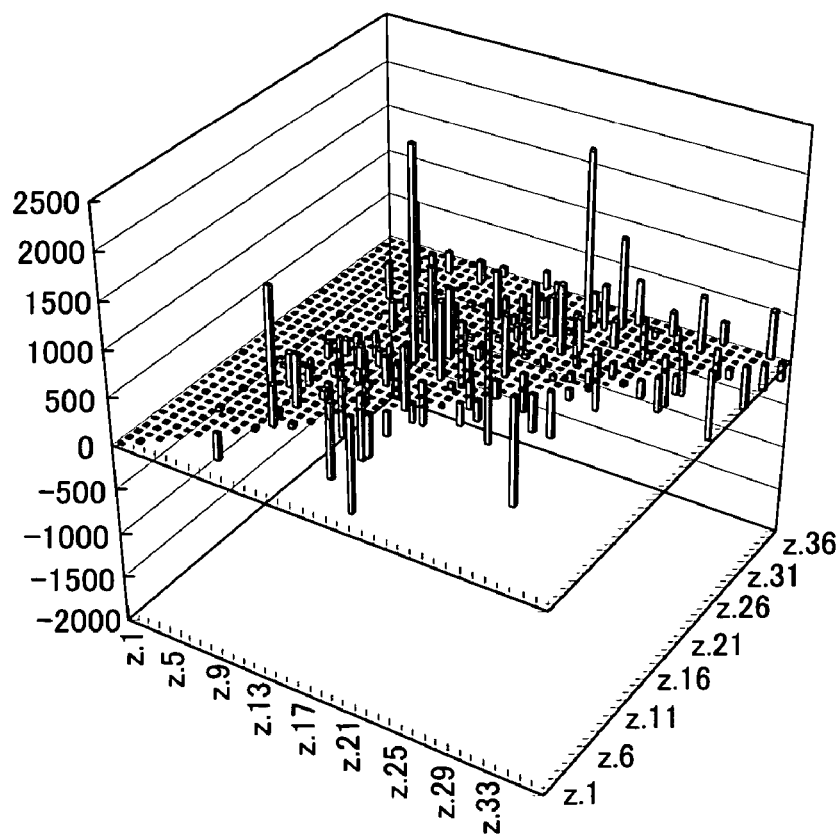
FIG. 23 is a graph showing an example of the sensitivity of each cross term.

Equation (24) described above is an extension of equation (22), which is extended so that the product of different Zernike terms, that is, the cross-terms previously referred to, is taken into consideration. That is, the line width of the pattern image is affected not only by the square of each Zernike term component, but also by the cross-term. Depending on the aberration combination, as is shown in FIGS. 22A and 22B, the line width distribution may take the form of an inclined elliptic shape (FIG. 22A shows the relation between Z.6 and Z.13, whereas FIG. 22B shows the relation between Z.9 and Z.12). In this case, the cross-term of such aberration combination is sensitive to line width variation. FIG. 23 shows the sensitivity of each cross-term to the line width of the line pattern (cross talk). In equation (24), when the same value as $S\beta_i$ in equation (22) is substituted into $S\beta_{i,j}$ (i=j), and two terms are extracted in equation (24), for example, the equation can be written in the following form (equation (25)).

$$\beta_n = S\beta_{i,i} C_{n,i}^2 + S\beta_{i,j} C_{n,i} C_j + S\beta_{j,j} C_{n,j}^2 \qquad (25)$$

This shows that the inclined elliptic shaped distribution is possible, as the ones shown in FIGS. 22A and 22B. When cross-term calculation is actually performed, it can be confirmed that cross-term is present in between a large number of terms.

As is obvious from the description so far, the influence of a Zernike term of an aberration on a CD-focus curve can be expressed as the movement of the CD-focus curve in the focus direction and as the variation in the maximum line width.

Figure 24:
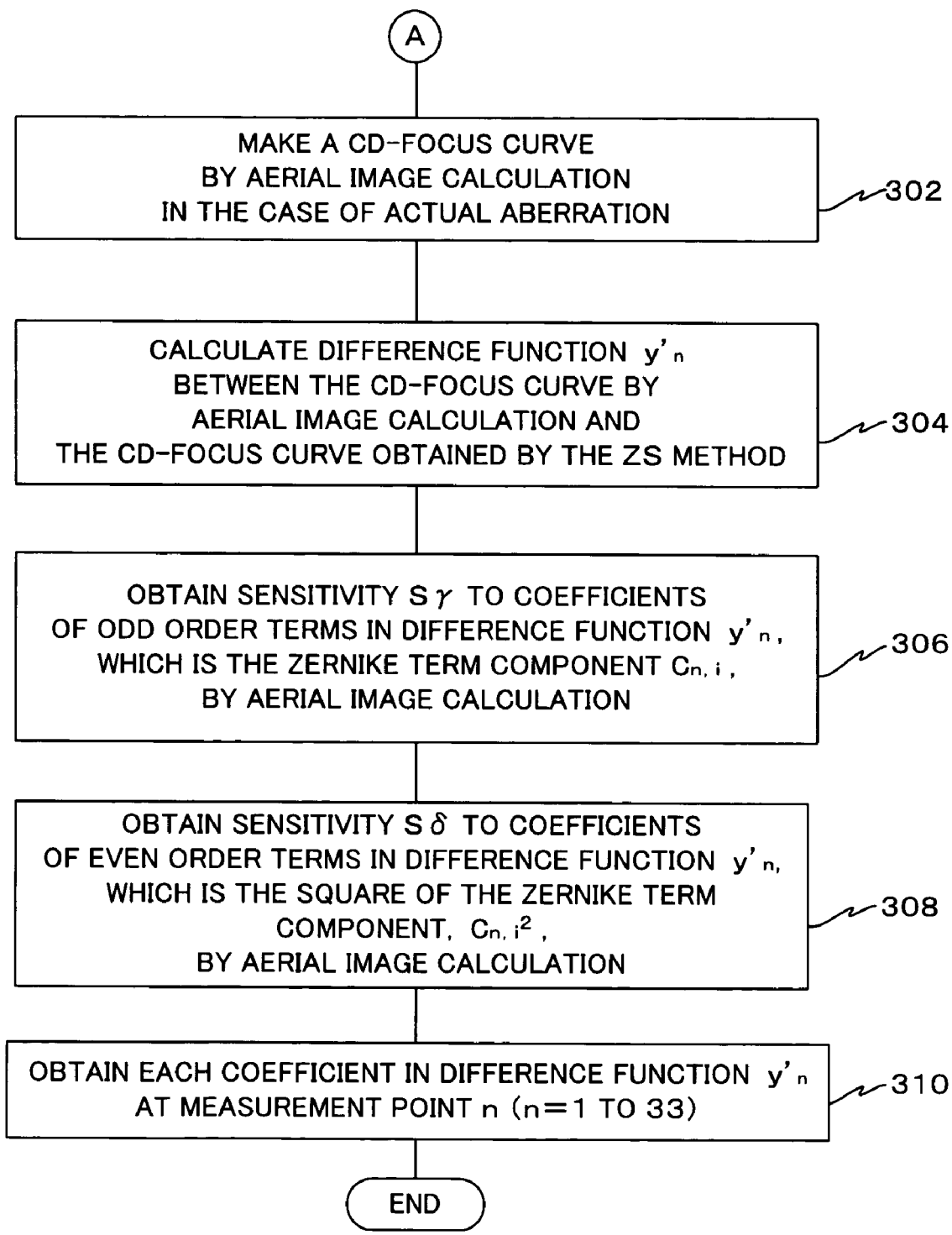
FIG. 24 is a flow chart (No. 2) showing a prediction method in an embodiment.

Next, in step 302 in FIG. 24, by aerial image calculation using the image forming simulator, simulation computer 46 obtains the CD-focus curve for each measurement point of projection optical system PL in a state where there actually is aberration in projection optical system PL. Information related to the actual aberration may be obtained, by taking out information on wavefront aberration previously obtained from storage unit 42 via main controller 50.

Next, in step 304, simulation computer 46 performs approximation by a fifth-order function as is shown in equation (26) below, on a difference function $y'_n$, which is a function expressing the difference between the CD-focus curve calculated by the image forming simulator in step 302 described above and the CD-focus curve calculated using equation (23) also descried above.

$$y'_n = \gamma 5_n(x-\alpha_n)^5 + \delta 4_n(x-\alpha_n)^4 + \gamma 3_n(x-\alpha_n)^3 + \delta 2_n(x-\alpha_n)^2 + \gamma 1_n(x-\alpha_n) \qquad (26)$$

In the equation above, $\gamma 5_n$, $\delta 4_n$, $\gamma 3_n$, $\delta 2_n$, and $\gamma 1_n$ are the coefficients of the terms of each order in the fifth-order function $\gamma'_n$.

These coefficients $\gamma 5_n$, $\delta 4_n$, $\gamma 3_n$, $\delta 2_n$, and $\gamma 1_n$ can also be expressed in a linear combination of terms that have the Zernike term component $C_{n,i}$. To be more specific, the odd order terms (hereinafter also referred to as 'odd terms') $\gamma 5_n$, $\gamma 3_n$, and 65 $1_n$ can be expressed in a linear combination of each Zernike term component $C_{n,i}$, and the even order terms (hereinafter also referred to as 'even terms') $\delta 4_n$ and $\delta 2_n$ can be expressed in a linear combination of the square of each Zernike term component $C_{n,i}^2$.

Figure 25:
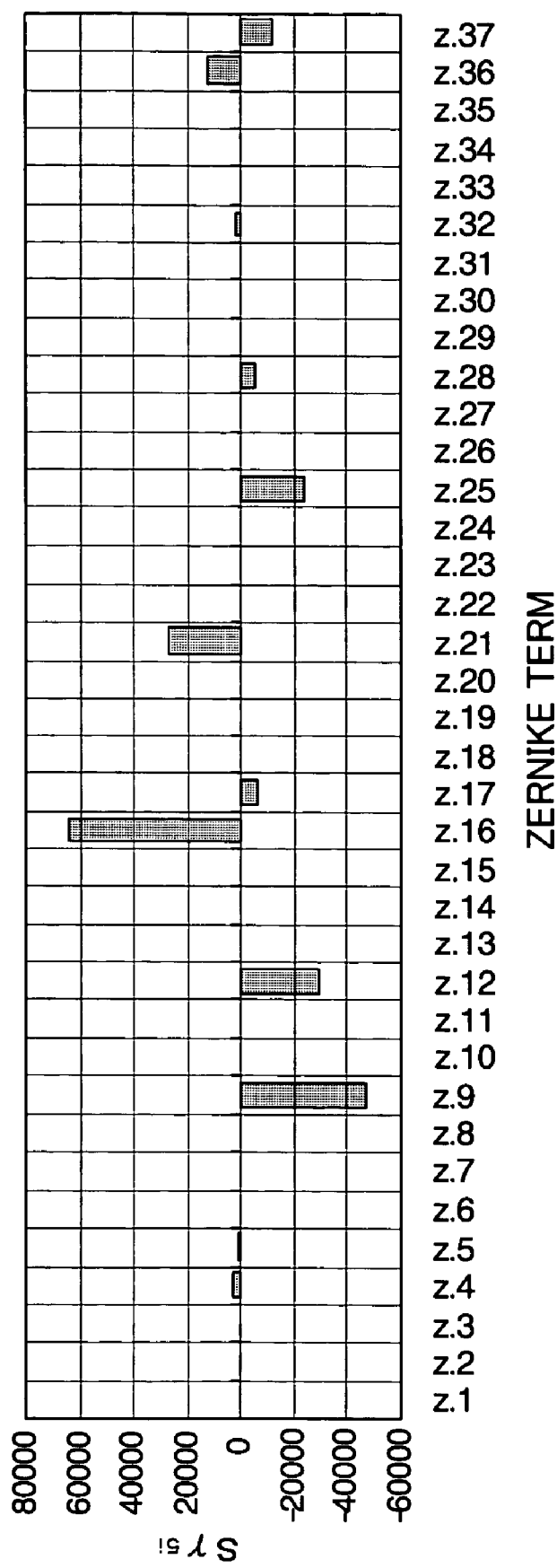
FIG. 25 is a view showing an example of the sensitivity of the Zernike term sensitivity $S\gamma_{5i}$.
Figure 26:
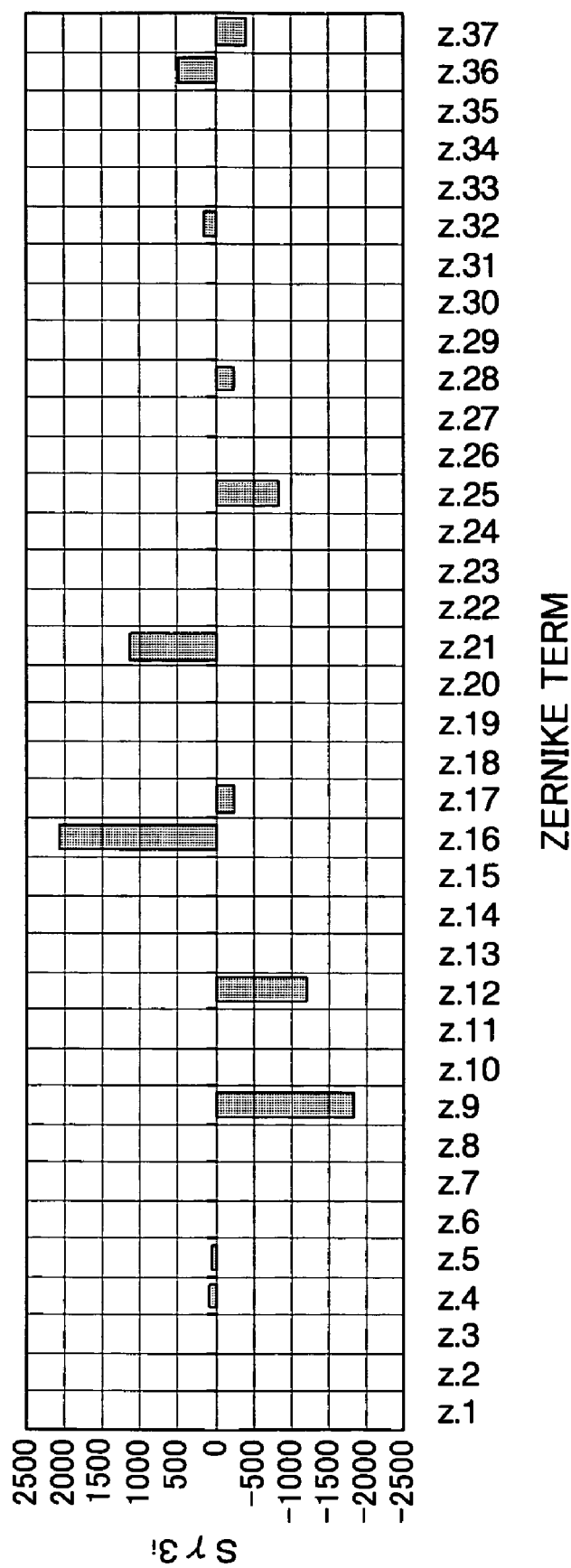
FIG. 26 is a view showing an example of the sensitivity of the Zernike term sensitivity $S\gamma_{3i}$.
Figure 27:
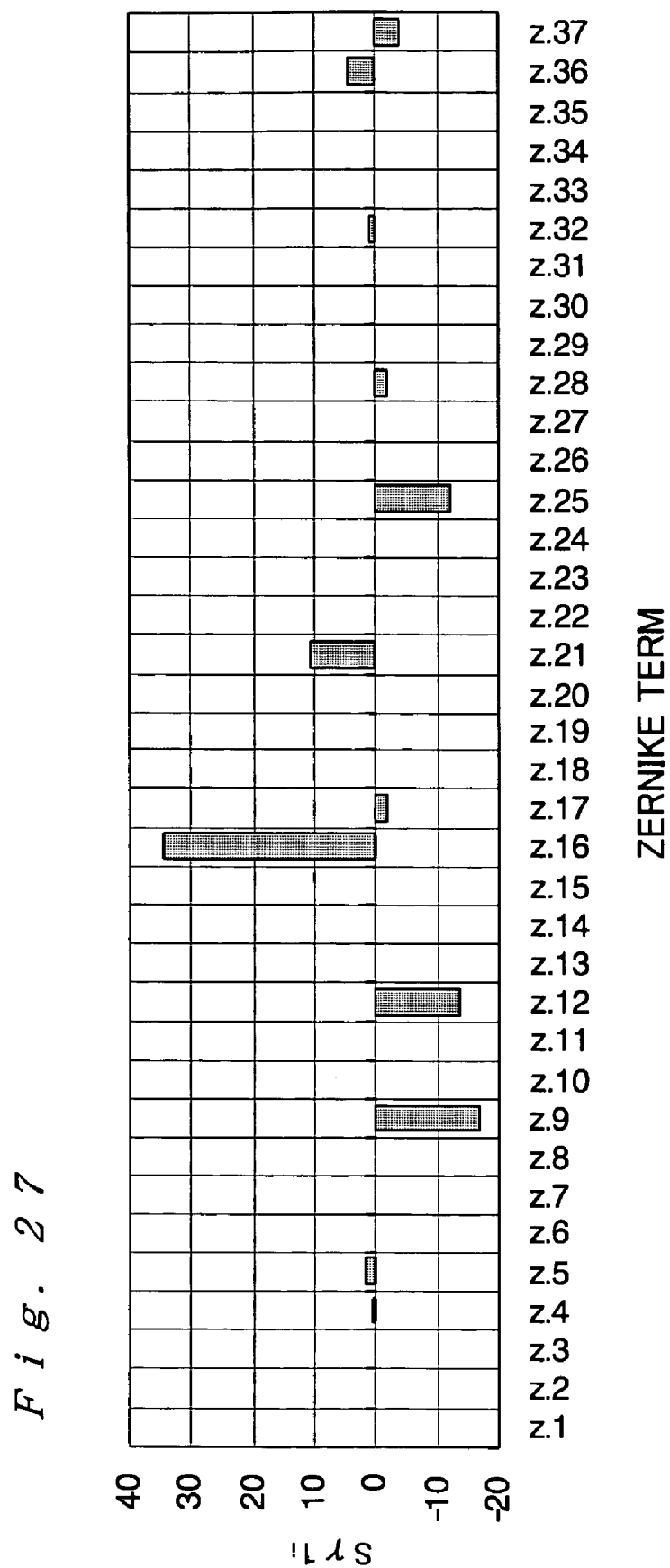
FIG. 27 is a view showing an example of the sensitivity of the Zernike term sensitivity $S\gamma_{1i}$.

Therefore, in the next step, step 306, simulation computer 46 focuses on the odd terms of the function $y'_n$ shown in equation (26), and obtains sensitivity $S\gamma_{5i}$, $S\gamma_{3i}$, and $S\gamma_{1i}$ of the Zernike terms corresponding to the fifth, third and first order coefficients $\gamma 5_n$, $\gamma 3_n$, and $\gamma 1_n$ by aerial image calculation. FIGS. 25 to 27 show examples of sensitivity $S\gamma_{5i}$, $S\gamma_{3i}$, and $S\gamma_{1i}$ of such Zernike terms.

Figure 28:
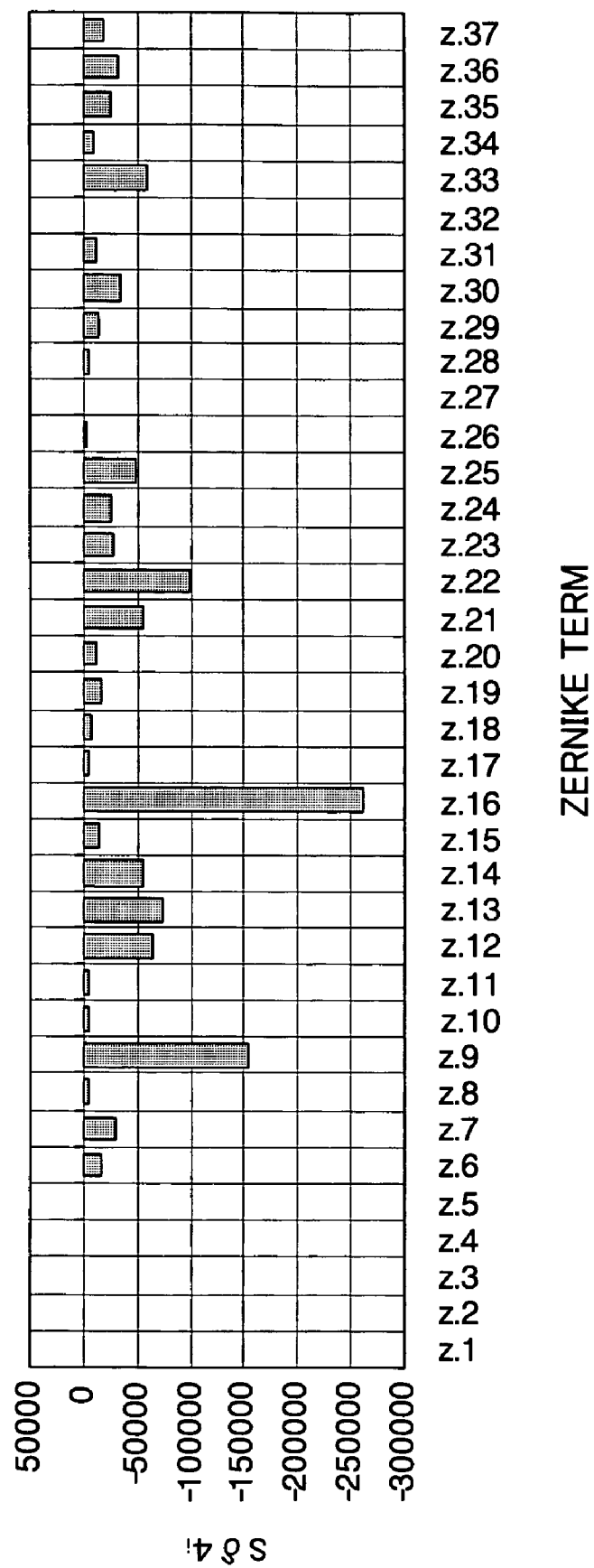
FIG. 28 is a view showing an example of the sensitivity of the Zernike term sensitivity $S\delta_{4i}$.
Figure 29:
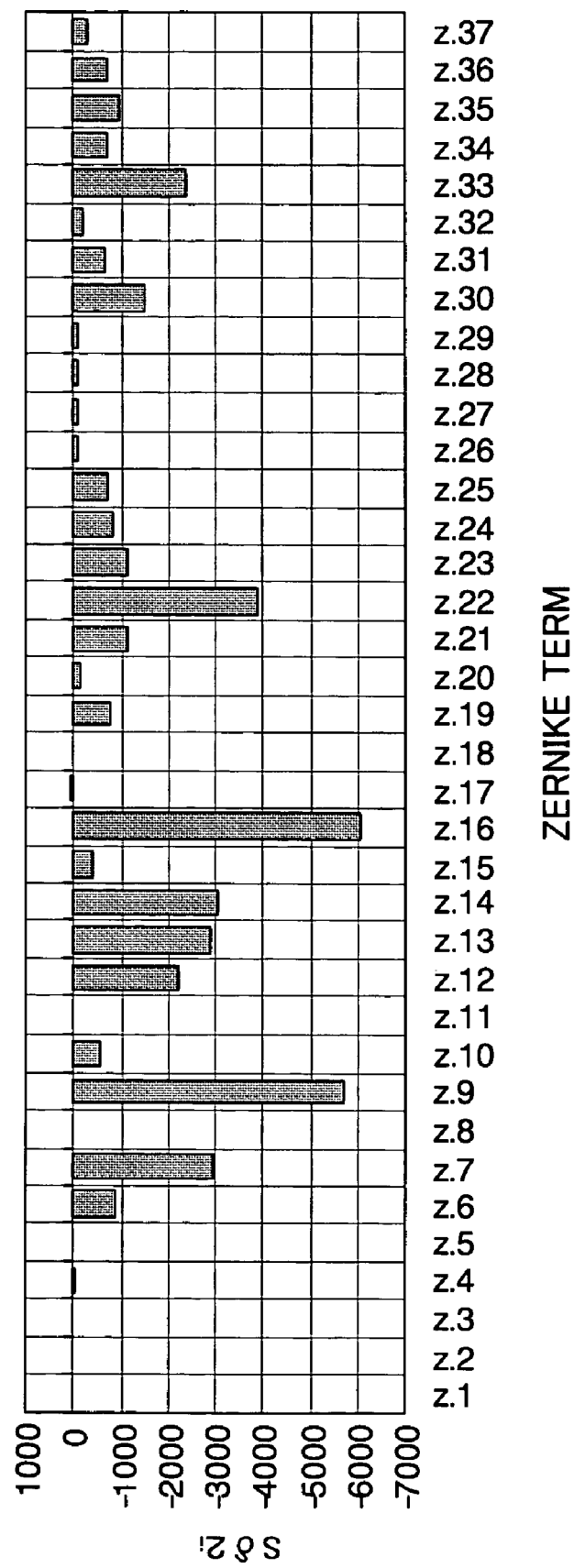
FIG. 29 is a view showing an example of the sensitivity of the Zernike term sensitivity $S\delta_{2i}$.

In the next step, step 308, simulation computer 46 46 focuses on the even terms of the function $y'_n$, and obtains sensitivity $S\delta_{4i}$ and $S\delta_{2i}$ of the square of each of the Zernike term components corresponding to the fourth and second order coefficients $\delta 4_n$ and $\delta 2_n$ by aerial image calculation. FIGS. 28 and 29 show examples of sensitivity $S\delta_{4i}$ and $S\delta_{2i}$ of the square of such Zernike term components.

Then, in step 310, simulation computer 46 obtains the fifth, third and first order coefficients $\gamma 5_n$, $\gamma 3_n$, and $\gamma 1_n$ and the fourth and second order coefficients $\delta 4_n$ and $\delta 2_n$ at measurement points n (n=1 to 33) of projection optical system PL in the current aberration state, using the following equations, equations (27) and (28).

$$\gamma 5_n = \sum_{i=1}^{37} S\gamma_{5,i} C_{n,i},\ \gamma 3_n = \sum_{i=1}^{37} S\gamma_{3,i} C_{n,i},\ \gamma 1_n = \sum_{i=1}^{37} S\gamma_{1,i} C_{n,i} \quad (27)$$

$$\delta 4_n = \sum_{i=1}^{37} S\delta_{4,i} C_{n,i}^2,\ \delta 2_n = \sum_{i=1}^{37} S\delta_{2,i} C_{n,i}^2 \quad (28)$$

With the operation above, the coefficients of the terms of each order in a function $y''_n$ ($=y_n+y'_n$), which is the sum of function $y_n$ expressed in equation (23) and function $y'_n$ expressed in equation (26), are calculated, which means that the prediction of the CD-focus curves (that take into consideration the transformation referred to earlier) at measurement point n (n=1 to 33) has been completed.

Figure 30:
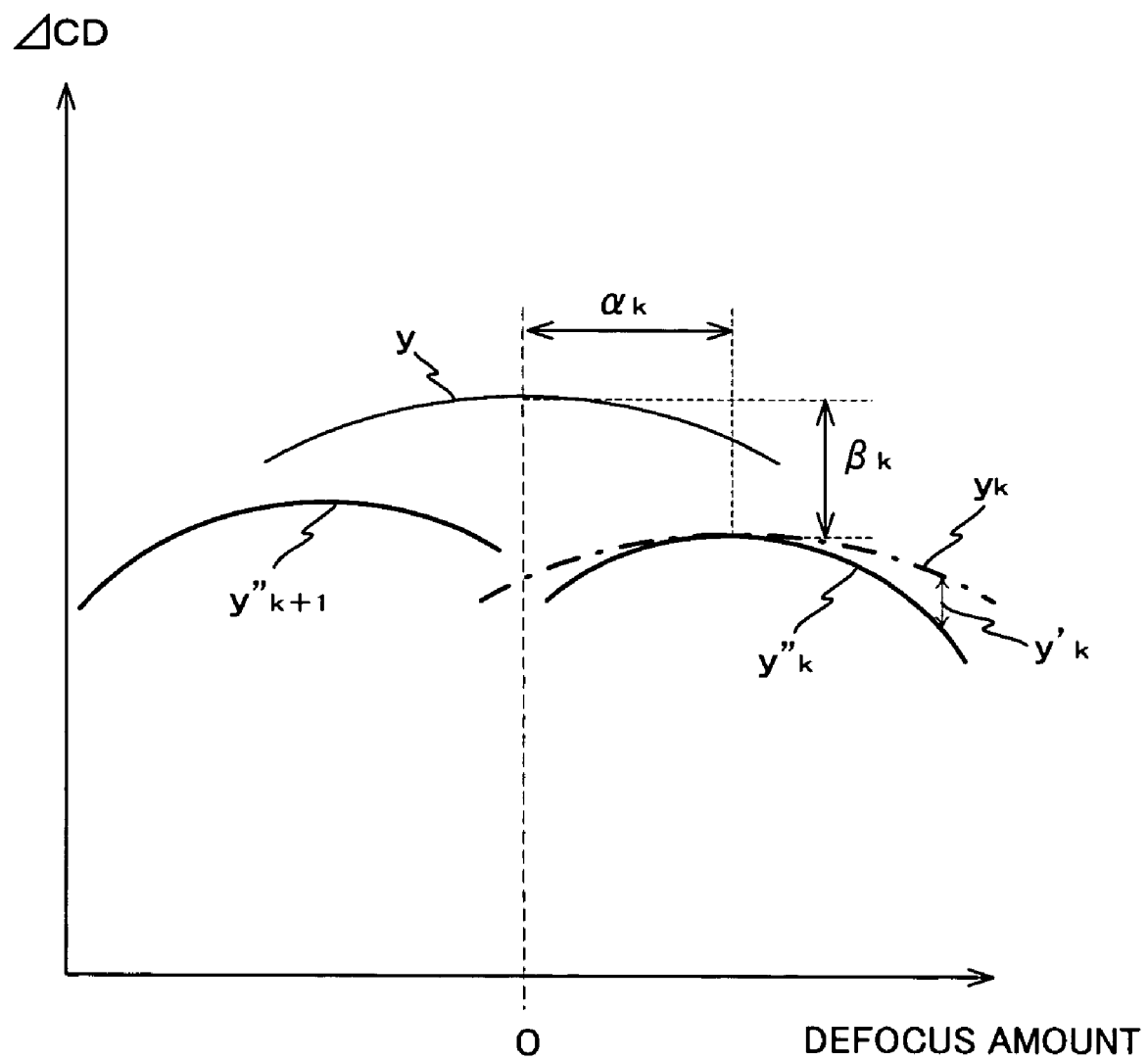
FIG. 30 is a model diagram showing an operation when obtaining CD-focus curves $y''_k$ and $y''_{k+1}$.

FIG. 30 shows a model diagram when at measurement point k and k+1 (k=1 to 32) representatively shown from among each measurement point n (n=1 to 33), CD-focus curves $y''_k$ and $y''_{k+1}$ are obtained under set exposure conditions. As is shown in FIG. 30, in the prediction method in this embodiment, by performing the steps 202 to 310 described above, function $y''_k$ at measurement point k is predicted, by approximating the CD-focus curve that shows the case when no aberration is assumed in projection optical system PL using a tenth-order function y, by shifting the tenth-order function y by $\alpha_k$ and $\beta_k$ in the defocus amount (horizontal axis) direction and line width (vertical axis) direction that are obtained by linear combination of Zernike term component $C_{k,i}$ at measurement point k, respectively, and by further transforming it by the fifth order function $y''_k$. As is previously described, the wavefront on the pupil plane of projection optical system PL differs depending on the measurement point, therefore, Zernike term component $C_{n,i}$ also differs depending on the measurement point. Accordingly, $y''_k$ and $y''_{k+1}$ described above, consequently are different curves.

Figure 31A:
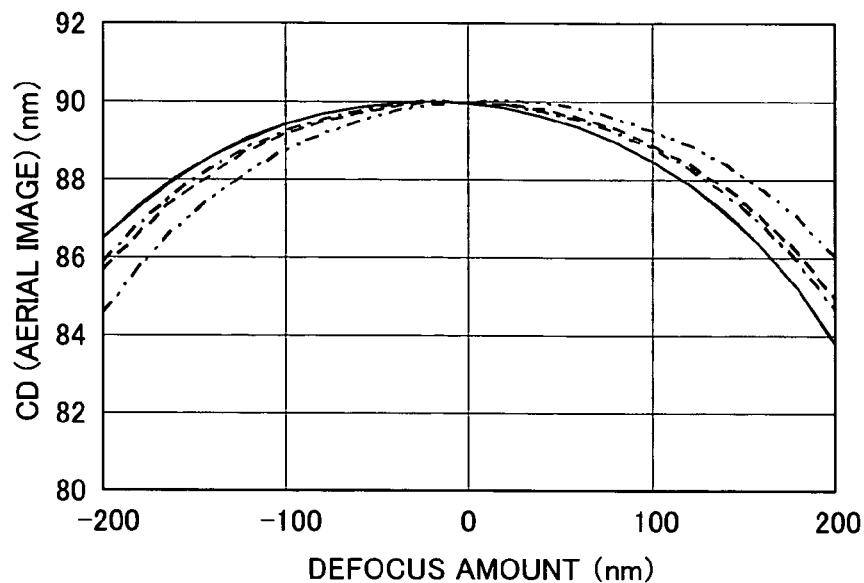
FIG. 31A is a view showing an example of a CD-focus curve calculated by a precise image forming simulation at representative measurement points.
Figure 31B:
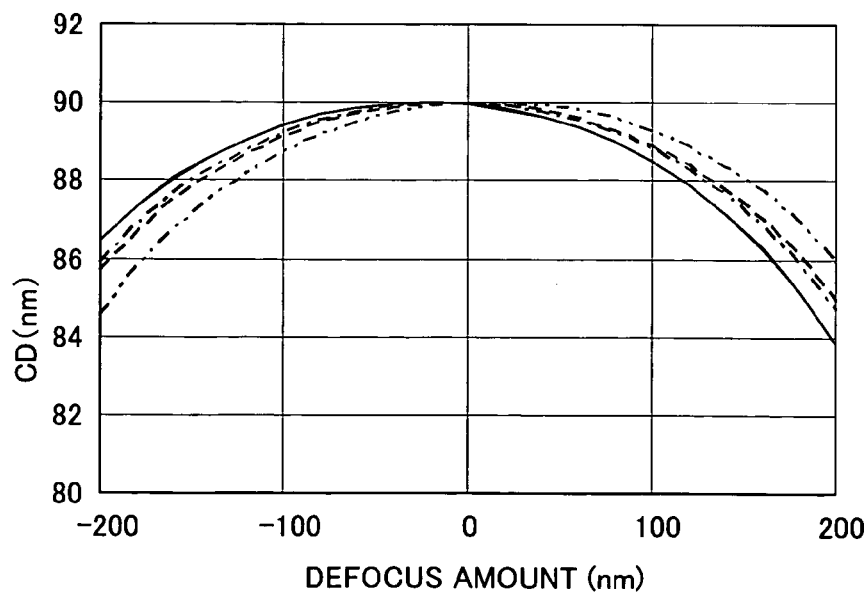
FIG. 31B is a view showing an example of a CD-focus curve predicted using a prediction method in an embodiment of the present invention, under the same exposure conditions using the same patterns at the representative measurement points.

FIG. 31A shows an example of the CD-focus curve at measurement points 1, 11, 17, and 33 that are calculated by a precise image forming simulation, whereas FIG. 31B shows an example of the CD-focus curve at measurement points 1, 11, 17, and 33 that are predicted using the prediction method described above, under the same exposure conditions using the same patterns. As is indicated in FIGS. 31A and 31B, the CD-focus curve obtained by image forming simulation and the CD-focus curve predicted by the prediction method described above coincides considerably at each measurement point, and it is obvious that the CD-focus curve is predicted with good precision. That is, when the prediction method described above is executed, then, it becomes possible to predict the CD-focus curve with good precision when transferring a predetermined pattern under predetermined exposure conditions.

Figure 32:
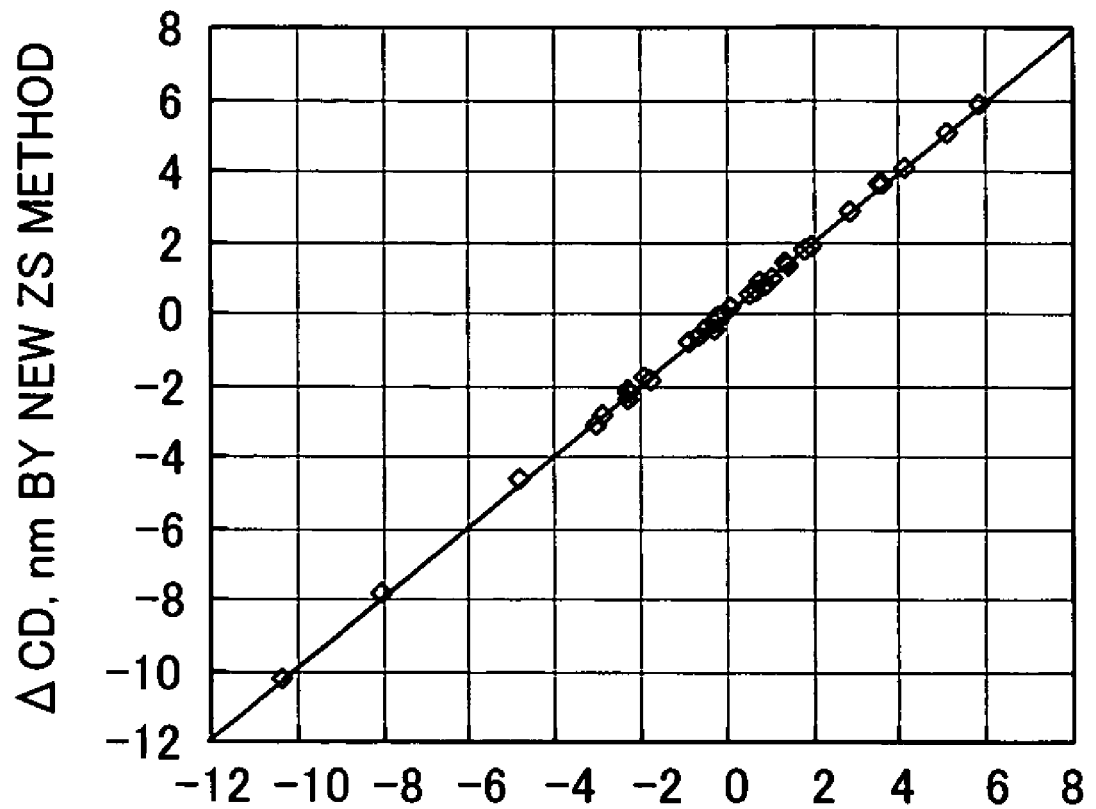
FIG. 32 is a view showing a relation between calculation results of line width dispersion ΔCD using a new ZS method and calculation results from an aerial image.

FIG. 32 is a graph related to line width dispersion $\Delta CD$, showing a relation between calculation results using the new ZS method described above and the method of providing a suitable wavefront aberration and directly calculating an aerial image. As is obvious when comparing FIG. 32 and FIG. 15 referred to earlier, errors are significantly reduced by the new ZS method.

As is obvious also from FIG. 32, expanding the new ZS method allows the line width to be accurately calculated, even without performing aerial image calculation by image forming simulation.

In the steps 202 to 310 referred to above, the description was made based on a premise of an operator or the like intervening in the operations, however, it is, of course, possible for the operator or the like to only specify exposure conditions or the like (perform step 202), and the processing from step 204 onward may be performed by simulation computer 46 (or simulation computer 46 may be linked with other computers). Or, instead of the operator or the like performing the operations, a host computer or the like may give out instructions. Such variations can be easily performed, by changing the software program.

Programs that make computers such as simulation computer 46 perform processing other than specifying conditions such as exposure conditions described above can be subject to transfer (such as distribution), in a state recorded in an information storage medium, such as, for example, a CD (compact disc), a DVD (digital versatile disc), an MO (magneto-optical disc), or an FD flexible disc). As a matter of course, they can be transferred as digital contents via a telecommunication circuit such as the Internet.

<<Evaluation Method>>

In exposure apparatus 100, characteristics of a projected image (or a transferred image) of a pattern can be evaluated using the CD-focus curve at measurement point 1 up to measurement n predicted in the manner described above. For example, as is described above, on the object surface side of projection optical system PL, a case can be assumed where an isolated line pattern is arranged at a position corresponding to measurement point 1 up to measurement n and the CD-focus curve is predicted for each measurement point. And, when the CD-focus curve is predicted for each measurement point, based on the deviation of the CD-focus curve at each measurement point, characteristics of the image of the isolated line pattern in exposure area IA, such as the uniformity within the surface, can be evaluated.

In addition, a case can be assumed where a reticle $R_T$ on which line patterns orthogonal to each other are arranged at a position corresponding to measurement point 1 up to measurement n as is shown in FIG. 5, and when the CD-focus curve is predicted for the vertical line pattern and the horizontal line pattern by executing steps 202 to 310 described above, respectively, the CD-focus curve of the vertical line pattern and horizontal line pattern like the one shown in FIG. 8 can be made, which allows the vertical and horizontal line difference at each measurement point to be evaluated, based on the difference of the CD-focus curve.

That is, the Zernike sensitivity of the images of the vertical line and horizontal line to the CD (line width) variation is obtained, respectively, and the cross-term Zernike sensitivity $S\beta_{i,j}$ (i≠j) is obtained, which is a combination of aberration (Zernike term). Then, the combination in which the sign differs between the vertical line and horizontal line can be picked up as an aberration (Zernike term) combination that affects the VH difference. The reason for this is because the terms other than the $2^{nd}$ term in equation (25) are the same value in the V-line and the H-line, in the calculation VH difference=$\Delta CD(V)-\Delta CD(H)$ as well, when the sign of cross-term sensitivity $S\beta_{i,j}$ (i≠j) differs in the vertical line and the horizontal line, $\beta_n$ affects the line width difference.

In addition, a case can be assumed where an L/S pattern is respectively arranged at a position corresponding to measurement point 1 up to measurement n, and the CD-focus curve is predicted for the line pattern images of the L/S pattern image on both sides, which allows the line difference of the images on both ends at each measurement point to be evaluated, based on the difference of the CD-focus curve, and this allows, for example, evaluation of coma in projection optical system PL.

When the equations (21), (22)(or (24)), (27), and (28) that have been described so far are put together in a matrix, it can be expressed as in the following equation, (29).

$$\begin{bmatrix} \alpha_1 \\ \vdots \\ \alpha_{33} \\ \beta_1 \\ \vdots \\ \beta_{33} \\ \gamma 5_1 \\ \vdots \\ \gamma 5_{33} \\ \gamma 3_1 \\ \vdots \\ \gamma 3_{33} \\ \gamma 1_1 \\ \vdots \\ \gamma 1_{33} \\ \delta 4_1 \\ \vdots \\ \delta 4_{33} \\ \delta 2_1 \\ \vdots \\ \delta 2_{33} \end{bmatrix} = \begin{bmatrix} W\alpha & 0 & 0 & 0 & 0 & 0 & 0 \\ 0 & W\beta & 0 & 0 & 0 & 0 & 0 \\ 0 & 0 & W\gamma & 0 & 0 & 0 & 0 \\ 0 & 0 & 0 & W\gamma & 0 & 0 & 0 \\ 0 & 0 & 0 & 0 & W\gamma & 0 & 0 \\ 0 & 0 & 0 & 0 & 0 & W\delta & 0 \\ 0 & 0 & 0 & 0 & 0 & 0 & W\delta \end{bmatrix} \begin{bmatrix} S\alpha_1 \\ \vdots \\ S\alpha_{37} \\ S\beta_{1,1} \\ \vdots \\ S\beta_{37,37} \\ S\gamma_{5,1} \\ \vdots \\ S\gamma_{5,37} \\ S\gamma_{3,1} \\ \vdots \\ S\gamma_{3,37} \\ S\gamma_{1,1} \\ \vdots \\ S\gamma_{1,37} \\ S\delta_{4,1} \\ \vdots \\ S\delta_{4,37} \\ S\delta_{2,1} \\ \vdots \\ S\delta_{2,37} \end{bmatrix} \quad (29)$$

Wα, Wβ, Wγ, and Wδ are expressed in the following manner.

$$W\alpha = W\gamma = \begin{bmatrix} C_{1,1} & \cdots & C_{1,37} \\ \vdots & \ddots & \vdots \\ C_{33,1} & \cdots & C_{33,37} \end{bmatrix}$$

$$W\beta = \begin{bmatrix} C_{1,1}^2 & C_{1,2}^2 & \cdots & C_{1,37}^2 \\ \vdots & & \ddots & \vdots \\ \vdots & & & \ddots & \vdots \\ C_{33,1}^2 & C_{33,2}^2 & \cdots & C_{33,37}^2 \end{bmatrix} \text{ or } \begin{bmatrix} C_{1,1}^2 & C_{1,2}C_{1,1} & \cdots & C_{1,37}^2 \\ \vdots & & \ddots & \vdots \\ \vdots & & & \ddots & \vdots \\ C_{33,1}^2 & C_{33,2}C_{33,1} & \cdots & C_{33,37}^2 \end{bmatrix}$$

$$W\delta = \begin{bmatrix} C_{1,1}^2 & C_{1,2}^2 & \cdots & C_{1,37}^2 \\ \vdots & & \ddots & \vdots \\ \vdots & & & \ddots & \vdots \\ C_{33,1}^2 & C_{33,2}^2 & \cdots & C_{33,37}^2 \end{bmatrix}$$

The matrix of Wβ is different, depending on which equation to choose, equation (22) or equation (24). Equation (29) described above can be summed as follows.

$$f = Wa \cdot ZS \quad (30)$$

In this case, f is a matrix of each coefficient in the CD-focus curve, Wa is a matrix related to wavefront aberration, and ZS is a matrix related to Zernike sensitivity.

<<Adjustment Method>>

Next, after performing the prediction method of the CD-focus curve described above, and the evaluation method for evaluating the transferred state of a pattern in exposure apparatus 100 based on the CD-focus curve predicted by such prediction method, an adjustment method for adjusting a transferred state of the pattern based on the evaluation results will be described. In this case, the adjustment will be performed with the purpose of increasing the uniformity within the surface of the image of the isolated line pattern set in step 102 previously described.

As is previously described, even if the patterns corresponding to each measurement point n (n=1 to 33) are all uniform, if deviation occurs in the CD-focus curves of each of the measurement points, the pattern image formed at the measurement point will not be uniform. Therefore, in the adjustment method in the embodiment, the transferred state of the pattern in exposure apparatus 100 is adjusted so as to make the CD focus curves at each measurement point predicted in the manner described above uniform as much as possible. Following is a description of the adjustment method, however, first of all, the basis of the calculation equation that is to be used will be described.

In order to unify the CD-focus curves at each measurement point n (n=1 to 33), the 19 parameters that have been described earlier are to be adjusted so that $\alpha_n$, $\beta_n$, $\gamma 5_n$, $\delta 4_n$, $\gamma 3_n$, $\delta 2_n$, and $\gamma 1_n$, which were obtained in the manner previously described, are possibly the same at each measurement point. Therefore, by setting the target values of $\alpha_n$, $\beta_n$, $\gamma 5_n$, $\delta 4_n$, $\gamma 3_n$, $\delta 2_n$, and $\gamma 1_n$ the same for each measurement point n (n=1 to 33), the adjustment amount of adjustment parameters that can bring $\alpha_n$, $\beta_n$, $\gamma 5_n$, $\delta 4_n$, $\delta 3_n$, $\delta 2_n$, and $\gamma 1_n$ closer to their target values is calculated.

When the adjustment parameters are each adjusted in the manner described above, it changes wavefront aberration or the like in projection optical system PL. When the variation of each element of matrix Wa referred to above (that is, the terms including $C_{n,i}$ (i=1 to 37)) per unit adjustment amount of the 19 adjustment parameters (the parameters referred to as adjustment parameter PARA1 to PARA19) at measurement point n (n=1 to 33) are expressed, respectively, as matrices PARA1P' to PARA19P', for example, PARA1P' can be expressed as follows.

$$PARA1P' = \begin{bmatrix} W\alpha' & 0 & 0 & 0 & 0 & 0 & 0 \\ 0 & W\beta' & 0 & 0 & 0 & 0 & 0 \\ 0 & 0 & W\gamma' & 0 & 0 & 0 & 0 \\ 0 & 0 & 0 & W\gamma' & 0 & 0 & 0 \\ 0 & 0 & 0 & 0 & W\gamma' & 0 & 0 \\ 0 & 0 & 0 & 0 & 0 & W\delta' & 0 \\ 0 & 0 & 0 & 0 & 0 & 0 & W\delta' \end{bmatrix} \quad (31)$$

Wα', Wβ', Wγ', and Wδ', however, are expressed as follows.

$$W\alpha' = W\gamma' = \begin{bmatrix} Z_{1,1} & \cdots & Z_{1,37} \\ \vdots & \ddots & \vdots \\ Z_{33,1} & \cdots & Z_{33,37} \end{bmatrix}$$

$$W\beta' = \begin{bmatrix} Z_{1,1}^2 & Z_{1,2}^2 & \cdots & Z_{1,37}^2 \\ \vdots & \ddots & & \vdots \\ \vdots & & \ddots & \vdots \\ Z_{33,1}^2 & Z_{33,2}^2 & \cdots & Z_{33,37}^2 \end{bmatrix} \text{ or } \begin{bmatrix} Z_{1,1}^2 & Z_{1,2}Z_{1,1} & \cdots & Z_{1,37}^2 \\ \vdots & \ddots & & \vdots \\ \vdots & & \ddots & \vdots \\ Z_{33,1}^2 & Z_{33,2}Z_{33,1} & \cdots & Z_{33,37}^2 \end{bmatrix}$$

$$W\delta' = \begin{bmatrix} Z_{1,1}^2 & Z_{1,2}^2 & \cdots & Z_{1,37}^2 \\ \vdots & \ddots & & \vdots \\ \vdots & & \ddots & \vdots \\ Z_{33,1}^2 & Z_{33,2}^2 & \cdots & Z_{33,37}^2 \end{bmatrix}$$

In this case, $Z_{n,i}$ (n=1 to 33, i=1 to 37) included in each of the elements in each of the matrices $W\alpha'$, $W\beta'$, $W\gamma'$, and $W\delta'$, is the variation in $C_{n,i}$ at measurement point n in adjustment parameter PARA1.

Accordingly, as is shown in equation (32) below, when matrix PARA1Pn' is multiplied by a column vector ZS whose element is the sensitivity of each of the coefficients referred to above, a column vector B'[1] can be obtained, which is a variation amount (for example, $\alpha_n^{(P1)}$) of a coefficient at measurement point n per unit adjustment amount of adjustment parameter PARA1.

$$B'[1] = PARA1P' \cdot ZS = \begin{bmatrix} \alpha_1^{(P1)} \\ \vdots \\ \alpha_{33}^{(P1)} \\ \beta_1^{(P1)} \\ \vdots \\ \beta_{33}^{(P1)} \\ \gamma 5_1^{(P1)} \\ \vdots \\ \gamma 5_{33}^{(P1)} \\ \gamma 3_1^{(P1)} \\ \vdots \\ \gamma 3_{33}^{(P1)} \\ \gamma 1_1^{(P1)} \\ \vdots \\ \gamma 1_{33}^{(P1)} \\ \delta 4_1^{(P1)} \\ \vdots \\ \delta 4_{33}^{(P1)} \\ \delta 2_1^{(P1)} \\ \vdots \\ \delta 2_{33}^{(P1)} \end{bmatrix} \quad (32)$$

Similarly, also for adjustment parameters PARA2' to PARA19', column vectors B'[2] to B'[19] can be obtained, which are a variation amount of a coefficient at measurement point n per unit adjustment amount.

In this case, the column vector of the adjustment amount of each adjustment parameter is to be shown as column vector P, as in equation (33) below.

$$P = \begin{bmatrix} ADJ1 \\ ADJ2 \\ \vdots \\ ADJ19 \end{bmatrix} \quad (33)$$

Variation f' of the coefficient in the CD-focus curve with respect to the adjustment amount of adjustment parameters PARA1 to PARA19, is expressed as in equation (34) below.

$$f' = ADJ1 \cdot B'[1] + ADJ2 \cdot B'[2] + \ldots ADJ19 \cdot B'[19] \quad (34)$$

In this case, the pattern at each measurement point is unified by performing the calculation shown below, using the relation described above between the adjustment amount of the adjustment parameter and the coefficient of the CD-focus curve. That is, when the column vector of the target value of each coefficient in the CD-focus curve is expressed as $f_t$, the column vector of each current coefficient is expressed as f, and the matrix formed by linear combination of column vectors B'[1] to B'[19] is expressed as B, then their relation can be expressed as in equation (35) below.

$$f_t - f = B \cdot P \quad (35)$$

And, when the above equation is solved by the least squares method, it can be expressed as in equation (36) below.

$$P = (B^T \cdot B)^{-1} \cdot B^T \cdot (f_t - f) \quad (36)$$

In this case, $B^T$ is a transposed matrix of matrix B, and $(B^T \cdot B)^{-1}$ is an inverse matrix of $(B^T \cdot B)$.

In this adjustment method, main controller 50 obtains column vector P of the adjustment amount using equation (36) referred to above, and calculates adjustment amount ADJ1 to ADJ19. In order to obtain column vector P using equation (36), target values of each coefficient in the CD-focus curve at each measurement point, that is, column vector $f_t$ has to be decided. However, because the purpose in this case is to increase surface uniformity of the image of the isolated line pattern, the target values of the coefficient of each order in function $y''_n$ at each measurement point may all be set to the same value.

Next, the adjustment method in the case of adjusting the vertical and horizontal line difference will be described. For this adjustment, similar to the description earlier, a case can be assumed where a measurement pattern of reticle $R_T$ like the one shown in FIG. 5 is arranged at each position corresponding to measurement point 1 up to measurement n, and when the prediction method is performed, the CD-focus curve can be obtained for each line pattern at the same measurement point.

Also in this case, adjustment amount ADJ1 to ADJ19 is calculated using an equation similar to equation (36) above, however, as is previously described, two CD-focus curves are obtained at each measurement point, therefore, the number of elements of coefficient matrix $f_t$ and f becomes two times the number of elements of f (33×7=231) in equation (30) described above, that is, 462, and when the target value of the coefficients corresponding to the vertical line pattern and horizontal line pattern at the same measurement point is set to the same value, it becomes possible to calculate adjustment amount ADJ1 to ADJ19 which can maximally reduce the vertical and horizontal line difference.

Next, according to adjustment amount ADJ1 to ADJ15 stored in storage unit 42, main controller 50 adjusts at least either the position or attitude of movable lens $13_1$ to $13_5$ with image forming quality correction controller 48 in the manner previously described, and with each of the above operations, main controller 50 gives instructions to light source 16 according to adjustment amount ADJ19, and shifts the wavelength of illumination light EL.

In the embodiment, the CD-focus curve at each measurement point after adjustment may be predicted performing steps 202 to 310 described above, in a state where projection optical system PL has already been adjusted, and furthermore, by repeatedly performing the evaluation method and adjustment method described above, the transferred state of the pattern at each measurement point may be sequentially unified by approximation.

<<Exposure Method>>

In the exposure process when manufacturing semiconductor devices, reticle R for device manufacturing is loaded on reticle stage RST, and by operations previously described, exposure based on the step-and-scan method is performed. In exposure apparatus 100 in the embodiment, when the exposure based on the step-and-scan method is performed, the position and attitude of wafer W within exposure area IA are controlled based on the calculated adjustment amount ADJ16 to ADJ18, as is previously described.

In addition, in the embodiment, when the circuit pattern to be actually transferred is changed due to exposure condition setting or reticle R exchange, because the Zernike sensitivity of the terms that each have a Zernike term component shown in FIGS. 18, 21, 23, and 25 to 28 changes, the sensitivity has to be obtained again, and as a matter of course, the above prediction method, evaluation method, and adjustment method also have to be performed again.

As is described in detail, according to the prediction method described above, based on the value obtained by linear combination of a plurality of terms that each have an aberration component $C_{n,i}$ (n=1 to 33, i=1 to 37), which is a series expansion of wavefront aberration W(ρ, θ) in projection optical system PL, the CD-focus curve serving as a variation curve regarding the image of the pattern projected via projection optical system PL can be obtained. Accordingly, it becomes possible to predict the CD-focus curve related to the image of the pattern via projection optical system PL whose aberration is in a predetermined state under predetermined exposure conditions, by a fairly simple calculation of obtaining the linear combination values of terms that each have an aberration component $C_{n\ i}$ (n=1 to 33, i=1 to 37), without using the image forming simulation that requires a time-consuming complicated calculation. And, based on such prediction results, the characteristics of the projected image (or the transferred image) of the pattern can be predicted within a short period of time.

In addition, according to the prediction method, not only is the movement amount of the CD-focus curve calculated, but also the deformed state of the CD-focus curve due to wavefront aberration W(ρ, θ) in projection optical system PL is calculated based on the linear combination of terms that each have an aberration component $C_{n\ i}$ (n=1 to 33, i=1 to 37), which consequently allows a more precise prediction of the CD-focus curve.

In addition, according to the prediction method, the movement of the CD-focus curve in the image size axis direction (line width variation direction) is sensitive not only to the square of each aberration component $C_{n\ i}^2$, but is also sensitive to the cross-terms of different aberration components, therefore, by taking into consideration the linear combination of such cross-terms, it becomes possible to predict the movement amount of the CD-focus curve in the image size axis direction with greater accuracy.

In addition, according to the prediction method, because the coefficient of the odd order term of difference function $y'_n$ that shows the deformed state of the variance function at measurement point n is sensitive to each Zernike term component $C_{n\ i}$ (n=1 to 33, i=1 to 37), which is an expansion of wavefront aberration W(ρ, θ) in projection optical system PL, the coefficient of the odd order term in difference function $y'_n$ can be predicted by linear combination of each Zernike term component $C_{n\ i}$. In addition, since the coefficient of the even order term in difference function $y'_n$ is sensitive to the square of each Zernike term component $C_{n\ i}^2$, the coefficient of the even order term can be predicted by linear combination of the square of each Zernike term component $C_{n\ i}^2$, which allows the deformation of the CD-focus curve to be predicted with good accuracy within a short period of time.

In addition, according to the evaluation method described above, because the CD-focus curve for the image of the predetermined pattern projected via projection optical system PL under predetermined exposure conditions can be predicted with good accuracy within a short period of time for each measurement point within the effective field of projection optical system PL when the above prediction method is used, the characteristics of the image of the predetermined pattern within the effective field of projection optical system PL, such as uniformity, can be evaluated with good precision within a short period of time, based on the CD-focus curve.

In addition, according to the adjustment method that uses this evaluation method, the uniformity of the image of the predetermined pattern within the effective field of projection optical system PL is evaluated using the evaluation method in the embodiment, and the formed state of the image of the predetermined pattern via projection optical system PL is adjusted, based on the evaluation results. Accordingly, depending on the evaluation results, the characteristics of the image of the predetermined pattern can be adjusted to a desired state, such as in the direction so as to improve the uniformity of the transferred image.

In addition, in the prediction method in the embodiment above, a tenth order function that only has even order terms is chosen as the function on which fitting of the CD-focus curve obtained in the case when no aberration occurs in projection optical system PL has been performed. The present invention, however, is not limited to this, and the maximum order of the function subject to the fitting may be equal to or under the eighth order, or may equal or be more than the twelfth order. In any case, the function may be in any form, as long as it is a high order function that only has even order terms.

In addition, in the prediction method in the embodiment above, the difference function $y'_n$ is a fifth-order function. The present invention, however, is not limited to this, and it may be a function in the fourth-order or below, or a function in the sixth-order or above.

In addition, in the prediction method in the embodiment above, the case has been described where the pattern of the measurement reticle arranged corresponding to each measurement point is a pattern in which one vertical line pattern and one horizontal line pattern (that is, an orthogonal pattern) are provided, or is an isolated line pattern. The present invention, however, is not limited to this, and the pattern may be a plurality of parallel line patterns (L/S patterns), or a pattern that is a combination of the orthogonal pattern and the parallel line pattern. In addition, other than the vertical and horizontal lines, the lines may include diagonal line patterns. In the case the L/S pattern is employed, exposure with high precision will be possible when exposure is performed after the line width of the line patterns on both edges of the L/S pattern is predicted with the prediction method in the embodiment, the line width difference, that is, the line width abnormal value is evaluated in the evaluation method in the embodiment, the formed state of the pattern image of the pattern is adjusted based on the evaluation results as in the adjustment method in the embodiment, and the line width abnormal value is reduced.

In addition, in the evaluation method described above in the embodiment, the surface uniformity of the line pattern, the vertical and horizontal line width difference, and the line width abnormal value are set as evaluation items. The present invention, however, is not limited to this, and any items that can be evaluated based on the CD-focus curve can be listed as the evaluation item.

In the evaluation method described above in the embodiment, the case has been described where the CD-focus curve of the image of the predetermined pattern projected via projection optical system PL under predetermined exposure conditions is predicted with good accuracy within a short period of time for each measurement point within the effective field of projection optical system PL, and the characteristics of the image of the predetermined pattern within the effective field of projection optical system PL, such as uniformity, is evaluated, based on the CD-focus curve. The evaluation method in the present invention, however, is not limited to this. That is, information on wavefront aberration of projection optical system PL is obtained, and furthermore, information on the projected image of the pattern is obtained. And, based on such information, the characteristics of the image of the pattern may be evaluated, taking into consideration the Zernike sensitivity of the cross-term of a Zernike term combination whose interaction affects the characteristics of the projected image with respect to the change in the characteristics of the projected image from among a plurality of Zernike terms, which are a series expansion of wavefront aberration using the Zernike polynomial. Even in such a case, because the characteristics of the pattern image is evaluated taking into consideration the Zernike sensitivity of the cross-term of a Zernike term combination whose interaction affects the characteristics of the projected image with respect to the change in the characteristics of the projected image, which has not been considered conventionally, the characteristics of the pattern image can be evaluated with higher precision.

In addition, in the adjustment method described above in the embodiment, the case has been described where the adjustment is performed automatically with image forming quality correction controller 48 under the control of main controller 50, based on the adjustment amount most appropriate that is calculated using equation (36) described above. The present invention, however, is not limited to this, and the image forming quality of the projection optical system may be adjusted manually.

In addition, various modified examples can be considered of the prediction method in the embodiment described above. In addition, in the embodiment above, the case has been described where processing such as the prediction method of the CD-focus curve, the evaluation method for evaluating the transferred pattern in exposure apparatus 100 with the predicted CD-focus curve, the adjustment method for adjusting the transferred state of the pattern according to the evaluation results, and the exposure method in which exposure is performed after the adjustment have been described in series. The present invention, however, is not limited to this, and the processing does not necessarily have to be performed in series, and the prediction method, the evaluation method, and the adjustment method in the present invention can each be performed independently, or by combining certain methods. The evaluation method, the adjustment method, and the exposure method that follow the prediction method in the embodiment above can also be performed after such various modified examples of the prediction method. In addition, after performing the above prediction method, or its modified example, it is a matter of course that other than the evaluation method, the adjustment method, and the exposure method in the embodiment above, various evaluation methods, adjustment methods, and exposure methods can be suitably applied, such as the evaluation method that includes various evaluation items, manual adjustment method, and exposure method based on the step-and-repeat method referred to above.

In the embodiment above, as the wavefront aberration measuring instrument used to measure the wavefront aberration of projection optical system PL, a wavefront aberration measuring instrument whose overall shape is made exchangeable with the wafer holder may be used. In such a case, the wavefront aberration measuring instrument can be automatically carried by the carrier system (such as the wafer loader) that loads/unloads the wafer or wafer holder with respect to wafer stage WST. Furthermore, in the embodiment above, the case has been described where wavefront aberration measuring unit 80 is freely detachable to the wafer stage, however, it may be fixed to the wafer stage. In this case, wavefront aberration measuring unit 80 may partly be set to the wafer stage, and the remaining part may be disposed externally to the wafer stage. Furthermore, in the embodiment above, the aberration of the photodetection optical system of wavefront aberration measuring unit 80 has been ignored, however, the wavefront aberration of the projection optical system may be decided taking the wavefront aberration into account. In addition, for the wavefront aberration measurement, in the case the measurement reticle disclosed in, for example, U.S. Pat. No. 5,978,085 referred to earlier is to be used, the positional deviation of the latent image of the measurement pattern transferred and formed on the resist image of the wafer to the latent image of the reference pattern may be detected by, for example, alignment system ALG in the exposure apparatus. In the case of detecting the latent image of the measurement pattern, as the photosensitive layer of the substrate such as the wafer, a photoresist may be used, or a magnetooptic material may be used. By such various measures, the whole process of adjusting projection optical system PL described earlier can be performed automatically by exposure apparatus 100, without any intervention from an operator or a service engineer.

Furthermore, in the embodiment above, the image forming quality has been adjusted by moving optical elements of projection optical system PL. The present invention, however, is not limited to this, and in addition to, or instead of the drive mechanism, mechanisms such as changing the gas pressure in between optical elements of projection optical system PL, moving or tilting reticle R in the optical axis direction of the projection optical system, or changing the optical thickness of the plane-parallel plate disposed in between the reticle and the wafer may be used. However, in such a case, the number of degrees of freedom in the embodiment above may also be changed. In addition, in the embodiment above, 19 adjustment parameters have been used, however, the number or the type of parameters may be optional, and for example, it does not necessarily have to include the drive amount of the wafer surface (wafer stage WST), or the wavelength shift of illumination light EL.

In the embodiment above, the case has been described where the scanning exposure apparatus is used as the exposure apparatus. The present invention, however, is not limited to this, and for example, the step-and-repeat type exposure apparatus may be used.

The usage of the exposure apparatus in this case is not limited to the exposure apparatus used for manufacturing semiconductor devices, and for example, it can be widely applied to an exposure apparatus for manufacturing liquid crystal displays that transfers a liquid crystal display deice pattern onto a square shaped glass plate, an exposure apparatus for manufacturing display devices such as a plasma display or an organic EL, or for manufacturing devices such as an imaging device (such as a CCD), a thin-film magnetic head, a micromachine, or a DNA chip. In addition, the present invention can also be suitably applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, or an electron beam exposure apparatus.

In addition, the light source of the exposure apparatus in the embodiment above is not limited to a pulsed ultraviolet light source such as an $F_2$ laser, an ArF excimer laser, or a KrF excimer laser, and a continuous light source such as an ultra-high pressure mercury lamp that generates bright lines such as a g-line (wavelength: 436 nm) or an i-line (wavelength: 365 nm) may also be used. Furthermore, as illumination light EL, the X-ray, especially EUV light may be used.

In addition, a harmonic wave may be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Also, the magnification of the projection optical system is not limited to a reduction system, and an equal magnification or a magnifying system may be used. In addition, the projection optical system is not limited to a refraction system, and a catadioptric system that has reflection optical elements and refraction optical elements may be used as well as a reflection system that uses only reflection optical elements. When the catadioptric system or the reflection system is used as projection optical system PL, the image forming quality of the projection optical system is adjusted by changing the position or the like of the reflection optical elements (such as a concave mirror or a reflection mirror) that serve as the movable optical elements previously described. In addition, when especially the $Ar_2$ laser beam or the EUV light or the like is used as illumination light EL, projection optical system PL can be a total reflection system that is made up only of reflection optical elements. However, when the $Ar_2$ laser beam, the EUV light, or the like is used, reticle R also needs to be a reflective type reticle.

When making exposure apparatus 100 or the like, first of all, illumination optical system 12 that includes optical elements such as a plurality of lens elements and mirrors are assembled as a unit, as well as projection optical system PL also being assembled as a unit. In addition, parts such as the reticle stage system and the wafer stage system made up of multiple mechanical parts are also assembled as units. Then, adjustment operations such as optical adjustment, mechanical adjustment, and electrical adjustment are performed so that each of the units assembled above can produce their desired quality. On such adjustments, adjustment can be performed especially on projection optical system PL, using an adjustment method of the characteristics of the pattern via the projection optical system that includes at least a part of the adjustment method of the projection optical system, the prediction method, or the evaluation method that follows.

Next, parts such as illumination optical system 12 and projection optical system PL are assembled into the exposure apparatus main body, the reticle stage system and wafer stage system attached to the main exposure apparatus main body, and the wiring and piping connected.

Then, optical adjustment is further performed on illumination optical system 12 and projection optical system PL. This is because the image forming quality of the optical systems slightly changes, especially in projection optical system PL, before and after the assembly into the exposure apparatus main body. In the embodiment, when optical adjustment is performed on projection optical system PL after it has been assembled into the exposure apparatus main body, wavefront aberration measuring unit 80 previously described is attached to wafer stage WST. Then, wavefront aberration is measured in the manner similar as before, the measurement results of the wavefront aberration input into the computer, and then for example, the adjustment amount of each lens element in directions of six degrees of freedom is calculated in a procedure similar to the one described earlier, and the calculation results shown on the display of the computer. Then, according to the display, an engineer (an operator) or the like adjusts each of the lens elements. With this operation, projection optical system PL is adjusted so that it satisfies the desired image forming quality without fail. Aberration that is not corrected at this stage, mainly high order aberration, can be regarded as aberration difficult to adjust automatically, therefore, it is preferably adjusted by re-adjusting the assembly of parts such as the lenses.

In the case the desired quality cannot be obtained even by the re-adjustment referred to above, a part of the lens may require re-processing or may have to be exchanged. In order to reprocess the optical elements of projection optical system PL easily, wavefront aberration of projection optical system PL may be measured using a wavefront aberration measuring unit used only for measuring the wavefront aberration, prior to assembling projection optical system PL into the exposure apparatus main body. The availability of optical elements that require reprocessing and its position can be specified based on such measurement results, and the reprocessing of such optical element and readjustment of other optical elements may be performed in parallel.

Then, after the above operation, total adjustment (such as electrical adjustment and operation check) is further performed. With the operations above, exposure apparatus 100 in the embodiment that transfers the pattern of reticle R onto wafer W with good precision, using projection optical system PL whose optical properties have been adjusted with high precision can be built. The making of the exposure apparatus is preferably performed in a room such as a clean room where the temperature and the degree of cleanliness are controlled.

<<Device Manufacturing Method>>

Details on a device manufacturing method when the exposure apparatus described above is used in a lithographic process are described below.

Figure 33:
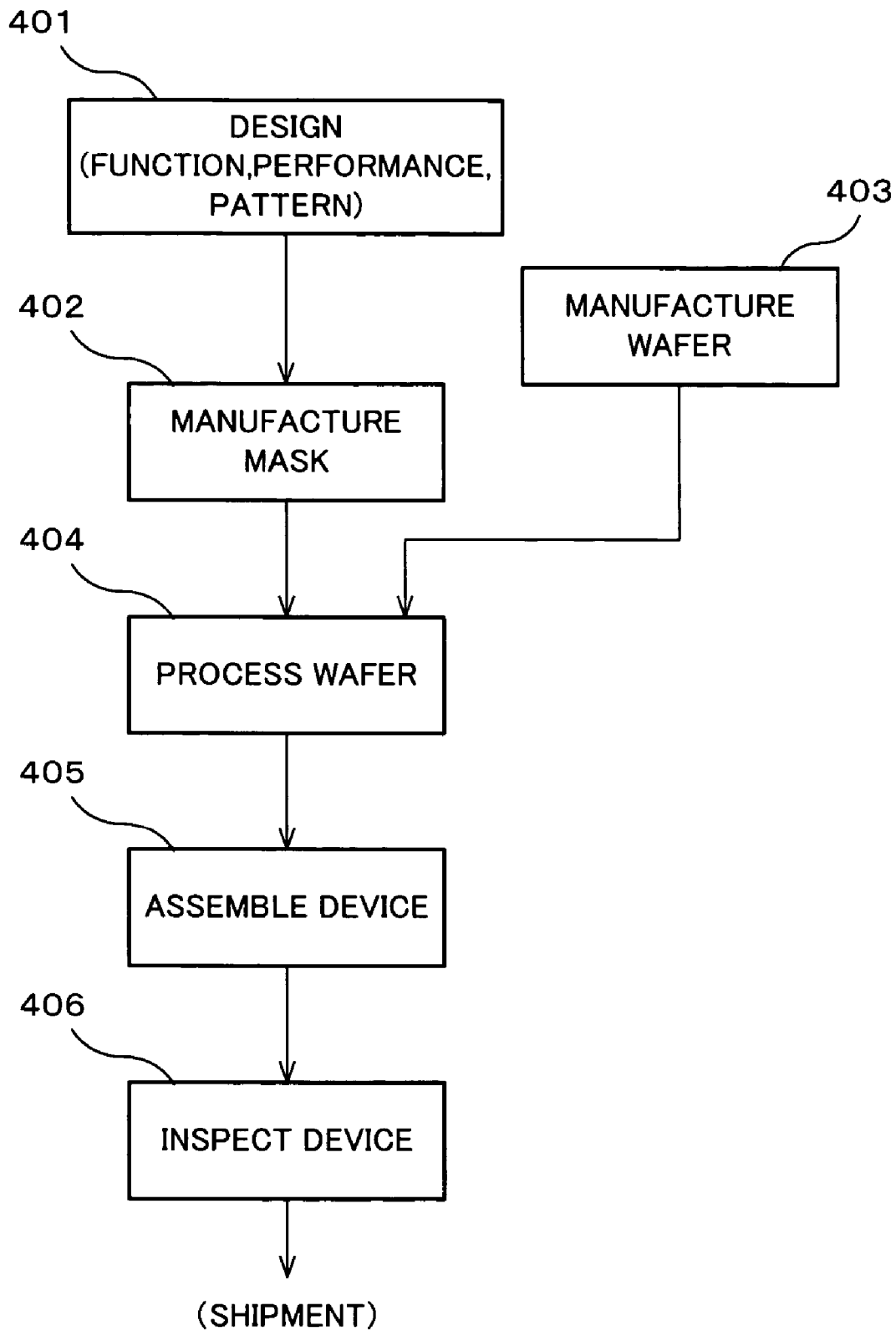
FIG. 33 is a flow chart for explaining an embodiment of a device manufacturing method according to the present invention.

FIG. 33 shows a flow chart of an example when manufacturing a device (like an IC or an LSI as in a semiconductor chip, a liquid crystal panel, a CCD, a thin magnetic head, a micromachine, or the like). As is shown in FIG. 33, in step 401 (design step), the function/performance design of a device (for example, designing a circuit for a semiconductor device) is performed, and pattern design to implement such function is performed. Then, in step 402 (mask manufacturing step), a mask on which the designed circuit pattern is formed is manufactured, whereas, in step 403 (wafer manufacturing step), a wafer is manufactured using materials such as silicon.

Next, in step 404 (wafer processing step), the actual circuit or the like is formed on the wafer by lithography or the like in a manner which will be described later on, using the mask and wafer prepared in steps 401 to 403. Then, in step 405 (device assembly step), device assembly is performed using the wafer processed in step 404. Step 405 includes processes such as the dicing process, the bonding process, and the packaging process (chip encapsulation) when necessary.

Finally, in step 406 (inspection step), tests on operation, durability, and the like are performed on the devices made in step 405. After these steps, the devices are completed and shipped out.

Figure 34:
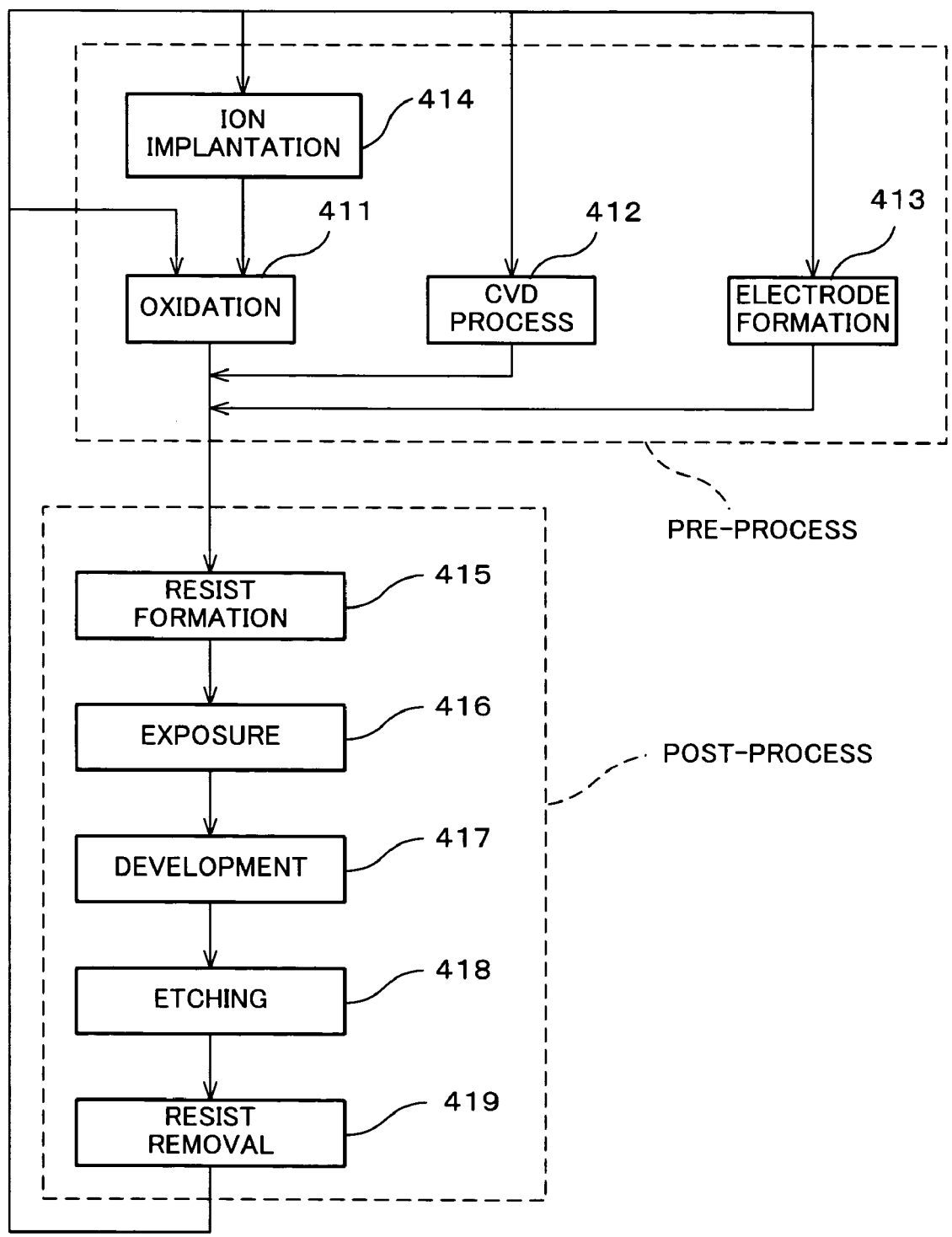
FIG. 34 is a flow chart for showing a concrete example of step 204 in FIG. 33.

FIG. 34 is a flow chart showing a detailed example of step 404 described above when manufacturing a semiconductor device. Referring to FIG. 34, in step 411 (oxidation step), the surface of the wafer is oxidized. In step 412 (CVD step), an insulating film is formed on the wafer surface. In step 413 (electrode formation step), an electrode is formed on the wafer by vapor deposition. In step 414 (ion implantation step), ions are implanted into the wafer. Steps 411 to 414 described above make up a pre-process in each stage of wafer processing, and the necessary processing is chosen and is executed at each stage.

When the above pre-process is completed in each stage of wafer processing, a post-process is executed in the manner described below. In this post-process, first, in step 415 (resist formation step), the wafer is coated with a photosensitive agent. Next, in step 416 (exposure step), the circuit pattern on the mask is transferred onto the wafer by the exposure apparatus and the exposure method described above. And, in step 417 (development step), the wafer that has been exposed is developed. Then, in step 418 (etching step), an exposed member of an area other than the area where the resist remains is removed by etching. Finally, in step 419 (resist removing step), when etching is completed, the resist that is no longer necessary is removed.

By repeatedly performing such pre-process and post-process, multiple circuit patterns are formed on the wafer.

When using the device manufacturing method described above in the embodiment, since the exposure apparatus described in the embodiment above is used in the exposure process (step 216), the line width difference of the transferred images of the vertical line pattern and the horizontal line pattern is effectively reduced, or the line width uniformity of the isolated pattern effectively improved, and a good exposure can be performed. As a consequence, it improves the yield of the devices as an end product, and the productivity can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A prediction method of predicting characteristics of an image of a pattern via a projection optical system, said method comprising:
   predicting a fluctuation curve in which
      based on linear combination of a plurality of terms that each have an aberration component obtained by expanding in series wavefront aberration of said projection optical system using a predetermined equation, calculation of movement amount due to said wavefront aberration is performed for a fluctuation curve that shows a size variation related to defocus amount from a best focus position of an image of a predetermined pattern projected via said projection optical system under predetermined exposure conditions, and
      prediction of said fluctuation curve is performed based on said calculated movement amount.

2. The prediction method of claim 1, said method further comprising prior to said predicting:
   obtaining a fluctuation curve that shows a size variation of said image related to said defocus amount in the case when it is assumed that said projection optical system is free from aberration under said predetermined exposure conditions by simulation, and approximating said fluctuation curve into a high order function.

3. The prediction method of claim 1 wherein
   in said predicting,
   movement amount of said fluctuation curve in a direction of said defocus amount is calculated, based on linear combination of said each aberration component whose coefficient shows the sensitivity of said each aberration component to said defocus amount under said predetermined exposure conditions, and
   movement amount of said fluctuation curve in a direction of size variation of said image is calculated, based on linear combination of the square of each aberration component whose coefficient shows the sensitivity of the square of said each aberration component to said size variation of said image under said predetermined exposure conditions.

4. The prediction method of claim 3 wherein
   in said predicting,
   in addition to said linear combination of the square of each aberration component, said movement amount of said fluctuation curve related to said direction of size variation of said image is calculated, based on linear combination of respective cross terms whose coefficients show the sensitivity of cross terms that have different aberrations in size variation of said image under said predetermined exposure conditions.

5. The prediction method of claim 2 wherein
   said high order function is a function made up only of even order terms.

6. The prediction method of claim 1 wherein
   in said predicting,
   fluctuation behavior of said fluctuation curve due to said wavefront aberration is calculated, based on linear combination of a plurality of terms that each have an aberration component, and said fluctuation curve is predicted based on said movement amount and said fluctuation behavior.

7. The prediction method of claim 6, said method further comprising prior to said predicting:
obtaining a fluctuation curve that shows a size variation of said image related to said defocus amount in the case when it is assumed that said projection optical system is free from aberration under said predetermined exposure conditions by simulation, and approximating said fluctuation curve into a high order function.

8. The prediction method of claim 7, said method further comprising prior to said predicting:
calculating said fluctuation curve related to an image of said pattern projected under said predetermined exposure conditions via said projection optical system in an actual aberration state, and
in said predicting, a difference function is obtained as said fluctuation behavior of said fluctuation curve due to said wavefront aberration that shows the difference between a high order function that approximates said fluctuation curve, which has been moved based on said movement amount, and a function that shows said fluctuation curve obtained in said calculating.

9. The prediction method of claim 8 wherein
said calculating is performed by simulation.

10. The prediction method of claim 8 wherein
in said predicting,
coefficients of even order terms of said difference function are calculated, based on linear combination of the square of said each aberration component whose coefficient shows the sensitivity of the square of said each aberration component to said even order terms of said different function under said predetermined exposure conditions, and
coefficients of odd order terms of said difference function are calculated, based on linear combination of said each aberration component whose coefficient shows the sensitivity of said each aberration component to said odd order terms of said different function under said predetermined exposure conditions.

11. The prediction method of claim 1 wherein
said predetermined equation is a Zernike polynomial, and
said each aberration component is a coefficient of each Zernike term.

12. An evaluation method of evaluating characteristics of an image of a pattern via a projection optical system, said method comprising:
predicting a fluctuation curve that shows a size variation related to defocus amount from a best focus position of an image of a predetermined pattern projected in at least one measurement point via said projection optical system under predetermined exposure conditions, using a prediction method of claim 1, in at least one measurement point within an effective field of said projection optical system; and
evaluating characteristics of said image of said predetermined pattern based on results of said prediction.

13. The evaluation method of claim 12 wherein
said predetermined pattern is arranged corresponding to a plurality of measurement points within said effective field of said projection optical system, and
said characteristics include uniformity of said image within said effective field of said projection optical system.

14. The evaluation method of claim 12 wherein
said predetermined pattern includes two line patterns that are arranged on a plane perpendicular to an optical axis direction of said projection optical system, orthogonal to each other, and
in said predicting, said fluctuation curve is predicted for each said line pattern.

15. The evaluation method of claim 14 wherein
in said evaluating, line width difference of the images of said line patterns is evaluated as said characteristics of said image.

16. The evaluation method of claim 12 wherein
said predetermined pattern includes two line patterns that are arranged in parallel on a plane perpendicular to an optical axis direction of said projection optical system, and
in said predicting, said fluctuation curve is predicted for each said line pattern.

17. The evaluation method of claim 16 wherein
in said evaluating, line width difference of the images of said line patterns is evaluated as said characteristics of said image.

18. An adjustment method of adjusting a formed state of an image of a pattern via a projection optical system, said method comprising:
evaluating characteristics of an image of a predetermined pattern arranged corresponding to at least one measurement point in an effective field of said projection optical system, using an evaluation method of claim 12; and
adjusting said formed state of said image of said predetermined pattern via said projection optical system based on results of said evaluation.

19. The adjustment method of claim 18 wherein
in said adjusting,
regarding said measurement point, adjustment amount of an adjustment parameter for adjusting said formed state of said image of said predetermined pattern is calculated, using a variation amount of said each aberration component per unit adjustment quantity of said adjustment parameter, the sensitivity of said each aberration component to size variation of said image of said predetermined pattern under said predetermined exposure conditions, and the deviation from a target value of coefficients of terms in each order of a fluctuation curve that shows size variation of said image of said predetermined pattern with respect to said defocus amount, and said formed state of said image of said predetermined pattern is adjusted based on said adjustment amount that has been calculated.

20. The adjustment method of claim 19 wherein
in said evaluating, characteristics of an image of a predetermined pattern arranged corresponding to a plurality of measurement points within an effective field of said projection optical system are evaluated, respectively, and
in said adjusting, said target value related to coefficients of terms that have the same order in said fluctuation curve is to be the same among said measurement points.

21. The adjustment method of claim 19 wherein
when said predetermined pattern comprises a plurality of patterns,
said target value related to coefficients of terms that have the same order in said fluctuation curve is to be the same among said patterns.

22. The adjustment method of claim 19 wherein
said adjustment amount is obtained, using the least squares method.

23. An exposure method of transferring a circuit pattern on a first surface onto an object disposed on a second surface via a projection optical system, said method comprising:
adjusting a formed state of an image of said circuit pattern via said projection optical system, using an adjustment method of claim 18; and
transferring said circuit pattern onto said object via said projection optical system, in a state where adjustment has been performed on said formed state of said image.

24. A device manufacturing method that comprises a lithographic process wherein
in said lithographic process, exposure is performed using an exposure method of claim 23.

25. A program that makes a computer execute prediction of characteristics of an image of a pattern via a projection optical system, said program making said computer execute a prediction procedure of:
calculating movement amount due to wavefront aberration of said projection optical system for a fluctuation curve that shows a size variation related to defocus amount from a best focus position of an image of a predetermined pattern projected via said projection optical system under predetermined exposure conditions, based on linear combination of a plurality of terms that each have an aberration component obtained by expanding in series said wavefront aberration using a predetermined equation; and
predicting said fluctuation curve based on said calculated movement amount.

26. The program of claim 25, said program further making said computer execute prior to said prediction procedure:
an approximation procedure in which a fluctuation curve that shows a size variation of said image related to said defocus amount in the case when it is assumed that said projection optical system is free from aberration under said predetermined exposure conditions is approximated into a high order function.

27. The program of claim 26 wherein
as said prediction procedure, said program makes said computer execute the procedures of:
predicting movement amount of said fluctuation curve in a direction of said defocus amount, based on linear combination of said each aberration component whose coefficient shows the sensitivity of said each aberration component to said defocus amount under said predetermined exposure conditions, and
predicting movement amount of said fluctuation curve in a direction of size variation of said image, based on linear combination of the square of each aberration component whose coefficient shows the sensitivity of the square of said each aberration component to said size variation of said image under said predetermined exposure conditions.

28. The program of claim 27 wherein
as said prediction procedure, said program makes said computer execute the procedure of:
predicting said movement amount of said fluctuation curve in a direction of size variation of said image based on linear combination of respective cross terms whose coefficients show the sensitivity of cross terms that have different aberrations to said size variation of said image under said predetermined exposure conditions, in addition to said linear combination of the square of each aberration component.

29. The program of claim 26 wherein
said high order function is a function made up only of even order terms.

30. The program of claim 25 wherein
as said prediction procedure, said program makes said computer execute the procedure of:
calculating fluctuation behavior of said fluctuation curve due to said wavefront aberration, based on linear combination of a plurality of terms that each have an aberration component, and predicting said fluctuation curve based on said movement amount and said fluctuation behavior.

31. The program of claim 30, said program further making said computer execute prior to said prediction procedure:
an approximation procedure in which a fluctuation curve that shows a size variation of said image related to said defocus amount in the case when it is assumed that said projection optical system is free from aberration under said predetermined exposure conditions is approximated into a high order function.

32. The program of claim 31, said program further making said computer execute prior to said prediction procedure:
a calculation procedure in which size variation with respect to said defocus amount of an image of said pattern projected under said predetermined exposure conditions via said projection optical system in an actual aberration state is calculated; and
as said prediction procedure, said program makes said computer execute a procedure of obtaining a difference function as said fluctuation behavior of said fluctuation curve due to said wavefront aberration that shows the difference between a high order function that has been moved based on said movement amount and a variation function that has been obtained in said calculation procedure.

33. The program of claim 32 wherein
as said prediction procedure, said program makes said computer execute the procedures of:
predicting coefficients of even order terms of said difference function, based on linear combination of the square of said each aberration component whose coefficient shows the sensitivity of the square of said each aberration component to said even order terms of said different function under said predetermined exposure conditions, and
predicting coefficients of odd order terms of said difference function, based on linear combination of said each aberration component whose coefficient shows the sensitivity of said each aberration component to said odd order terms of said different function under said predetermined exposure conditions.

34. The program in claim 25 wherein
said predetermined equation is a Zernike polynomial, and
said each aberration component is a coefficient of each Zernike term.

35. An information storage medium in which a program in claim 25 is recorded that can be read by a computer.

* * * * *